(12) United States Patent
Saito et al.

(10) Patent No.: US 12,396,359 B2
(45) Date of Patent: Aug. 19, 2025

(54) SOLID-STATE IMAGING ELEMENT, METHOD FOR MANUFACTURING SOLID-STATE IMAGING ELEMENT, PHOTOELECTRIC CONVERSION ELEMENT, IMAGING DEVICE, AND ELECTRONIC APPARATUS

(71) Applicant: Sony Group Corporation, Tokyo (JP)

(72) Inventors: Yosuke Saito, Tokyo (JP); Masato Kanno, Tokyo (JP)

(73) Assignee: Sony Group Corporation, Tokyo (JP)

( * ) Notice: Subject to any disclaimer, the term of this patent is extended or adjusted under 35 U.S.C. 154(b) by 873 days.

(21) Appl. No.: 17/599,123

(22) PCT Filed: Mar. 13, 2020

(86) PCT No.: PCT/JP2020/011055
§ 371 (c)(1),
(2) Date: Sep. 28, 2021

(87) PCT Pub. No.: WO2020/195935
PCT Pub. Date: Oct. 1, 2020

(65) Prior Publication Data
US 2022/0181568 A1 Jun. 9, 2022

(30) Foreign Application Priority Data

Mar. 28, 2019 (JP) .................................. 2019-062399

(51) Int. Cl.
*H10K 30/30* (2023.01)
*H10K 85/20* (2023.01)
*H10K 85/60* (2023.01)

(52) U.S. Cl.
CPC .......... *H10K 30/30* (2023.02); *H10K 85/211* (2023.02); *H10K 85/623* (2023.02);
(Continued)

(58) Field of Classification Search
CPC .... H10K 30/30; H10K 85/636; H10K 85/655; H10K 85/6574; H10K 85/623; H10K 85/211; H10K 85/6576; H10K 85/626
See application file for complete search history.

(56) References Cited

U.S. PATENT DOCUMENTS

2010/0109116 A1 5/2010 Kim et al.
2015/0045560 A1 2/2015 He
(Continued)

FOREIGN PATENT DOCUMENTS

| CN | 106132930 A | * 11/2016 | ........... C07D 209/86 |
| CN | 107615504 A | 1/2018 | |

(Continued)

*Primary Examiner* — Mohammad M Choudhry
(74) *Attorney, Agent, or Firm* — K&L Gates LLP

(57) ABSTRACT

The present technology relates to a solid-state imaging element, a method for manufacturing a solid-state imaging element, a photoelectric conversion element, an imaging device, and an electronic apparatus that are capable of realizing highly efficient photoelectric conversion of blue light with organic photoelectric conversion element.

A first organic semiconductor having a characteristic of absorbing blue light, a second organic semiconductor having a characteristic of absorbing blue light and a characteristic as a hole-transporting material having crystallinity, and a third organic semiconductor including a fullerene derivative are mixed to form an organic photoelectric conversion layer. The present technology can be applied to a solid-state imaging element.

16 Claims, 14 Drawing Sheets

(52) U.S. Cl.
CPC ......... *H10K 85/626* (2023.02); *H10K 85/636* (2023.02); *H10K 85/655* (2023.02); *H10K 85/6574* (2023.02); *H10K 85/6576* (2023.02)

(56) References Cited

U.S. PATENT DOCUMENTS

| | | | |
|---|---|---|---|
| 2015/0236162 A1* | 8/2015 | Yamazaki | H01L 29/78648 257/43 |
| 2016/0013426 A1* | 1/2016 | Yoshioka | C07D 493/04 548/440 |
| 2017/0222150 A1* | 8/2017 | Arai | H10K 85/6576 |
| 2017/0373258 A1* | 12/2017 | Obana | H10K 39/32 |

FOREIGN PATENT DOCUMENTS

| | | | | |
|---|---|---|---|---|
| CN | 108288674 A | 7/2018 | | |
| JP | 2006010076 A | 1/2006 | | |
| JP | 2018026559 A | 2/2018 | | |
| JP | 2018085499 A | 5/2018 | | |
| JP | 2018093191 A | 6/2018 | | |
| JP | 2018125495 A | 8/2018 | | |
| KR | 20180123011 A | 11/2018 | | |
| KR | 20190032347 A | 3/2019 | | |
| WO | WO-2018016215 A1 * | 1/2018 | ........... | H01L 27/146 |
| WO | WO-2018101354 A1 | 6/2018 | | |

* cited by examiner

FIG. 7

| EXAMPLE | FIRST ORGANIC SEMICONDUCTOR a | SECOND ORGANIC SEMICONDUCTOR b | THIRD ORGANIC SEMICONDUCTOR c | RATIO (a:b:c) | α 450nm (cm$^{-1}$) | α 560nm (cm$^{-1}$) | α 450nm / α 560nm | Jdk (NORMALIZED) | EQE (NORMALIZED) | RESPONSE TIME (NORMALIZED) | CHARACTERISTICS SIGNIFICANTLY INFERIOR TO THOSE IN EXAMPLE 1 |
|---|---|---|---|---|---|---|---|---|---|---|---|
| 1 | SG5 | DNTT | C60 | 4:4:2 | 9.5E+4 | 4.2E+3 | 23 | 1.00 | 1.00 | 1.00 | — |
| 2 | SG5 | DNTT | C60 | 5:3:2 | 9.9E+4 | 4.2E+3 | 24 | 0.92 | 0.99 | 1.10 | NONE |
| 3 | SG5 | DNTT | C60 | 3:5:2 | 9.2E+4 | 4.1E+3 | 22 | 1.12 | 1.02 | 0.95 | NONE |
| 4 | SG5 | DNTT | C60 | 3.5:3.5:3 | 9.2E+4 | 6.1E+3 | 15 | 1.64 | 1.08 | 0.98 | NONE |
| 5 | SG5 | DNTT | C60 | 0:5:5 | 5.6E+4 | 1.9E+4 | 3 | 0.98 | 0.65 | 1.04 | SPECTRAL/EQE |
| 6 | SG5 | DNTT | C60 | 5:0:5 | 8.3E+4 | 1.4E+4 | 6 | 1.10 | 0.98 | 14.5 | SPECTRAL/RESPONSE |
| 7 | SG5 | DNTT | C60 | 5:5:0 | 1.3E+4 | 1.5E+3 | 87 | 23.0 | 0.45 | n/a | DARK CURRENT/ EQE/RESPONSE |
| 8 | SG5 | BTBT | C60 | 4:4:2 | 3.8E+4 | 4.2E+3 | 9 | 1.00 | 0.63 | 1.00 | SPECTRAL/EQE |

FIG. 8

| EXAMPLE | FIRST ORGANIC SEMICONDUCTOR a | SECOND ORGANIC SEMICONDUCTOR b | THIRD ORGANIC SEMICONDUCTOR c | RATIO (a:b:c) | α 450nm (cm⁻¹) | α 560nm (cm⁻¹) | α 450nm/ α 560nm | Jdk (NORMALIZED) | EQE (NORMALIZED) | RESPONSE TIME (NORMALIZED) | CHARACTERISTICS SIGNIFICANTLY INFERIOR TO THOSE IN EXAMPLE 11 |
|---|---|---|---|---|---|---|---|---|---|---|---|
| 11 | Coumarin 6 | DBP–BTBDT | C60 | 4:4:2 | 1.9E+5 | 6.2E+3 | 31 | 1.00 | 1.00 | 1.00 | — |
| 12 | Coumarin 6 | DBP–BTBDT | C60 | 5:3:2 | 2.1E+5 | 5.4E+3 | 39 | 0.91 | 0.97 | 1.21 | NONE |
| 13 | Coumarin 6 | DBP–BTBDT | C60 | 3:5:2 | 1.8E+5 | 6.5E+3 | 28 | 1.24 | 1.08 | 0.93 | NONE |
| 14 | Coumarin 6 | DBP–BTBDT | C60 | 3.5:3.5:3 | 1.8E+5 | 8.1E+3 | 22 | 1.73 | 1.08 | 0.97 | NONE |
| 15 | Coumarin 6 | DBP–BTBDT | C60 | 0:5:5 | 5.9E+4 | 1.7E+4 | 3 | 1.02 | 0.70 | 1.01 | SPECTRAL/EQE |
| 16 | Coumarin 6 | DBP–BTBDT | C60 | 5:0:5 | 1.8E+5 | 2.2E+4 | 8 | 1.32 | 0.43 | 12.5 | SPECTRAL/RESPONSE |
| 17 | Coumarin 6 | DBP–BTBDT | C60 | 5:5:0 | 2.3E+5 | 1.9E+3 | 121 | 53.1 | 0.12 | n/a | DARK CURRENT/ EQE/RESPONSE |
| 18 | Coumarin 6 | BTBT | C60 | 4:4:2 | 1.2E+5 | 5.3E+3 | 23 | 0.98 | 0.56 | 1.02 | SPECTRAL/EQE |

SOLID-STATE IMAGING ELEMENT, METHOD FOR MANUFACTURING SOLID-STATE IMAGING ELEMENT, PHOTOELECTRIC CONVERSION ELEMENT, IMAGING DEVICE, AND ELECTRONIC APPARATUS

TECHNICAL FIELD

The present technology relates to a solid-state imaging element, a method for manufacturing a solid-state imaging element, a photoelectric conversion element, an imaging device, and an electronic apparatus, and particularly relates to a solid-state imaging element, a method for manufacturing a solid-state imaging element, a photoelectric conversion element, an imaging device, and an electronic apparatus that are capable of realizing photoelectric conversion of blue light with high efficiency.

BACKGROUND ART

A vertical spectral solid-state imaging element has been awaited that is called a vertical spectral solid-state imaging element and to have high color reproducibility.

As this vertical spectral solid-state imaging element, a vertical spectral solid-state imaging element has been recently proposed that has a multilayer structure in which photoelectric conversion films are stacked. The photoelectric conversion film includes an organic material and formed into a film.

For example, a solid-state imaging element is disclosed in which organic photoelectric conversion films that respectively absorb blue light, green light, and red light are stacked in this order (see Patent Document 1).

Furthermore, a solid-state imaging element is disclosed in which organic photoelectric conversion films that absorb blue light are stacked (see Patent Document 2).

CITATION LIST

Patent Documents

Patent Document 1: Japanese Patent Application Laid-Open No. 2006-010076
Patent Document 2: Japanese Patent Application Laid-Open No. 2018-026559

SUMMARY OF THE INVENTION

Problems to be Solved by the Invention

However, neither of the above-described organic photoelectric conversion films in Patent Documents 1 and 2 can secure sufficient blue photoelectric conversion efficiency.

The present technology has been made in view of such a situation to particularly realize an organic photoelectric conversion film capable of photoelectrically converting blue light selectively with high efficiency.

Solutions to Problems

A solid-state imaging element, a photoelectric conversion element, an imaging device, and an electronic apparatus of a first aspect of the present technology include an organic photoelectric conversion element including at least two electrodes in which an organic photoelectric conversion layer is arranged between the two electrodes, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative.

In the first aspect of the present technology, an organic photoelectric conversion element including at least two electrodes is provided, an organic photoelectric conversion layer is arranged between the two electrodes, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative.

A method for manufacturing a solid-state imaging element of a second aspect of the present technology includes a first step of forming a first electrode, a second step of forming an organic photoelectric conversion layer over the first electrode, and a third step of forming a second electrode over the organic photoelectric conversion layer, in which the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative.

In the second aspect of the present technology, a first electrode is formed by a first step, an organic photoelectric conversion layer is formed over the first electrode by a second step, and a second electrode is formed over the organic photoelectric conversion layer by a third step, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative.

BRIEF DESCRIPTION OF THE DRAWINGS

FIG. 7 is a table showing a first example of the characteristics of an organic material layer that depend on the combination and the mixing ratios of materials of a first organic semiconductor, a second organic semiconductor, and a third organic semiconductor.

FIG. 8 is a table showing a second example of the characteristics of an organic material layer that depend on the combination and the mixing ratios of materials of a first organic semiconductor, a second organic semiconductor, and a third organic semiconductor.

MODE FOR CARRYING OUT THE INVENTION

Figure 1:
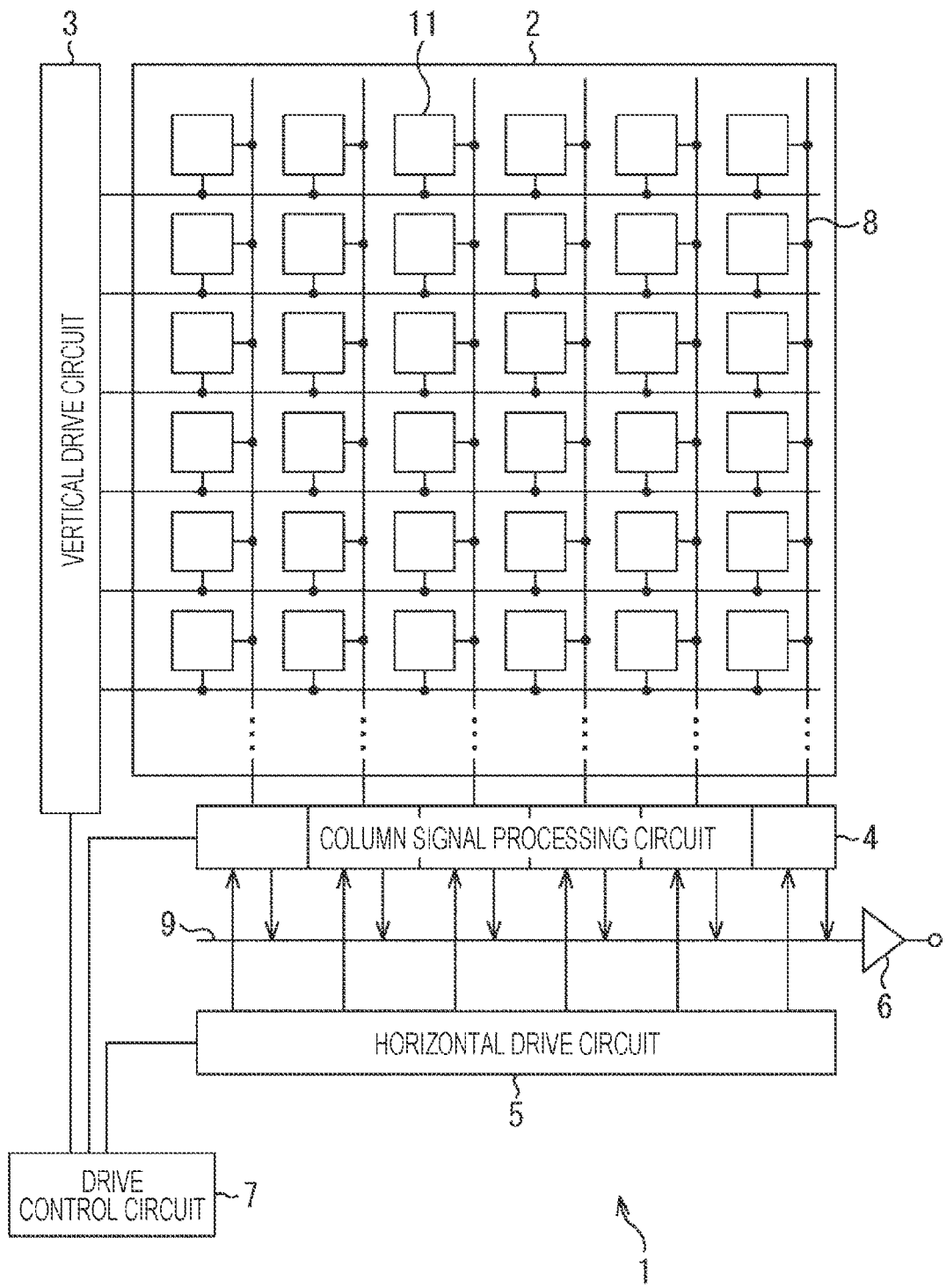
FIG. 1 is a diagram illustrating a configuration example of an embodiment of a solid-state imaging device to which the present technology is applied.

Configuration Example of Embodiment of Solid-State Imaging Device to which the Present Technology is Applied FIG. 1 illustrates a configuration example of an embodiment of a solid-state imaging device to which the present technology is applied. A solid-state imaging device 1 in FIG. 1 includes an imaging region 2 in which laminated solid-state imaging elements 11 are arranged in a two-dimensional array form and drive circuits (peripheral circuits) of the imaging region 2 such as a vertical drive circuit 3, a column signal processing circuit 4, a horizontal drive circuit 5, an output circuit 6, and a drive control circuit 7.

Note that these circuits can include well-known circuits, or another circuit configuration (including, for example, various circuits used in conventional charge coupled device (CCD) imaging devices and complementary metal oxide semiconductor (CMOS) imaging devices) can be used.

The drive control circuit 7 generates a clock signal and a control signal on the basis of the vertical synchronizing signal, the horizontal synchronizing signal, and the master clock. The clock signal and the control signal serve as references of the operation of the vertical drive circuit 3, the column signal processing circuit 4, and the horizontal drive circuit 5. Then, the generated clock signal and control signal are input to the vertical drive circuit 3, the column signal processing circuit 4, and the horizontal drive circuit 5.

The vertical drive circuit 3 includes, for example, a shift register, and selectively scans the solid-state imaging elements 11 in the imaging region 2 in units of rows sequentially in the vertical direction. Then, a pixel signal (image signal) based on the current (signal) generated according to the amount of light received in each solid-state imaging element 11 is sent to the column signal processing circuit 4 via a signal line (data output line) 8 and a vertical signal transfer line (VSL).

The column signal processing circuit 4 is arranged, for example, for each column of the solid-state imaging elements 11, and performs signal processing such as noise removal and signal amplification on the image signal output from each imaging element in the solid-state imaging elements 11 in units of rows on the basis of a signal from a black reference pixel (not illustrated in FIG. 1 and formed around the effective pixel region). In the output stage of the column signal processing circuit 4, a horizontal selection switch (not illustrated) is provided between the column signal processing circuit 4 and a horizontal signal line 9 so that the horizontal selection switch is connected to the column signal processing circuit 4 and the horizontal signal line 9.

The horizontal drive circuit 5 includes, for example, a shift register and outputs horizontal scanning pulses sequentially to select circuits in the column signal processing circuit 4 sequentially so that each circuit in the column signal processing circuit 4 outputs a signal to the horizontal signal line 9.

The output circuit 6 performs signal processing on the signals supplied from the circuits in the column signal processing circuit 4 sequentially via the horizontal signal line 9, and outputs the processed signals.

Configuration Example of Embodiment of Solid-State Imaging Element in FIG. 1

Figure 2:
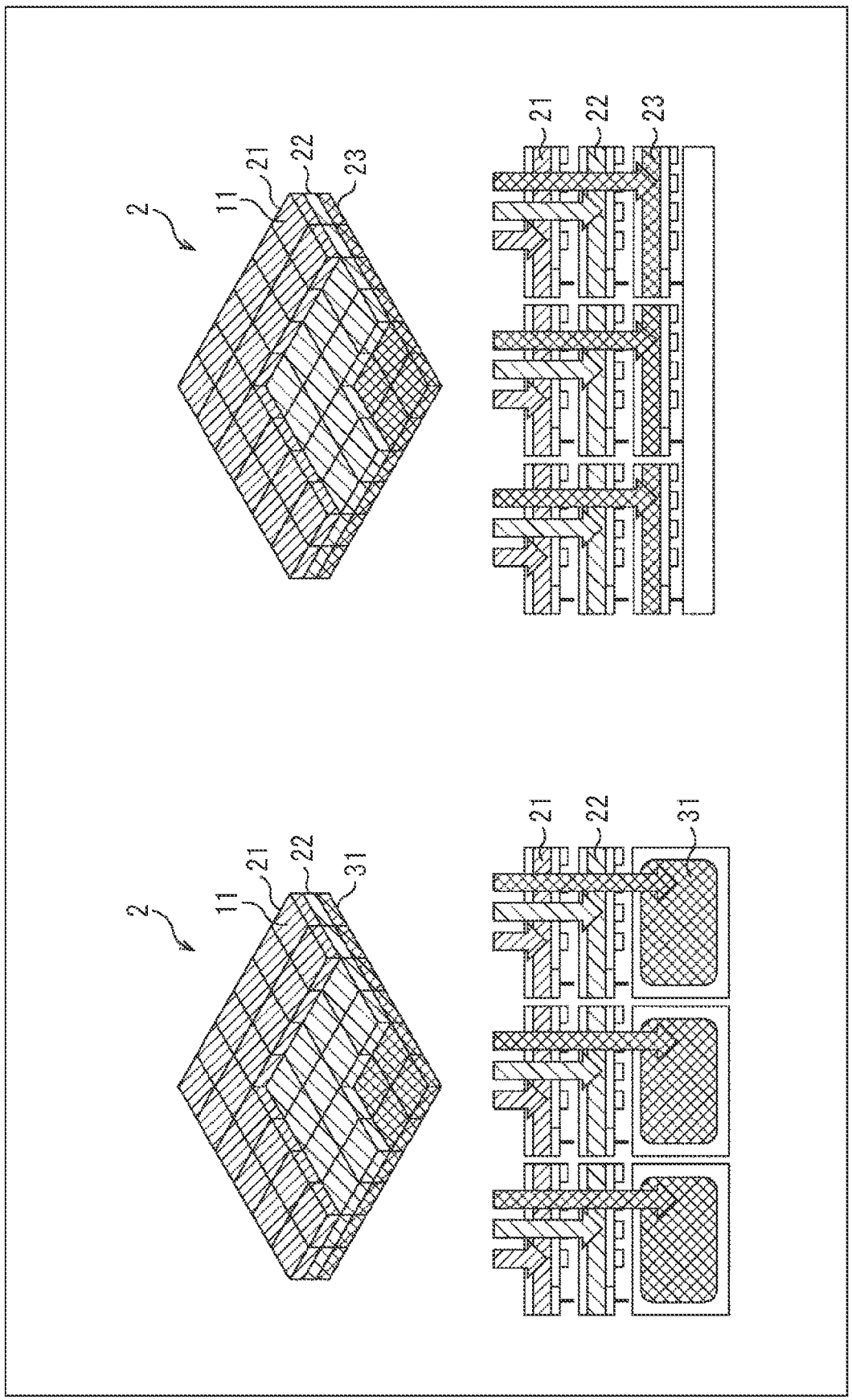
FIG. 2 is a view illustrating configuration examples of an embodiment of a solid-state imaging element in FIG. 1.
Figure 3:
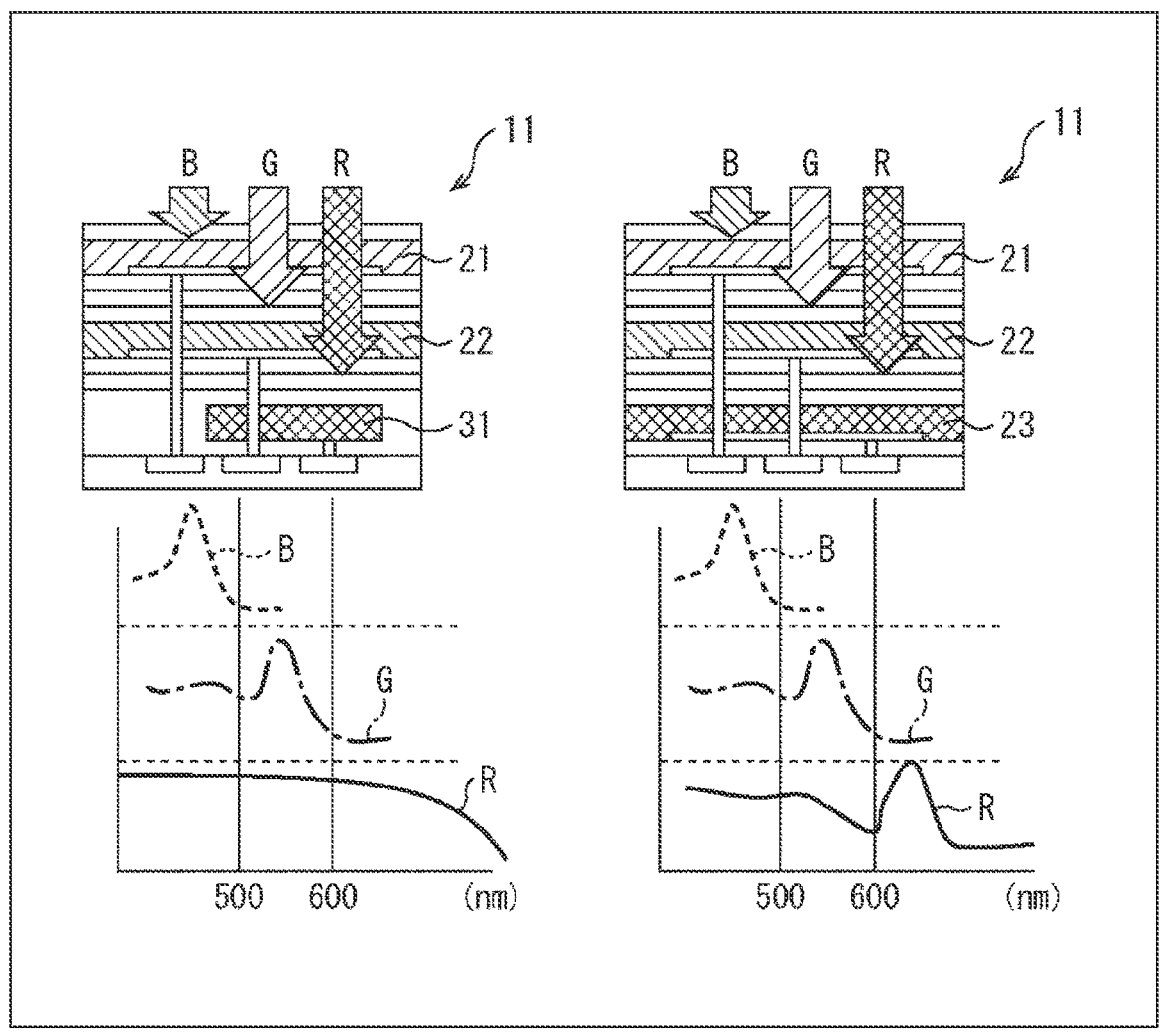
FIG. 3 is a view illustrating the configuration examples of a solid-state imaging element in FIG. 2.

FIGS. 2 and 3 are views illustrating configuration examples of an embodiment of a vertical spectral solid-state imaging element 11 in which the organic photoelectric conversion film applied to the solid-state imaging device in FIG. 1 is used.

The configuration examples of a vertical spectral solid-state imaging element in which the organic photoelectric conversion film is used are, for example, two configurations including a first solid-state imaging element 11 and a second solid-state imaging element 11 that are illustrated in the left part and the right part of FIG. 2 respectively. Both the two configurations have a structure in which photoelectric conversion elements each including a photoelectric conversion element or a photodiode are stacked in the direction from a light source in the upper part of FIG. 2 or 3 to the lower part of the drawing.

In more detail, as illustrated in the lower left part of FIG. 2 and the upper left part of FIG. 3, the first solid-state imaging element 11 is provided with photoelectric conversion elements 21 and 22 in this order from the uppermost layer. The photoelectric conversion element 21 includes an organic photoelectric conversion film that photoelectrically converts light of blue (B) color, and the photoelectric conversion element 22 includes an organic photoelectric conversion film that photoelectrically converts light of green (G) color. The photoelectric conversion elements 21 and 22 and a photoelectric conversion element 31 under the photoelectric conversion elements 21 and 22 are stacked. The photoelectric conversion element 31 includes a silicon photodiode for red (R) color.

With such a configuration, as illustrated in the lower left part of FIG. 3, light in the blue (B) color and green (G) color wavelength bands is photoelectrically converted in the ascending order of the wavelength bands by the photoelectric conversion elements 21 and 22, and then light of red (R) color is photoelectrically converted by the photoelectric conversion element 31 to disperse and photoelectrically convert light of red color, green color, and blue color (RGB) in the vertical direction.

Furthermore, as illustrated in the lower right part of FIG. 2 and the upper right part of FIG. 3, the second solid-state imaging element 11 includes photoelectric conversion elements 21, 22, and 23 that are stacked in this order from the uppermost layer. The photoelectric conversion element 21 includes an organic photoelectric conversion film that photoelectrically converts light of blue (B) color, the photoelectric conversion element 22 includes an organic photoelectric conversion film that photoelectrically converts light of green (G) color, and the photoelectric conversion element 23 includes an organic photoelectric conversion film that photoelectrically converts light of red (R) color.

With such a configuration, as illustrated in the lower right part of FIG. 3, light in the blue (B) color, green (G) color, and red (R) color wavelength bands is photoelectrically converted in the ascending order of the wavelength bands by the photoelectric conversion elements 21, 22, and 23 to disperse light of red color, green color, and blue color (RGB) in the vertical direction and generate a pixel signal.

In more detail, as indicated by the waveforms of a dotted line in the lower left part and the lower right part of FIG. 3, the photoelectric conversion element 21 selectively absorbs light having a wavelength of approximately 400 to 500 nm and being generally classified as blue light, and generates a charge by photoelectric conversion.

Furthermore, as indicated by the waveforms of an alternate long and short dash line in the lower left part and the lower right part of FIG. 3, the photoelectric conversion element 22 selectively absorbs light having a wavelength of approximately 500 to 600 nm and being generally classified as green light, and generates a charge by photoelectric conversion.

Moreover, as indicated by the waveforms of a solid line in the lower left part and the lower right part of FIG. 3, the photoelectric conversion element 23 or the photoelectric conversion element 31 selectively absorbs light having a wavelength of approximately 600 nm or more and being generally classified as red light, and generates a charge by photoelectric conversion.

Note that, in the lower part of FIG. 3, the horizontal axis in the graphs shows the wavelength of incident light, and the vertical axis shows the amount of charge generated by photoelectric conversion.

Configuration Example of Photoelectric Conversion Element that Photoelectrically Converts Blue Light Next, a configuration example of the photoelectric conversion element 21 including an organic photoelectric conversion film will be described with reference to FIG. 4.

Figure 4:
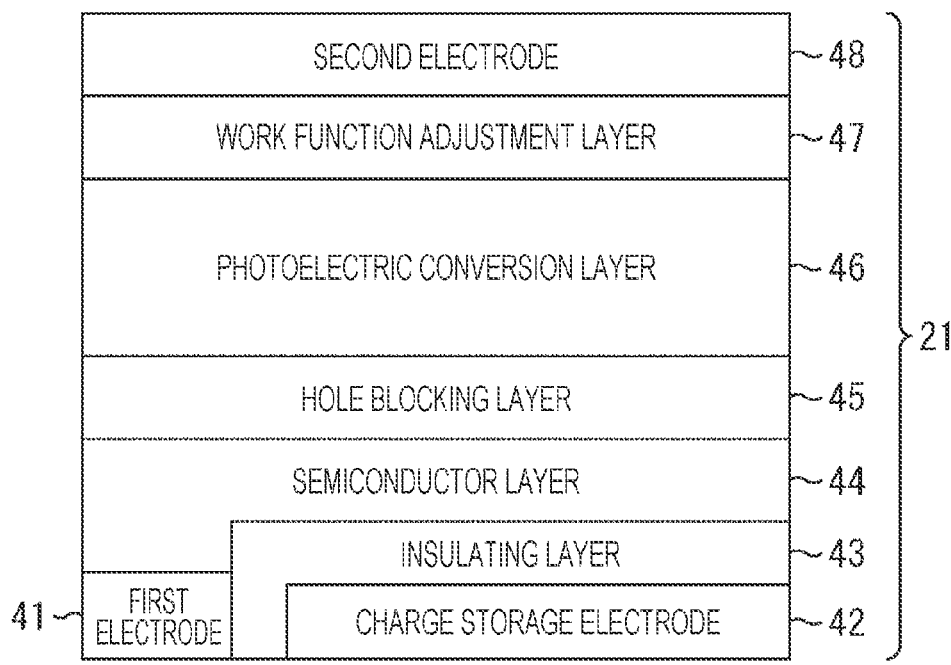
FIG. 4 is a view illustrating a configuration example of an organic photoelectric conversion element that photoelectrically converts blue light.

The photoelectric conversion element 21 has a configuration in which a first electrode 41, a charge storage electrode 42, an insulating layer 43, a semiconductor layer 44, a hole blocking layer 45, a photoelectric conversion layer 46, a work function adjustment layer 47, and a second electrode 48 are stacked as illustrated in FIG. 4. Note that, although not illustrated, the photoelectric conversion element 21 is stacked on a semiconductor substrate provided with a floating diffusion amplifier for signal reading, a transfer transistor, an amplifier transistor, and multilayer wiring, and the photoelectric conversion element 21 is provided with optical members such as a protective layer, a planarization layer, and an on-chip lens on the light incident side.

The first electrode 41 and the charge storage electrode 42 include a conductive film having light transmissivity such as indium tin oxide (ITO). However, as a material included in the first electrode 41 and the charge storage electrode 42, a tin oxide ($SnO_2$)-based material to which a dopant is added or a zinc oxide-based material including an aluminum zinc oxide (ZnO) to which a dopant is added may be used in addition to the ITO. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). Furthermore, CuI, $InSbO_4$, ZnMgO, $CuInO_2$, $MgIN_2O_4$, CdO, $ZnSnO_3$, or the like may be used. The insulating layer 43 is formed so as to cover the charge storage electrode 42.

The semiconductor layer 44 is provided between the insulating layer 43 and the hole blocking layer 45, and configured to store a signal charge (here, an electron) generated in the photoelectric conversion layer 46. In the present embodiment, an electron is used as a signal charge, and therefore, the semiconductor layer 44 is preferably formed using an n-type semiconductor material. It is preferable to use, for example, a material in which the lowermost end of the conduction band has an energy level shallower than the work function of the semiconductor layer 44. Examples of such an n-type semiconductor material include In—Ga—Zn—O-based oxide semiconductors (IGZOs), Zn—Sn—O-based oxide semiconductors (ZTOs), In—Ga—Zn—Sn—O-based oxide semiconductors (IGZTOs), Ga—Sn—O-based oxide semiconductors (GTOs), and In—Ga—O-based oxide semiconductors (IGOs). In the semiconductor layer 44, it is preferable to use at least one oxide semiconductor material described above, and among the above-described oxide semiconductor materials, IGZOs are suitably used. The semiconductor layer 44 has a thickness of, for example, 30 nm or more and 200 nm or less, and preferably 60 nm or more and 150 nm or less. As a result of providing the semiconductor layer 44 including the above-described material under the hole blocking layer 45, charge recombination can be prevented at the time of charge storage to improve the transfer efficiency.

The hole blocking layer 45 is provided between the semiconductor layer 44 and the photoelectric conversion layer 46, and configured to transfer a signal charge (here, an electron) generated in the photoelectric conversion layer 46 to the semiconductor layer 44 and prevent hole injection from the semiconductor layer 44 to the photoelectric conversion layer 46.

The hole blocking layer 45 includes, for example, a substance (1) (4,6-bis(3,5-di(pyridin-4-yl)phenyl)-2-methylpyrimidine (B4PyMPM)) represented by the following chemical formula (1).

[Chem. 1]

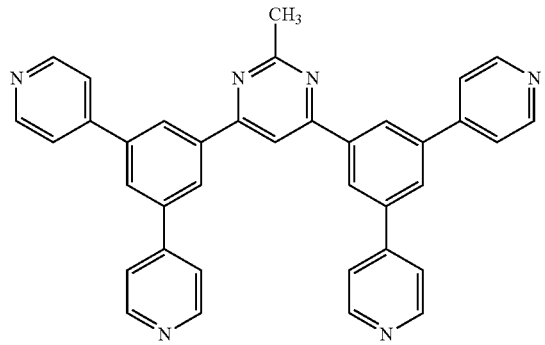

Chemical Formula (1)

In the present embodiment, an electron is used as a signal charge in the hole blocking layer 45, and therefore, the hole blocking layer 45 is preferably formed using an n-type semiconductor material. It is preferable to use, for example, a material in which the electron affinity has an energy level equivalent to or shallower than that at the lower end of the conductor in the semiconductor layer 44. Examples of such an n-type semiconductor material included in the hole blocking layer 45 include naphthalene diimide derivatives, triazine derivatives, and fullerene derivatives in addition to the substance (1) (B4PyMPM).

The photoelectric conversion layer 46 includes a mixed layer including a first organic semiconductor, a second organic semiconductor, and a third organic semiconductor, and generates an electron and a hole (charges) by photoelectric conversion according to the amount of blue light.

The first organic semiconductor is a semiconductor that absorbs blue light and generates an electron and a hole (charges) by photoelectric conversion, and is, for example, a substance (2) (Solvent Green 5 (SG5)) represented by the following chemical formula (2).

Chemical Formula (2)

[Chem. 2]

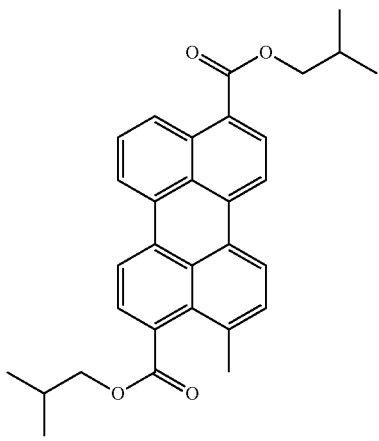

The second organic semiconductor is a hole-transporting material that absorbs blue light and transports a hole, and has crystallinity. The second organic semiconductor is, for example, a substance (3) (2,9-diphenyl-dinaphtho[2,3-b]naphtho[2',3':4,5]thieno[2,3-d]thiophene: DNTT) represented by the following chemical formula (3).

Chemical Formula (3)

[Chem. 3]

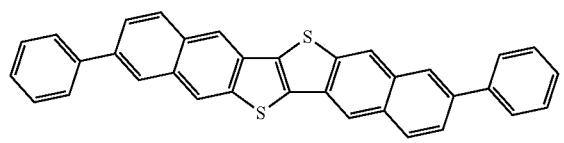

The third organic semiconductor is a fullerene derivative, and is, for example, a substance (4) (C60) represented by the following chemical formula (4).

Chemical Formula (4)

[Chem.4]

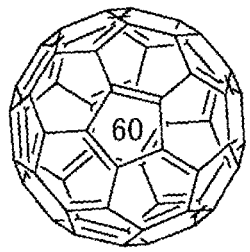

The work function adjustment layer 47 is provided between the photoelectric conversion layer 46 and the second electrode 48, and configured to change the internal electric field in the photoelectric conversion layer 46 to transfer the signal charge generated in the photoelectric conversion layer 46 to the semiconductor layer 44 promptly so that the semiconductor layer 44 storages the signal change. The work function adjustment layer 47 has light transmissivity, and preferably has, for example, a light absorption rate of 10% or less with respect to visible light. Furthermore, the work function adjustment layer 47 is preferably formed using a carbon-containing compound having an electron affinity larger than the work function of the semiconductor layer 44. Examples of such a material include tetracyanoquinodimethane derivatives, hexaazatriphenylene derivatives, hexaazatrinaphthylene derivatives, phthalocyanine derivatives, and fluorinated fullerenes such as C60F36 and C60F48. Alternatively, the work function adjustment layer 47 is preferably formed using an inorganic compound having a larger work function than the charge storage electrode 42. Examples of such a material include transition metal oxides such as molybdenum oxide ($MoO_3$), tungsten oxide ($WO_3$), vanadium oxide ($V_2O_5$), and rhenium oxide ($ReO_3$), and salts such as copper iodide (CuI), antimony chloride ($SbCl_5$), iron oxide ($FeCl_3$), and sodium chloride (NaCl).

Another layer may be provided between the photoelectric conversion layer 46 and the second electrode 48 (for example, between the photoelectric conversion layer 46 and the work function adjustment layer 47) or between the photoelectric conversion layer 46 and the charge storage electrode 42. Specifically, for example, the photoelectric conversion layer 46 and the work function adjustment layer 47 may be stacked with an electron blocking layer interposed therebetween. The ionization potential of the electron blocking layer preferably has an energy level shallower than the work function of the work function adjustment layer 47. Furthermore, the electron blocking layer is preferably formed using, for example, an organic material having a glass transition point higher than 100° C.

The second electrode 48 is configured to collect the hole (h+) generated by photoelectric conversion of blue light in the photoelectric conversion layer 46. Similarly to the first electrode 41 and the charge storage electrode 42, the second electrode includes a conductive film having light transmissivity. In an imaging device in which the photoelectric conversion element 21 is used as one pixel, the second electrode 48 may be separated for each pixel, or may be formed as a common electrode for the pixels. The second electrode 48 has a thickness of, for example, 10 nm to 200 nm.

In a configuration example of the photoelectric conversion element that photoelectrically converts blue light of the present embodiment, the incident direction of the light may be upward or downward. More specifically, in FIG. 4, light may be incident from the second electrode 48 side or the charge storage electrode 42 side.

Furthermore, the second electrode 48 located on the light incident side may be shared by a plurality of solid-state imaging elements 11. That is, the second electrode 48 can be a so-called solid electrode. The photoelectric conversion layer 46 may be shared by the plurality of solid-state imaging elements 11, that is, one photoelectric conversion layer 46 may be formed for the plurality of solid-state imaging elements 11, or one photoelectric conversion layer 46 may be provided for each solid-state imaging element 11.

Moreover, the photoelectric conversion layer 46 may have a stacked structure including a lower semiconductor layer and an upper photoelectric conversion layer. With the stacked structure, recombination at the time of charge storage can be prevented by the lower semiconductor layer to increase the transfer efficiency of the charge stored in the photoelectric conversion layer 46 to the first electrode 41 and suppress generation of dark current.

Figure 5:
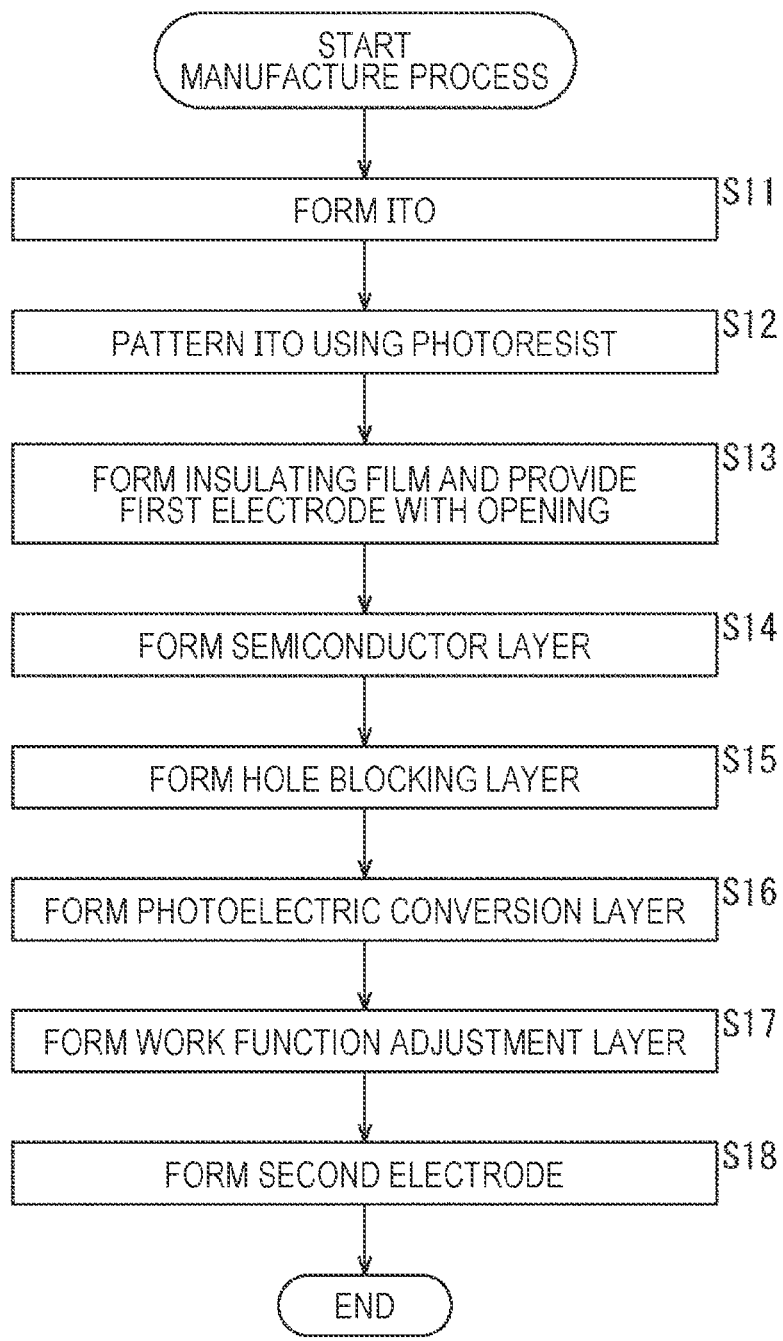
FIG. 5 is a flowchart illustrating a method for manufacturing an organic photoelectric conversion element.

Method for Manufacturing Photoelectric Conversion Element that Photoelectrically Converts Blue Light Next, a method for manufacturing a photoelectric conversion element that photoelectrically converts blue light will be described with reference to the flowchart of FIG. 5. In a case where a vertical spectral solid-state imaging element as illustrated in FIGS. 2 and 3 is manufactured, a silicon substrate (not illustrated) is usually used. In brief, on the silicon substrate (not illustrated), a circuit layer is formed in which a floating diffusion amplifier, a transfer transistor, an amplifier transistor, and multilayer wiring are formed, and on the circuit layer, photoelectric conversion films that photoelectrically convert R, G, and B light respectively are formed together with a readout wiring. The photoelectric conversion films are insulated from each other by an interlayer insulating film.

In a step S11, in an element in which a circuit layer provided on a silicon substrate (not illustrated), an R layer, and a G layer are stacked in this order, an ITO layer having a predetermined thickness (for example, of 100 nm) is formed on an interlayer insulating film on the G layer by sputtering.

In a step S12, a photoresist is formed at a predetermined position on the ITO layer. Thereafter, etching is performed to remove the photoresist, and thus, the first electrode 41 and the charge storage electrode 42 illustrated in FIG. 4 are patterned.

In a step S13, after the insulating layer 43 is formed on the interlayer insulating layer, the first electrode 41, and the charge storage electrode 42, the insulating layer 43 on the first electrode 41 is removed, and the first electrode 41 is provided with an opening.

In a step S14, the semiconductor layer 44 having a predetermined thickness (for example, of 100 nm) is formed on the insulating layer 43 by sputtering.

In a step S15, the hole blocking layer 45 is formed on the semiconductor layer 44 with a vacuum deposition method. For example, a substrate 55 is placed on a substrate holder in a vacuum deposition device in a state where the pressure is reduced to $1 \times 10^{-5}$ Pa or less, and while the substrate 55 set to a temperature of 0° C. is rotated, the substance (1) (B4PyMPM) having a temperature of 0° C. is formed into a film having a predetermined thickness on the semiconductor layer 44. More specifically, the hole blocking layer 45 including the substance (1) (B4PyMPM) is formed to have a predetermined thickness of, for example, 5 nm in a state where the substrate 55 has a temperature of 0° C.

In a step S16, the photoelectric conversion layer 46 is formed on the hole blocking layer 45 with a vacuum deposition method. For example, a substrate 55 is placed on a substrate holder in a vacuum deposition device in a state where the pressure is reduced to $1 \times 10^{-3}$ Pa or less, and while the substrate 55 set to a temperature of 0° C. is rotated, the first organic semiconductor, the second organic semiconductor, and the third organic semiconductor are each mixed at a predetermined film formation rate to form the photoelectric conversion layer 46 having a predetermined thickness (for example, of 200 nm) on the hole blocking layer 45.

In a step S17, the work function adjustment layer 47 is formed on the photoelectric conversion layer 46 with a vacuum deposition method. For example, a substrate 55 is placed on a substrate holder in a vacuum deposition device in a state where the pressure is reduced to $1 \times 10^{-3}$ Pa or less, and while the substrate 55 set to a temperature of 0° C. is rotated, a substance (5) (1,4,5,8,9,12-hexaazatriphenylene-2,3,6,7,10,11-hexacarbonitrile) represented by the following chemical formula (5) having a temperature of 0° C. is formed into a film having a predetermined thickness on the photoelectric conversion layer 46. More specifically, the work function adjustment layer 47 is formed to have a predetermined thickness of, for example, 10 nm in a state where the substrate 55 has a temperature of 0° C.

[Chem. 5]

Chemical Formula (5)

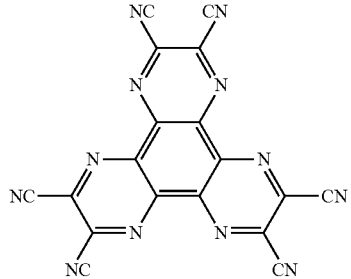

In a step S18, ITO is formed into a film having a predetermined thickness (for example, of 50 nm) as the second electrode 48.

In the above description of the method for manufacturing a photoelectric conversion element that photoelectrically converts blue light, the case of the configuration in which light is incident from the second electrode 48 side has been described, but this configuration may be vertically inverted. Specifically, the configuration may be a configuration in which the second electrode 48 is on the substrate 55 side, and light is incident from the charge storage electrode 42 side.

By the above-described processing, the first organic semiconductor, the second organic semiconductor, and the third organic semiconductor are mixed to form the photoelectric conversion layer 46 in which the absorption of light of colors other than blue is reduced to reduce the amount of charge generated by photoelectric conversion of light other than blue light, and the absorption of blue light is enhanced to increase the amount of charge generated by photoelectric conversion through absorption of blue light.

The characteristic of the photoelectric conversion layer 46 depends on the combination and the mixing ratios of the materials of the first organic semiconductor, the second organic semiconductor, and the third organic semiconductor that are included. Therefore, it is desirable to form a film at a combination and mixing ratios of the materials of the first organic semiconductor, the second organic semiconductor, and the third organic semiconductor so that the absorption of light other than blue light is suppressed while blue light is further easily absorbed to enhance the photoelectric conversion efficiency of blue light in the photoelectric conversion layer 46.

Acquisition of Blue Signal by Photoelectric Conversion Element 21

Among the light incident on the first solid-state imaging element 11 or the second solid-state imaging element 11, first, blue light is selectively detected (absorbed) and photoelectrically converted by the photoelectric conversion element 21.

The charge storage electrode 42 side is positively biased and the second electrode 48 side is negatively biased to storage the electron generated in the photoelectric conversion layer 46 in the semiconductor layer 44 and transfer the hole generated in the photoelectric conversion layer 46 to the second electrode 48. In the storage of the electron in the semiconductor layer 44, the potential of the first electrode 41 is set negative with respect to the potential of the charge storage electrode 42 to form a potential barrier so that electrons do not flow.

After storage of the electron in the semiconductor layer 44 for a certain period, the potential of the first electrode 41 is set positive with respect to the potential of the charge storage electrode 42 to transfer the electron to the first electrode 41 side. The electron collected to the first electrode is subjected to voltage conversion and processed as a pixel signal by, for example, a capacitor part of a floating diffusion amplifier connected to the end of the first electrode 41.

First Example of Characteristics of Organic Material Layer that Depend on Combination and Mixing Ratios of Materials of First Organic Semiconductor, Second Organic Semiconductor, and Third Organic Semiconductor Next, a first example will be described of the characteristics of the photoelectric conversion layer 46 that depend on the combination and the mixing ratios of the materials of the first organic semiconductor, the second organic semiconductor, and the third organic semiconductor with reference to FIG. 7.

The test cell evaluated here is an evaluation element for simple evaluation. Specifically, the evaluation element has an element structure as shown by an evaluation element 50 in FIG. 6, and has a configuration in which a quartz substrate is used as a substrate 55, and on the quartz substrate, ITO 54 as a second electrode, a photoelectric conversion layer 53, a hole blocking layer 52 including the substance (1) B4PyMPM, and a first electrode 51 including Al are stacked in this order. Here, the second electrode (ITO) 54, the photoelectric conversion layer 53, the hole blocking layer 52, and the first electrode 51 correspond to the second electrode 48, the photoelectric conversion layer 46, the hole blocking layer 45, and the first electrode 41 in FIG. 4, respectively. That is, the evaluation element 50 has an element structure vertically inverted from the photoelectric conversion element 21 illustrated in FIG. 4 excluding the charge storage electrode 42, the insulating layer 43, the semiconductor layer 44, and the work function adjustment layer 47.

Furthermore, here, a comparison will be described of the characteristics of the photoelectric conversion layer 46 in cases where the first organic semiconductor is the substance (2) (Solvent Green 5 (SG5)) represented by the chemical formula (2), the second organic semiconductor is the substance (3) (DNTT) represented by the chemical formula (3) or a substance (6) (BTBT) represented by the following chemical formula (6), the third organic semiconductor is the substance (4) (C60) represented by the chemical formula (4), and the film formation rate of each organic semiconductor is adjusted to change the mixing ratio.

Chemical Formula (6)

[Chem. 6]

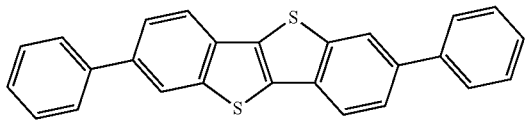

Furthermore, FIG. 7 shows the characteristics of the photoelectric conversion layer 46 in Examples 1 to 7 for comparison in order from the top.

Figure 6:
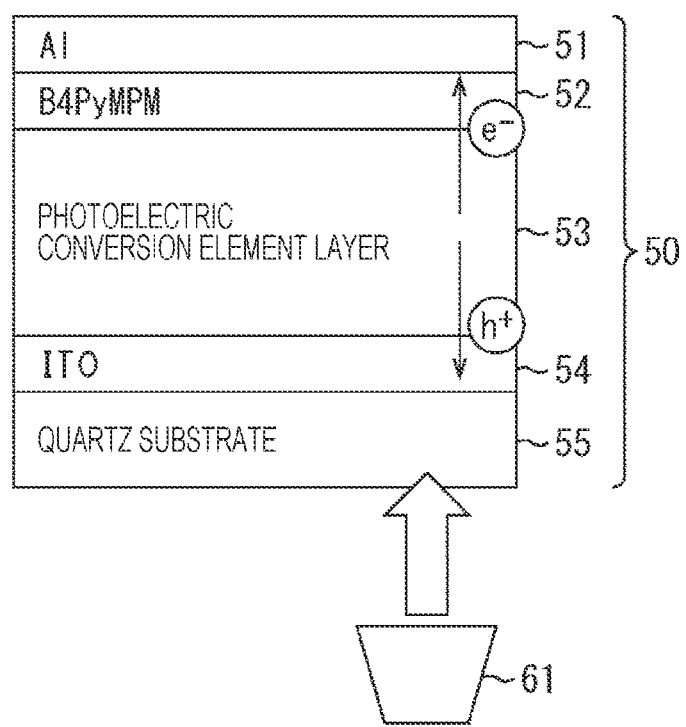
FIG. 6 is a view illustrating a configuration example of an evaluation element.

Note that the characteristics of the photoelectric conversion layer 46 are shown for cases where, as illustrated in FIG. 6, blue light (light having a wavelength of 450 nm) is emitted from a light emitting part 61 provided in the lower part of the drawing and no electrode 51 is provided.

Moreover, when the first organic semiconductor, the second organic semiconductor, and the third organic semiconductor shown from the left of FIG. 7 are represented by a, b, and c, respectively, the mixing ratio of each organic semiconductor, a:b:c is shown for each Example. Furthermore, on the right side of the mixing ratio, the absorption coefficient of light having a wavelength of 450 nm (blue light) ($\alpha$ 450 nm ($cm^{-1}$)) and the absorption coefficient of light having a wavelength of 560 nm (green light) ($\alpha$ 560 nm ($cm^{-1}$)) are shown from the left, and on the right side of the absorption coefficients, the coefficient ratio of the absorption coefficient ($\alpha$ 450 nm ($cm^{-1}$)) to the absorption coefficient ($\alpha$ 560 nm ($cm^{-2}$)) ($\alpha$ 450 nm/$\alpha$ 560 nm) is shown. Furthermore, on the right side of the coefficient ratio ($\alpha$ 450 nm/$\alpha$ 560 nm), the relative values of the dark current (jdk), the external quantum efficiency (EQE), and the response time in each Example with respect to those in Example 1 are shown from the left, and moreover, the characteristics significantly inferior to those in Example 1 are shown.

Here, in the light emitting part 61, the wavelength of light emitted from a blue LED light source to the photoelectric conversion element 21 via a band pass filter is set to 450 nm, and the light amount is set to 1.62 $\mu W/cm^2$. The current-voltage curve is measured by controlling the bias voltage applied between the electrodes of the photoelectric conversion element using a semiconductor parameter analyzer and sweeping the voltage applied to the lower electrode (second electrode 54) with respect to the voltage of the upper electrode (first electrode 51) in FIG. 6. Furthermore, the dark current value (Jdk) and the light current value are measured in a state where a voltage of −2.6 V is applied to the lower electrode (second electrode 54) with respect to the voltage of the upper electrode (first electrode 51), the dark current value is subtracted from the light current value, and from the resulting value, the external quantum efficiency EQE is calculated.

Moreover, the bias voltage applied between the electrodes of the photoelectric conversion element 21 is controlled, the photoelectric conversion element 21 is irradiated with a light pulse on a rectangle having a wavelength of 450 nm and a light amount of 1.62 μW/cm$^2$ in a state where a voltage of −2.6 V is applied to the lower electrode (second electrode 54) with respect to the upper electrode (first electrode 51), the attenuation waveform of the current is observed using an oscilloscope, and the time during which the current at the time of light pulse irradiation attenuates to 3% immediately after the light pulse irradiation is regarded as the response time as an index of the response speed.

Example 1

As shown in the uppermost row below the header row of FIG. 7, Example 1 is a case where the first organic semiconductor, the second organic semiconductor, and the third organic semiconductor are the substance (2) (Solvent Green 5 (SG5)), the substance (3) (DNTT), and the substance (4) (C60), respectively, and the uppermost row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 1 in a case where the first organic semiconductor, the second organic semiconductor, and the third organic semiconductor are mixed at film formation rates of 0.50 Å/sec, 0.50 Å/sec, and 0.25 Å/sec, respectively to form the photoelectric conversion layer 46 so as to have a predetermined thickness (for example, of 200 nm).

In the case of Example 1 in the uppermost row below the header row of FIG. 7, the ratio a:b:c, that is, the mixing ratio of the first organic semiconductor:the second organic semiconductor:the third organic semiconductor corresponds to the ratio of the film formation rate, and therefore, is 4:4:2 (=0.50 Å/sec:0.50 Å/sec:0.25 Å/sec).

At this time, the absorption coefficient (α 450 nm (cm$^{-1}$)) is 9.5E+4, the absorption coefficient (α 560 nm (cm$^{-1}$)) is 4.2E+3, and the coefficient ratio (α 450 nm/α 560 nm) is 23.

Note that Example 1 serves as a reference and therefore, all of the dark current, the EQE, and the response time are 1.00.

The experimental result for the photoelectric conversion element 21 in which the photoelectric conversion layer 46 is used in Example 1 is obtained using a ternary photoelectric conversion layer including the substance (2) (SG5), the substance (3) (DNTT), and the substance (4) (C60) at a ratio of 4:4:2, and the result shows a relatively high absorption coefficient at 450 nm in the blue light region, a relatively low absorption coefficient at 560 nm in the green light region, a good dark current characteristic, a good EQE characteristic, and a good response characteristic.

Example 2

As shown in the second row below the header row of FIG. 7, Example 2 is a case where the first organic semiconductor, the second organic semiconductor, and the third organic semiconductor are the substance (2) (Solvent Green 5 (SG5)), the substance (3) (DNTT), and the substance (4) (C60), respectively, and the second row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.50 Å/sec, 0.30 Å/sec, and 0.20 Å/sec, respectively to form the photoelectric conversion layer 46 so as to have a predetermined thickness (for example, of 200 nm).

In the case of Example 2 in the second row below the header row of FIG. 7, the mixing ratio of the first organic semiconductor:the second organic semiconductor:the third organic semiconductor corresponds to the ratio of the film formation rate a:b:c, and therefore, is 5:3:2 (=0.50 Å/sec:0.30 Å/sec:0.20 Å/sec).

Furthermore, the absorption coefficient (α 450 nm (cm$^{-1}$)) is 9.9E+4, the absorption coefficient (α 560 nm (cm$^{-1}$)) is 4.2E+3, and the coefficient ratio (α 450 nm/α 560 nm) is 24.

Moreover, the dark current is 0.92 with respect to that in Example 1, the EQE is 0.99 with respect to that in Example 1, and the response time is 1.10 with respect to that in Example 1.

The experimental result for the photoelectric conversion element 21 in which the photoelectric conversion layer 46 is used in Example 2 is obtained using a ternary photoelectric conversion layer including the substance (2) (SG5), the substance (3) (DNTT), and the substance (4) (C60) at a ratio of 5:3:2, and the result shows values close to those in Example 1, such as a relatively high absorption coefficient at 450 nm in the blue light region, a relatively low absorption coefficient at 560 nm in the green light region, a good dark current characteristic, a good EQE characteristic, and a good response characteristic. Therefore, in Example 2, it can be considered that there is no characteristic significantly inferior to that in Example 1.

Example 3

As shown in the third row below the header row of FIG. 7, Example 3 is a case where the first organic semiconductor, the second organic semiconductor, and the third organic semiconductor are the substance (2) (Solvent Green 5 (SG5)), the substance (3) (DNTT), and the substance (4) (C60), respectively, and the third row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.30 Å/sec, 0.50 Å/sec, and 0.20 Å/sec, respectively to form the photoelectric conversion layer 46 so as to have a predetermined thickness (for example, of 200 nm).

In the case of Example 3 in the third row below the header row of FIG. 7, the ratio a:b:c, that is, the mixing ratio of the first organic semiconductor:the second organic semiconductor:the third organic semiconductor corresponds to the ratio of the film formation rate, and therefore, is 3:5:2 (=0.30 Å/sec:0.50 Å/sec:0.20 Å/sec).

Furthermore, the absorption coefficient (α 450 nm (cm$^{-1}$)) is 9.2E+4, the absorption coefficient (α 560 nm (cm$^{-1}$)) is 4.1E+3, and the coefficient ratio (α 450 nm/α 560 nm) is 22.

Moreover, the dark current is 1.12 with respect to that in Example 1, the EQE is 1.02 with respect to that in Example 1, and the response time is 0.95 with respect to that in Example 1.

The experimental result for the photoelectric conversion element 21 in which the photoelectric conversion layer 46 is used in Example 3 is obtained using a ternary photoelectric conversion layer including the substance (2) (SG5), the substance (3) (DNTT), and the substance (4) (C60) at a ratio of 3:5:2, and the result shows values close to those in Example 1, such as a relatively high absorption coefficient at 450 nm in the blue light region, a relatively low absorption coefficient at 560 nm in the green light region, a good dark current characteristic, a good EQE characteristic, and a good response characteristic. Therefore, in Example 3, it can be considered that there is no characteristic significantly inferior to that in Example 1.

Example 4

As shown in the fourth row below the header row of FIG. 7, Example 4 is a case where the first organic semiconductor, the second organic semiconductor, and the third organic semiconductor are the substance (2) (Solvent Green 5 (SG5)), the substance (3) (DNTT), and the substance (4) (C60), respectively, and the fourth row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.35 Å/sec, 0.35 Å/sec, and 0.3 Å/sec, respectively to form the photoelectric conversion layer 46 so as to have a predetermined thickness (for example, of 200 nm).

In the case of Example 4 in the fourth row below the header row of FIG. 7, the ratio a:b:c, that is, the mixing ratio of the first organic semiconductor:the second organic semiconductor:the third organic semiconductor corresponds to the ratio of the film formation rate, and therefore, is 3.5:3.5:3 (=0.35 Å/sec:0.35 Å/sec:0.30 Å/sec).

Furthermore, the absorption coefficient (α 450 nm (cm$^{-1}$)) is 9.2E+4, the absorption coefficient (α 560 nm (cm$^{-1}$)) is 6.1E+3, and the coefficient ratio (α 450 nm/α 560 nm) is 15.

Moreover, the dark current is 1.64 with respect to that in Example 1, the EQE is 1.08 with respect to that in Example 1, and the response time is 0.98 with respect to that in Example 1.

The experimental result for the photoelectric conversion element 21 in which the photoelectric conversion layer 46 is used in Example 4 is obtained using a ternary photoelectric conversion layer including the substance (2) (SG5), the substance (3) (DNTT), and the substance (4) (C60) at a ratio of 3.5:3.5:3, and the result shows values close to those in Example 1, such as a relatively high absorption coefficient at 450 nm in the blue light region, a relatively low absorption coefficient at 560 nm in the green light region, a good dark current characteristic, a good EQE characteristic, and a good response characteristic. Therefore, in Example 4, it can be considered that there is no characteristic significantly inferior to that in Example 1.

Example 5

As shown in the fifth row below the header row of FIG. 7, Example 5 is a case where the first organic semiconductor, the second organic semiconductor, and the third organic semiconductor are the substance (2) (Solvent Green 5 (SG5)), the substance (3) (DNTT), and the substance (4) (C60), respectively, and the fifth row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.00 Å/sec, 0.50 Å/sec, and 0.50 Å/sec, respectively to form the photoelectric conversion layer 46 so as to have a predetermined thickness (for example, of 200 nm).

Note that the case where the film formation rate is 0.00 Å/sec does not refer to a state where no film is formed, but refers to a state where a film is formed at a small film formation rate that is extremely close to 0.00 Å/sec. Therefore, the photoelectric conversion layer 46 will be described as a mixture of the first organic semiconductor, the second organic semiconductor, and the third organic semiconductor in principle. However, the case where the film formation rate is close to 0.00 Å/sec is substantially similar to a state where no film is formed.

That is, in Example 5, the photoelectric conversion layer 46 includes substantially no substance (2) (Solvent Green 5 (SG5)) as the first organic semiconductor.

In the case of Example 5 in the fifth row below the header row of FIG. 7, the ratio a:b:c, that is, the mixing ratio of the first organic semiconductor:the second organic semiconductor:the third organic semiconductor corresponds to the ratio of the film formation rate, and therefore, is 0:5:5 (=0.00 Å/sec:0.50 Å/sec:0.50 Å/sec).

Furthermore, the absorption coefficient (α 450 nm (cm$^{-1}$)) is 5.6E+4, the absorption coefficient (α 560 nm (cm$^{-1}$)) is 1.9E+4, and the coefficient ratio (α 450 nm/α 560 nm) is 3.

Moreover, the dark current is 0.98 with respect to that in Example 1, the EQE is 0.65 with respect to that in Example 1, the response time is 1.04 with respect to that in Example 1, and the characteristics significantly inferior to those in Example 1 are the coefficient ratio as a spectral characteristic and the EQE.

The experimental result for the photoelectric conversion element 21 in which the photoelectric conversion layer 46 is used in Example 5 is obtained using a ternary photoelectric conversion layer including the substance (2) (SG5), the substance (3) (DNTT), and the substance (4) (C60) at a ratio of 0:5:5, and the result shows a low absorption coefficient of blue light (α 450 nm (cm$^{-1}$)) and a small coefficient ratio because the blue selectivity as the characteristic of the substance (2) is low due to the fact that substantially no substance (2) is included. Furthermore, the dark current characteristic and the response characteristic are substantially the same as those in Example 1, but the EQE characteristic is inferior because the absorption of blue light is inferior.

Example 6

As shown in the sixth row below the header row of FIG. 7, Example 6 is a case where the first organic semiconductor, the second organic semiconductor, and the third organic semiconductor are the substance (2) (Solvent Green 5 (SG5)), the substance (3) (DNTT), and the substance (4) (C60), respectively, and the sixth row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.50 Å/sec, 0.00 Å/sec, and 0.50 Å/sec, respectively to form the photoelectric conversion layer 46 so as to have a predetermined thickness (for example, of 200 nm).

That is, in Example 6, the photoelectric conversion layer 46 includes substantially no substance (3) (DNTT) as the second organic semiconductor.

In the case of Example 6 in the sixth row below the header row of FIG. 7, the mixing ratio of the first organic semiconductor:the second organic semiconductor:the third organic semiconductor corresponds to the ratio of the film formation rate, and therefore, is 5:0:5 (=0.50 Å/sec:0.00 Å/sec: 0.50 Å/sec).

Furthermore, the absorption coefficient ($\alpha$ 450 nm ($cm^{-1}$)) is 8.3E+4, the absorption coefficient ($\alpha$ 560 nm ($cm^{-1}$)) is 1.4E+4, and the coefficient ratio ($\alpha$ 450 nm/$\alpha$ 560 nm) is 6.

Moreover, the dark current is 1.10 with respect to that in Example 1, the EQE is 0.98 with respect to that in Example 1, the response time is 14.5 with respect to that in Example 1, and the characteristics significantly inferior to those in Example 1 are the coefficient ratio as a spectral characteristic and the response time.

The experimental result for the photoelectric conversion element 21 in which the photoelectric conversion layer 46 is used in Example 6 is obtained using a ternary photoelectric conversion layer including the substance (2) (SG5), the substance (3) (DNTT), and the substance (4) (C60) at a ratio of 5:0:5, and the result shows a high absorption coefficient of green light ($\alpha$ 560 nm ($cm^{-1}$)) and a small coefficient ratio. Furthermore, the dark current characteristic and the EQE characteristic are substantially the same as those in Example 1, but the response characteristic is inferior because substantially no substance (3) (DNTT) as a hole-transporting material is included.

Example 7

As shown in the seventh row below the header row of FIG. 7, Example 7 is a case where the first organic semiconductor, the second organic semiconductor, and the third organic semiconductor are the substance (2) (Solvent Green 5 (SG5)), the substance (3) (DNTT), and the substance (4) (C60), respectively, and the seventh row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.50 Å/sec, 0.50 Å/sec, and 0.00 Å/sec, respectively to form the photoelectric conversion layer 46 so as to have a predetermined thickness (for example, of 200 nm).

That is, in Example 7, the photoelectric conversion layer 46 includes substantially no substance (4) (C60) as the third organic semiconductor.

In the case of Example 7 in the seventh row below the header row of FIG. 7, the mixing ratio of the first organic semiconductor:the second organic semiconductor:the third organic semiconductor corresponds to the ratio of the film formation rate, and therefore, is 5:5:0 (=0.50 Å/sec:0.50 Å/sec:0.00 Å/sec).

Furthermore, the absorption coefficient ($\alpha$ 450 nm ($cm^{-1}$)) is 1.3E+5, the absorption coefficient ($\alpha$ 560 nm ($cm^{-1}$)) is 1.5E+3, and the coefficient ratio ($\alpha$ 450 nm/$\alpha$ 560 nm) is 87.

Moreover, the dark current is 23.0 with respect to that in Example 1, the EQE is 0.45 with respect to that in Example 1, the response time is unmeasurable (n/a) because the dark current is too large, and the characteristics significantly inferior to those in Example 1 are the spectral dark current, EQE, and response time.

The experimental result for the photoelectric conversion element 21 in which the photoelectric conversion layer 46 is used in Example 7 is obtained using a ternary photoelectric conversion layer including the substance (2) (SG5), the substance (3) (DNTT), and the substance (4) (C60) at a ratio of 0:5:5, and the result shows a high absorption coefficient of blue light ($\alpha$ 450 nm ($cm^{-1}$)) and a large coefficient ratio. However, all of the dark current characteristic, the EQE characteristic, and the response characteristic are poor. The reason is considered to be that due to the fact that substantially no substance (4), C60, to be an electron-transporting material was included, no donor/acceptor interface was formed in the organic material layer (photoelectric conversion layer) 53 and as a result, exciton dissociation rarely occurred.

Example 8

As shown in the eighth row below the header row of FIG. 7, Example 8 is a case where the first organic semiconductor, the second organic semiconductor, and the third organic semiconductor are the substance (2) (Solvent Green 5 (SG5)), the substance (6) (BTBT), and the substance (4) (C60), respectively, and the eighth row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 1, and the characteristics significantly inferior to those in Example 1 in a case where the first organic semiconductor, the second organic semiconductor, and the third organic semiconductor are mixed at film formation rates of 0.50 Å/sec, 0.50 Å/sec, and 0.25 Å/sec, respectively to form the photoelectric conversion layer 46 so as to have a predetermined thickness (for example, of 200 nm).

That is, in Example 8, the second organic semiconductor is the substance (6) (BTBT).

In the case of Example 8 in the eighth row below the header row of FIG. 7, the mixing ratio of the first organic semiconductor:the second organic semiconductor:the third organic semiconductor corresponds to the ratio of the film formation rate, and therefore, is 4:4:2 (=0.50 Å/sec:0.50 Å/sec:0.25 Å/sec).

Furthermore, the absorption coefficient (α 450 nm (cm$^{-1}$)) is 3.8E+4, the absorption coefficient (α 560 nm (cm$^{-1}$)) is 4.2E+3, and the coefficient ratio (α 450 nm/α 560 nm) is 9.

Moreover, the dark current is 1.00 with respect to that in Example 1, the EQE is 0.63 with respect to that in Example 1, the response time is 1.00 with respect to that in Example 1, and the characteristics significantly inferior to those in Example 1 are the coefficient ratio as a spectral characteristic and the EQE.

The experimental result for the photoelectric conversion element 21 in which the photoelectric conversion layer 46 is used in Example 8 is obtained using a ternary photoelectric conversion layer including the substance (2) (SG5), the substance (6) (BTBT), and the substance (4) (C60) at a ratio of 4:4:2, and the result shows a low absorption coefficient of blue light (α 450 nm (cm$^{-1}$)), poor blue light selectivity, and a small coefficient ratio. Furthermore, the dark current characteristic and the EQE characteristic are poor. The reason is considered to be that the absorption rate of blue light is low.

From a comparison among Examples 1 to 8 illustrated in FIG. 7 above, it is considered that the photoelectric conversion element 21 including the photoelectric conversion layer 46 formed in Examples 1 to 4 can photoelectrically convert blue light selectively with high efficiency.

That is, it can be considered that desirable characteristics can be obtained in a case where the first organic semiconductor, the second organic semiconductor, and the third organic semiconductor are the substance (2) (Solvent Green 5 (SG5)), the substance (3) (DNTT), and the substance (4) (C60), respectively, and the photoelectric conversion layer 46 is formed to have a ratio of each organic semiconductor, a:b:c so that the proportion of the substance (4) (C60) to the whole is about 20% to 30%, the remaining 70% to 80% is occupied by the substance (2) (Solvent Green 5 (SG5)) and the substance (3) (DNTT), and the substance (2) (Solvent Green 5 (SG5)) and the substance (3) (DNTT) are mixed at a ratio of approximately 3:5 to approximately 5:3.

Second Example of Characteristics of Organic Material Layer that Depend on Combination and Mixing Ratios of Materials of First Organic Semiconductor, Second Organic Semiconductor, and Third Organic Semiconductor Next, a second example will be described of the characteristics of the photoelectric conversion layer 46 that depend on the combination and the mixing ratios of the materials of the first organic semiconductor, the second organic semiconductor, and the third organic semiconductor with reference to FIG. 8.

A comparison has been described above of the characteristics of the photoelectric conversion layer 46 in cases where the first organic semiconductor is the substance (2) (Solvent Green 5 (SG5)) represented by the chemical formula (2), the second organic semiconductor is the substance (3) (DNTT) represented by the chemical formula (3) or the substance (6) (BTBT) represented by the chemical formula (6), the third organic semiconductor is the substance (4) (C60) represented by the chemical formula (4), and the film formation rate of each organic semiconductor is adjusted to change the mixing ratio.

However, the first organic semiconductor may be a substance other than the substance (2) (Solvent Green 5 (SG5)) as long as the substance is a semiconductor that absorbs blue light and generates an electron (charge) by photoelectric conversion. Furthermore, the second organic semiconductor may be a substance other than the substance (3) (DNTT) and the substance (6) (BTBT) as long as the substance is a hole-transporting material that absorbs blue light and has crystallinity.

Therefore, the first organic semiconductor may be, for example, a substance (7) (3-(2-benzothiazolyl)-7-(diethylamino) coumarin (Coumarin 6)) represented by the following chemical formula (7) as a semiconductor that absorbs blue light and generates an electron (charge) by photoelectric conversion.

Chemical Formula (7)

[Chem. 7]

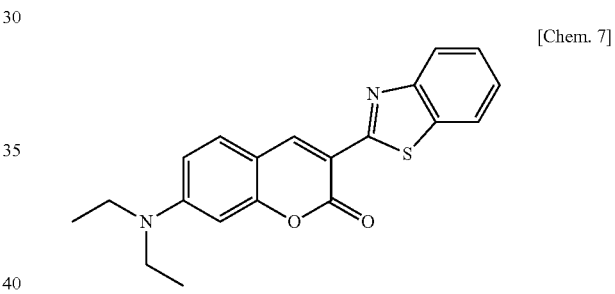

Furthermore, the second organic semiconductor may be, for example, a substance (8) (2,9-bis([1,1'-biphenyl]-benzo[1",2":4,5;4",5":4',5']dithieno[3,2-b:3',2'-b']bis[1]benzothiophene (DBP-BTBDT))) represented by the following chemical formula (8) as a hole-transporting material that absorbs blue light and has crystallinity.

[Chem. 8]

Chemical Formula (8)

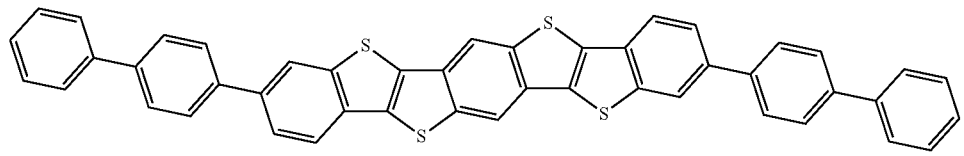

Therefore, here, a comparison will be described of the characteristics of the photoelectric conversion layer 46 in cases where the first organic semiconductor is the substance (7) (Coumarin 6) represented by the chemical formula (7), the second organic semiconductor is the substance (8) (DBP-BTBDT) represented by the chemical formula (8) or the substance (6) (BTBT) represented by the chemical formula (6), the third organic semiconductor is the substance (4) (C60) represented by the chemical formula (4), and the film formation rate of each organic semiconductor is adjusted to change the mixing ratio.

Example 11

As shown in the uppermost row below the header row of FIG. 8, Example 11 is a case where the first organic semiconductor, the second organic semiconductor, and the third organic semiconductor are the substance (7) (Coumarin 6), the substance (8) (DBP-BTBDT), and the substance (4) (C60), respectively, and the uppermost row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 1, and the characteristics significantly inferior to those in Example 11 in a case where the first organic semiconductor, the second organic semiconductor, and the third organic semiconductor are mixed at film formation rates of 0.50 Å/sec, 0.50 Å/sec, and 0.25 Å/sec, respectively to form the photoelectric conversion layer 46 so as to have a predetermined thickness (for example, of 200 nm).

In the case of Example 11 in the uppermost row below the header row of FIG. 8, the ratio a:b:c, that is, the mixing ratio of the first organic semiconductor:the second organic semiconductor:the third organic semiconductor corresponds to the ratio of the film formation rate, and therefore, is 4:4:2 (=0.50 Å/sec:0.50 Å/sec:0.25 Å/sec).

Furthermore, the absorption coefficient ($\alpha$ 450 nm ($cm^{-1}$)) is 1.9E+5, the absorption coefficient ($\alpha$ 560 nm ($cm^{-1}$)) is 6.2E+3, and the coefficient ratio ($\alpha$ 450 nm/$\alpha$ 560 nm) is 31.

Note that Example 11 serves as a reference and therefore, all of the dark current, the EQE, and the response time are 1.00.

The experimental result for the photoelectric conversion element 21 in which the photoelectric conversion layer 46 is used in Example 11 is obtained using a ternary photoelectric conversion layer including the substance (7) (Coumarin 6), the substance (3) (DNTT), and the substance (4) (C60) at a ratio of 4:4:2, and the result shows a relatively high absorption coefficient at 450 nm in the blue light region, a relatively low absorption coefficient at 560 nm in the green light region, a good dark current characteristic, a good EQE characteristic, and a good response characteristic.

Example 12

As shown in the second row below the header row of FIG. 8, Example 12 is a case where the first organic semiconductor, the second organic semiconductor, and the third organic semiconductor are the substance (7) (Coumarin 6), the substance (8) (DBP-BTBDT), and the substance (4) (C60), respectively, and the second row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 11, and the characteristics significantly inferior to those in Example 11 in a case where the first organic semiconductor, the second organic semiconductor, and the third organic semiconductor are mixed at film formation rates of 0.50 Å/sec, 0.30 Å/sec, and 0.20 Å/sec, respectively to form the photoelectric conversion layer 46 so as to have a predetermined thickness (for example, of 200 nm).

In the case of the second row below the header row of FIG. 8, the ratio a:b:c, that is, the mixing ratio of the first organic semiconductor:the second organic semiconductor:the third organic semiconductor corresponds to the ratio of the film formation rate, and therefore, is 5:3:2 (=0.50 Å/sec:0.30 Å/sec:0.20 Å/sec).

Furthermore, the absorption coefficient ($\alpha$ 450 nm ($cm^{-1}$)) is 2.1E+5, the absorption coefficient ($\alpha$ 560 nm ($cm^{-1}$)) is 5.4E+3, and the coefficient ratio ($\alpha$ 450 nm/$\alpha$ 560 nm) is 39.

Moreover, the dark current is 0.91 with respect to that in Example 11, the EQE is 0.97 with respect to that in Example 11, and the response time is 1.21 with respect to that in Example 11.

The experimental result for the photoelectric conversion element 21 in which the photoelectric conversion layer 46 is used in Example 12 is obtained using a ternary photoelectric conversion layer including the substance (7) (Coumarin 6), the substance (8) (DBP-BTBDT), and the substance (4) (C60) at a ratio of 5:3:2, and the result shows values close to those in Example 11, such as a relatively high absorption coefficient at 450 nm in the blue light region, a relatively low absorption coefficient at 560 nm in the green light region, a good dark current characteristic, a good EQE characteristic, and a good response characteristic. Therefore, in Example 12, it can be considered that there is no characteristic significantly inferior to that in Example 11.

Example 13

As shown in the third row below the header row of FIG. 8, Example 13 is a case where the first organic semiconductor, the second organic semiconductor, and the third organic semiconductor are the substance (7) (Coumarin 6), the substance (8) (DBP-BTBDT), and the substance (4) (C60), respectively, and the third row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 11, and the characteristics significantly inferior to those in Example 11 in a case where the first organic semiconductor, the second organic semiconductor, and the third organic semiconductor are mixed at film formation rates of 0.30 Å/sec, 0.50 Å/sec, and 0.20 Å/sec, respectively to form the photoelectric conversion layer 46 so as to have a predetermined thickness (for example, of 200 nm).

In the case of the third row below the header row of FIG. 8, the ratio a:b:c, that is, the mixing ratio of the first organic semiconductor:the second organic semiconductor:the third organic semiconductor corresponds to the ratio of the film formation rate, and therefore, is 3:5:2 (=0.30 Å/sec:0.50 Å/sec:0.20 Å/sec).

Furthermore, the absorption coefficient ($\alpha$ 450 nm ($cm^{-1}$)) is 1.8E+5, the absorption coefficient ($\alpha$ 560 nm ($cm^{-1}$)) is 6.5E+3, and the coefficient ratio ($\alpha$ 450 nm/$\alpha$ 560 nm) is 28.

Moreover, the dark current is 1.24 with respect to that in Example 11, the EQE is 1.08 with respect to that in Example 11, and the response time is 0.93 with respect to that in Example 11.

The experimental result for the photoelectric conversion element 21 in which the photoelectric conversion layer 46 is used in Example 13 is obtained using a ternary photoelectric conversion layer including the substance (7) (Coumarin 6), the substance (8) (DBP-BTBDT), and the substance (4) (C60) at a ratio of 3:5:2, and the result shows values close to those in Example 11, such as a relatively high absorption coefficient at 450 nm in the blue light region, a relatively low absorption coefficient at 560 nm in the green light region, a good dark current characteristic, a good EQE characteristic, and a good response characteristic. Therefore, in Example 13, it can be considered that there is no characteristic significantly inferior to that in Example 11.

Example 14

As shown in the fourth row below the header row of FIG. 8, Example 14 is a case where the first organic semiconductor, the second organic semiconductor, and the third organic semiconductor are the substance (7) (Coumarin 6), the substance (8) (DBP-BTBDT), and the substance (4) (C60), respectively, and the fourth row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 11, and the characteristics significantly inferior to those in Example 11 in a case where the first organic semiconductor, the second organic semiconductor, and the third organic semiconductor are mixed at film formation rates of 0.35 Å/sec, 0.35 Å/sec, and 0.30 Å/sec, respectively to form the photoelectric conversion layer 46 so as to have a predetermined thickness (for example, of 200 nm).

In the case of the fourth row below the header row of FIG. 8, the ratio a:b:c, that is, the mixing ratio of the first organic semiconductor:the second organic semiconductor:the third organic semiconductor corresponds to the ratio of the film formation rate, and therefore, is 3.5:3.5:3 (=0.35 Å/sec:0.35 Å/sec:0.30 Å/sec).

Furthermore, the absorption coefficient ($\alpha$ 450 nm ($cm^{-1}$)) is 1.8E+5, the absorption coefficient ($\alpha$ 560 nm ($cm^{-1}$)) is 8.1E+3, and the coefficient ratio ($\alpha$ 450 nm/$\alpha$ 560 nm) is 22.

Moreover, the dark current is 1.73 with respect to that in Example 11, the EQE is 1.08 with respect to that in Example 11, and the response time is 0.97 with respect to that in Example 11.

The experimental result for the photoelectric conversion element 21 in which the photoelectric conversion layer 46 is used in Example 14 is obtained using a ternary photoelectric conversion layer including the substance (7) (Coumarin 6), the substance (8) (DBP-BTBDT), and the substance (4) (C60) at a ratio of 3.5:3.5:3, and the result shows values close to those in Example 11, such as a relatively high absorption coefficient at 450 nm in the blue light region, a relatively low absorption coefficient at 560 nm in the green light region, a good dark current characteristic, a good EQE characteristic, and a good response characteristic. Therefore, in Example 14, it can be considered that there is no characteristic significantly inferior to that in Example 11.

Example 15

As shown in the fifth row below the header row of FIG. 8, Example 15 is a case where the first organic semiconductor, the second organic semiconductor, and the third organic semiconductor are the substance (7) (Coumarin 6), the substance (8) (DBP-BTBDT), and the substance (4) (C60), respectively, and the fifth row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 1 in a case where the first organic semiconductor, the second organic semiconductor, and the third organic semiconductor are mixed at film formation rates of 0.00 Å/sec, 0.50 Å/sec, and 0.50 Å/sec, respectively to form the photoelectric conversion layer 46 so as to have a predetermined thickness (for example, of 200 nm).

That is, in Example 15, the photoelectric conversion layer 46 includes substantially no substance (7) (Coumarin 6) as the first organic semiconductor.

In the case of the fifth row below the header row of FIG. 8, the ratio a:b:c, that is, the mixing ratio of the first organic semiconductor:the second organic semiconductor:the third organic semiconductor corresponds to the ratio of the film formation rate, and therefore, is 0:5:5 (=0.00 Å/sec:0.50 Å/sec:0.50 Å/sec).

Furthermore, the absorption coefficient ($\alpha$ 450 nm ($cm^{-1}$)) is 5.9E+4, the absorption coefficient ($\alpha$ 560 nm ($cm^{-1}$)) is 1.7E+4, and the coefficient ratio ($\alpha$ 450 nm/$\alpha$ 560 nm) is 3.

Moreover, the dark current is 1.02 with respect to that in Example 11, the EQE is 0.70 with respect to that in Example 11, the response time is 1.01 with respect to that in Example 11, and the characteristics significantly inferior to those in Example 11 are the coefficient ratio as a spectral characteristic and the EQE.

The experimental result for the photoelectric conversion element 21 in which the photoelectric conversion layer 46 is used in Example 15 is obtained using a ternary photoelectric conversion layer including the substance (7) (Coumarin 6), the substance (8) (DBP-BTBDT), and the substance (4) (C60) at a ratio of 0:5:5, and the result shows a low absorption coefficient of blue light ($\alpha$ 450 nm ($cm^{-1}$)) and a small coefficient ratio because the blue selectivity as the characteristic of the substance (7) is low due to the fact that substantially no substance (7) is included. Furthermore, the dark current characteristic and the response characteristic are substantially the same as those in Example 11, but the EQE characteristic is inferior because the absorption of blue light is inferior.

Example 16

As shown in the sixth row below the header row of FIG. 8, Example 16 is a case where the first organic semiconductor, the second organic semiconductor, and the third organic semiconductor are the substance (7) (Coumarin 6), the substance (8) (DBP-BTBDT), and the substance (4) (C60), respectively, and the sixth row shows the absorption coefficient ($\alpha$ 450 nm ($cm^{-1}$)), the absorption coefficient ($\alpha$ 560 nm ($cm^{-1}$)), the ratio of the absorption coefficient ($\alpha$ 450 nm/$\alpha$ 560 nm), the relative values of the dark current, the EQE, and the response time with respect to those in Example 1, and the characteristics significantly inferior to those in Example 11 in a case where the first organic semiconductor, the second organic semiconductor, and the third organic semiconductor are mixed at film formation rates of 0.50 Å/sec, 0.00 Å/sec, and 0.50 Å/sec, respectively to form the photoelectric conversion layer 46 so as to have a predetermined thickness (for example, of 200 nm).

That is, in Example 16, the photoelectric conversion layer 46 includes no substance (8) (DBP-BTBDT) as the second organic semiconductor.

In the case of the sixth row below the header row of FIG. 8, the ratio a:b:c, that is, the mixing ratio of the first organic semiconductor:the second organic semiconductor:the third organic semiconductor corresponds to the ratio of the film formation rate, and therefore, is 5:0:5 (=0.50 Å/sec:0.00 Å/sec:0.50 Å/sec).

Furthermore, the absorption coefficient (α 450 nm (cm$^{-1}$)) is 1.8E+5, the absorption coefficient (α 560 nm (cm$^{-1}$)) is 2.2E+4, and the coefficient ratio (α 450 nm/α 560 nm) is 8.

Moreover, the dark current is 1.32 with respect to that in Example 11, the EQE is 0.43 with respect to that in Example 11, the response time is 12.5 with respect to that in Example 11, and the characteristics significantly inferior to those in Example 11 are the coefficient ratio as a spectral characteristic and the response time.

The experimental result for the photoelectric conversion element 21 in which the photoelectric conversion layer 46 is used in Example 16 is obtained using a ternary photoelectric conversion layer including the substance (7) (Coumarin 6), the substance (8) (DBP-BTBDT), and the substance (4) (C60) at a ratio of 5:0:5, and the result shows a high absorption coefficient of green light (α 560 nm (cm$^{-1}$)) and a small coefficient ratio. Furthermore, the dark current characteristic and the EQE characteristic are substantially the same as those in Example 11, but the response characteristic is inferior because substantially no substance (8) (DBP-BTBDT) as a hole-transporting material is included.

Example 17

As shown in the seventh row below the header row of FIG. 8, Example 17 is a case where the first organic semiconductor, the second organic semiconductor, and the third organic semiconductor are the substance (7) (Coumarin 6), the substance (8) (DBP-BTBDT), and the substance (4) (C60), respectively, and the seventh row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 11, and the characteristics significantly inferior to those in Example 11 in a case where the first organic semiconductor, the second organic semiconductor, and the third organic semiconductor are mixed at film formation rates of 0.50 Å/sec, 0.50 Å/sec, and 0.00 Å/sec, respectively to form the photoelectric conversion layer 46 so as to have a predetermined thickness (for example, of 200 nm).

That is, in Example 17, the photoelectric conversion layer 46 includes substantially no substance (4) (C60) as the third organic semiconductor.

In the case of the seventh row below the header row of FIG. 8, the ratio a:b:c, that is, the mixing ratio of the first organic semiconductor:the second organic semiconductor:the third organic semiconductor corresponds to the ratio of the film formation rate, and therefore, is 5:5:0 (=0.50 Å/sec: 0.50 Å/sec: 0.00 Å/sec).

Furthermore, the absorption coefficient (α 450 nm (cm$^{-1}$)) is 2.3E+5, the absorption coefficient (α 560 nm (cm$^{-1}$)) is 1.9E+3, and the coefficient ratio (α 450 nm/α 560 nm) is 121.

Moreover, the dark current is 53.1 with respect to that in Example 11, the EQE is 0.12 with respect to that in Example 11, the response time is unmeasurable (n/a) because the dark current is too large, and the characteristics significantly inferior to those in Example 11 are the spectral dark current, EQE, and response time.

The experimental result for the photoelectric conversion element 21 in which the photoelectric conversion layer 46 is used in Example 17 is obtained using a ternary photoelectric conversion layer including the substance (7) (Coumarin 6), the substance (8) (DBP-BTBDT), and the substance (4) (C60) at a ratio of 5:5: 0, and the result shows a high absorption coefficient of blue light (α 450 nm (cm$^{-1}$)) and a large coefficient ratio. However, all of the dark current characteristic, the EQE characteristic, and the response characteristic are poor. The reason is considered to be that due to the fact that substantially no substance (4), C60, to be an electron-transporting material was included, no donor/acceptor interface was formed in the organic material layer (photoelectric conversion layer) 53 and as a result, exciton dissociation rarely occurred.

Example 18

As shown in the eighth row below the header row of FIG. 8, Example 18 is a case where the first organic semiconductor, the second organic semiconductor, and the third organic semiconductor are the substance (7) (Coumarin 6), the substance (6) (BTBT), and the substance (4) (C60), respectively, and the eighth row shows the absorption coefficient (α 450 nm (cm$^{-1}$)), the absorption coefficient (α 560 nm (cm$^{-1}$)), the ratio of the absorption coefficient (α 450 nm/α 560 nm), the relative values of the dark current, the EQE, and the response time with respect to those in Example 11, and the characteristics significantly inferior to those in Example 11 in a case where the first organic semiconductor, the second organic semiconductor, and the third organic semiconductor are mixed at film formation rates of 0.50 Å/sec, 0.50 Å/sec, and 0.25 Å/sec, respectively to form the photoelectric conversion layer 46 so as to have a predetermined thickness (for example, of 200 nm).

That is, in Example 18, the second organic semiconductor is the substance (6) (BTBT).

In the case of the eighth row below the header row of FIG. 8, the ratio a:b:c, that is, the mixing ratio of the first organic semiconductor:the second organic semiconductor:the third organic semiconductor corresponds to the ratio of the film formation rate, and therefore, is 4:4:2 (=0.50 Å/sec:0.50 Å/sec: 0.25 Å/sec).

Furthermore, the absorption coefficient (α 450 nm (cm$^{-1}$)) is 1.2E+5, the absorption coefficient (α 560 nm (cm$^{-1}$)) is 5.3E+3, and the coefficient ratio (α 450 nm/α 560 nm) is 23.

Moreover, the dark current is 53.1 with respect to that in Example 11, the EQE is 0.12 with respect to that in Example 11, the response time is 1.02 with respect to that in Example 11, and the characteristics significantly inferior to those in Example 11 are the coefficient ratio as a spectral characteristic and the EQE.

The experimental result for the photoelectric conversion element 21 in which the photoelectric conversion layer 46 is used in Example 18 is obtained using a ternary photoelectric conversion layer including the substance (7) (Coumarin 6), the substance (6) (BTBT), and the substance (4) (C60) at a ratio of 4:4:2, and the result shows a low absorption coefficient of blue light (α 450 nm (cm$^{-1}$)). Furthermore, the EQE characteristic is poor. The reason is considered to be that the absorption rate of blue light is low.

From a comparison among Examples 11 to 18 illustrated in FIG. 8 above, it is considered that the photoelectric conversion element 21 including the photoelectric conversion layer 46 formed in Examples 11 to 14 can photoelectrically convert blue light selectively with high efficiency.

That is, it can be considered that desirable characteristics can be obtained in a case where the first organic semiconductor, the second organic semiconductor, and the third organic semiconductor are the substance (7) (Coumarin 6), the substance (8) (DBP-BTBDT), and the substance (4) (C60), respectively, and the photoelectric conversion layer 46 is formed to have a ratio of each organic semiconductor, a:b:c so that the proportion of the substance (4) (C60) to the whole is about 20% to 30%, the remaining 70% to 80% is occupied by the substance (7) (Coumarin 6) and the substance (6) (BTBT), and the substance (7) (Coumarin 6) and the substance (6) (BTBT) are mixed at a ratio of approximately 3:5 to approximately 5:3.

Note that although Examples have been described above in which the substance (2) (SG5) and the substance (7) (Coumarin 6) are used as the first organic semiconductor, the first organic semiconductor may be another semiconductor as long as, for example, the another semiconductor absorbs blue light and generates an electron (charge) by photoelectric conversion.

More specifically, the first organic semiconductor is a film that absorbs blue light (including blue light in the range of, for example, 400 to 500 nm in which the wavelength used in the experiment, 450 nm, is included) but does not absorb green light (including green light in the range of, for example, 500 to 600 nm in which the wavelength used in the experiment, 560 nm, is included as a center) and red light (including red light in the range of, for example, 600 to 700 nm). Specifically, it is sufficient if the first organic semiconductor has an absorption coefficient of blue light (including blue light in the range of, for example, 400 to 500 nm in which the wavelength used in the experiment, 450 nm, is included) of 40,000 cm$^{-1}$ or more and absorption coefficients of green light (including green light in the range of, for example, 500 to 600 nm in which the wavelength used in the experiment, 560 nm, is included) and red light (including red light in the range of, for example, 500 to 700 nm) of 10,000 cm$^{-1}$ or less. For example, the first organic semiconductor may be dipyrromethane, azadipyrromethane, dipyridyl, azadipyridyl, coumarin, perylene, pyrene, naphthalenediimide, xanthene, xanthenoxanthene, phenoxazine, indigo, azo oxazine, benzodithiophene, naphthodithiophene, anthradithiophene, anthracene, tetracene, anthraquinone, tetraquinone, dinaphthothienothiophene, oligothiophene, cyanine, squalium, porphyrin, phthalocyanine, or a derivative thereof.

Furthermore, although Examples have been described above in which the substance (3) (DNTT), the substance (6) (BTBT), and the substance (8) (DBP-BTBDT) are used as the second organic semiconductor, the second organic semiconductor may be another semiconductor as long as the another semiconductor is a hole-transporting material that absorbs blue light and has crystallinity.

More specifically, the first condition is that the film in which the second organic semiconductor is deposited absorbs blue light (including blue light in the range of, for example, 400 to 500 nm in which the wavelength used in the experiment, 450 nm, is included) but does not absorb green light (including green light in the range of, for example, 500 to 600 nm in which the wavelength used in the experiment, 560 nm, is included) and red light (including red light in the range of, for example, 500 to 700 nm), and has an absorption coefficient of blue light of 40,000 cm$^{-1}$ or more and an absorption rate of blue light of 80% or more, and an absorption coefficient of green and red light of 10,000 cm$^{-1}$ or less and an absorption rate of green and red light of less than 20%.

Furthermore, the second condition is that the film in which the second organic semiconductor is deposited is a hole-transporting material having a highest occupied molecular orbital (HOMO) energy level of 5.0 to 6.2 eV and has a hole mobility of 1E-6 cm$^{-2}$/Vs or more.

Moreover, the third condition is that the film in which the second organic semiconductor material is deposited shows a peak of the crystallinity by out-of-plane X-ray measurement, and the organic photoelectric conversion layer in the photoelectric conversion element 21 including the second organic semiconductor material has a peak of the crystallinity by out-of-plane X-ray measurement at the position equivalent to that of the peak of the crystallinity by out-of-plane X-ray measurement of the second organic semiconductor single film.

That is, it is sufficient that the second organic semiconductor satisfies the above-described first to third conditions, and the second organic semiconductor may be, for example, any of substances (9) to (25) respectively represented by the following chemical formulae (9) to (25).

[Chem. 9]

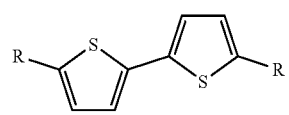

Chemical Formula (9)

[Chem. 10]

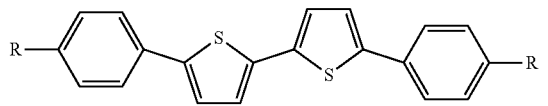

Chemical Formula (10)

[Chem. 11]

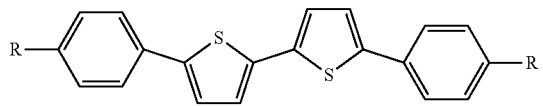

Chemical Formula (11)

[Chem. 12]

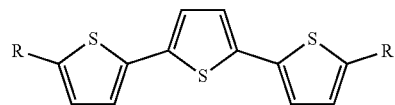

Chemical Formula (12)

[Chem. 13]

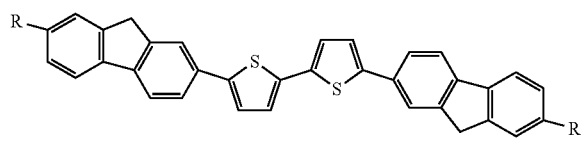

Chemical Formula (13)

[Chem. 14]

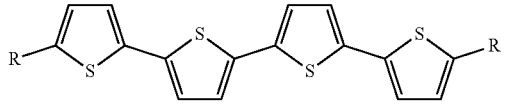

Chemical Formula (14)

[Chem. 15]

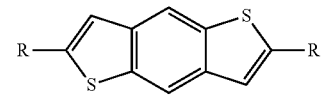

Chemical Formula (15)

-continued

[Chem. 16]

Chemical Formula (16)

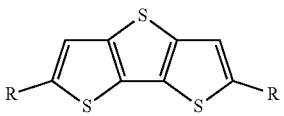

[Chem. 17]

Chemical Formula (17)

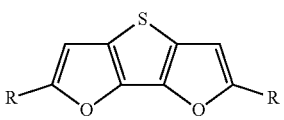

[Chem. 18]

Chemical Formula (18)

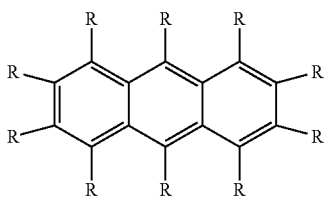

[Chem. 19]

Chemical Formula (19)

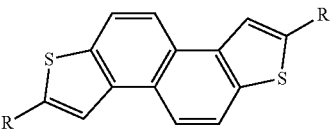

[Chem. 20]

Chemical Formula (20)

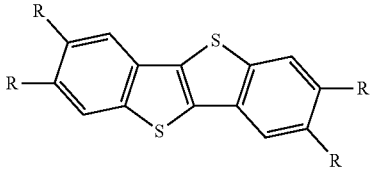

[Chem. 21]

Chemical Formula (21)

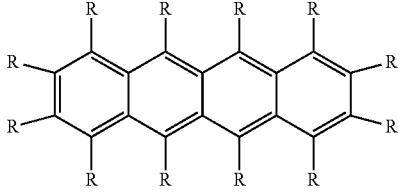

[Chem. 22]

Chemical Formula (22)

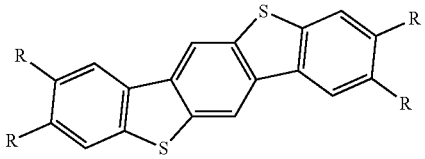

[Chem. 23]

Chemical Formula (23)

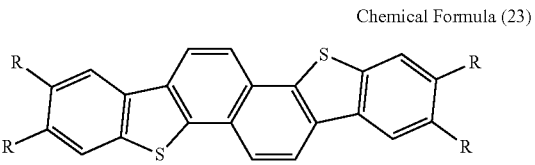

[Chem. 24]

Chemical Formula (24)

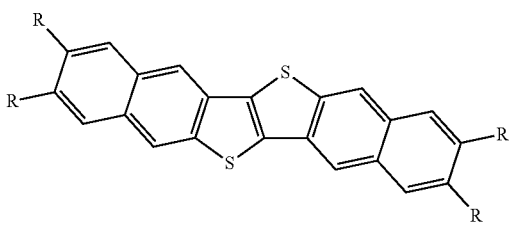

[Chem. 25]

Chemical Formula (25)

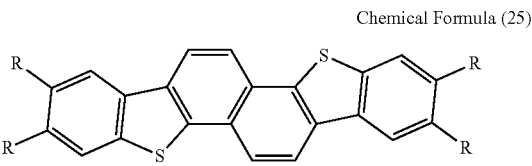

Moreover, the second organic semiconductor that satisfies the above-described first to third conditions may be a substance (26) including a naphthodichalcogenophene-based compound represented by the following chemical formula (26).

Chemical Formula (26)

[Chem. 26]

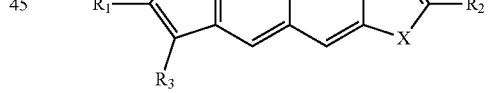

Here, X represents oxygen, sulfur, or selenium. Furthermore, at least one of R1, R2, R3, or R4 is a substituent other than hydrogen.

Examples of the substituent other than hydrogen include unsubstituted or substituted phenyl, biphenyl, terphenyl, naphthalene, phenylnaphthalene, biphenylnaphthalene, binaphthalene, thiophene, bithiophene, terthiophene, benzothiophene, phenylbenzothiophene, biphenylbenzothiophene benzofuran, phenylbenzofuran, biphenylbenzothiophene, alkanes, cycloalkanes, fluorene, and phenylfluorene.

In more detail, the substance (26) including a naphthodichalcogenophene-based compound is, for example, any of substances (27) to (44) that include a naphthodifuran derivative, a naphthonaphthodithiophene derivative, or a naphthodiselenophen derivative and are respectively represented by the following chemical formulae (27) to (44).

[Chem. 27]
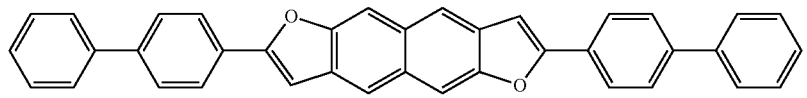
Chemical Formula (27)
[Chem. 28]
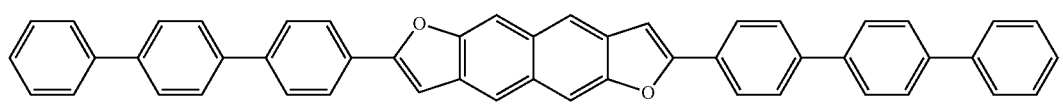
Chemical Formula (28)
[Chem. 29]
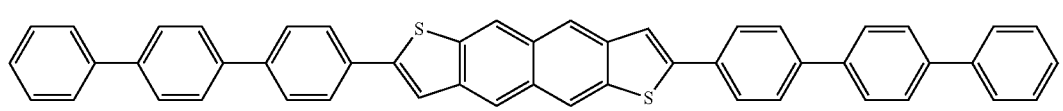
Chemical Formula (29)
[Chem. 30]
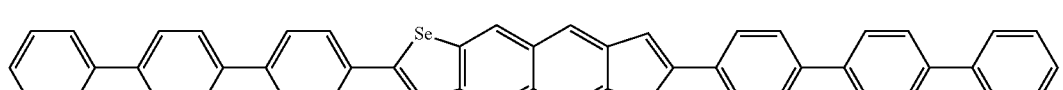
Chemical Formula (30)
[Chem. 31]
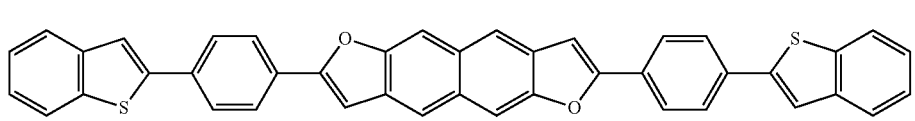
Chemical Formula (31)
[Chem. 32]
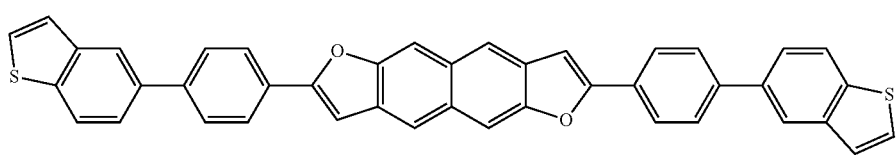
Chemical Formula (32)
[Chem. 33]
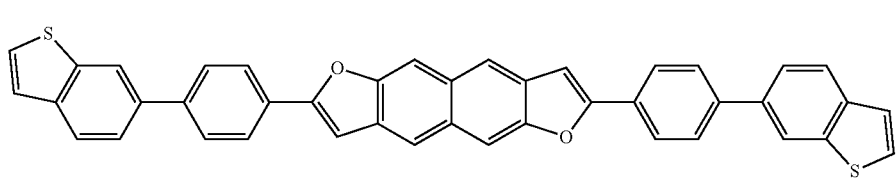
Chemical Formula (33)
[Chem. 34]
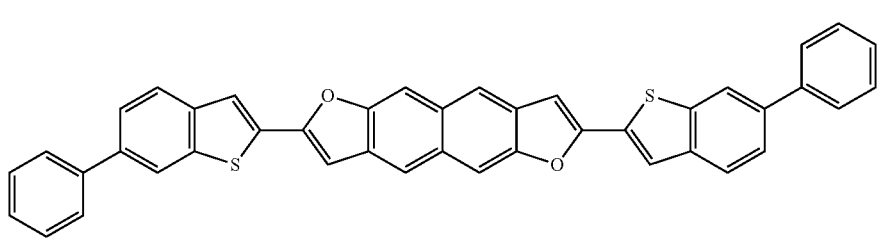
Chemical Formula (34)

[Chem. 35]
Chemical Formula (35)
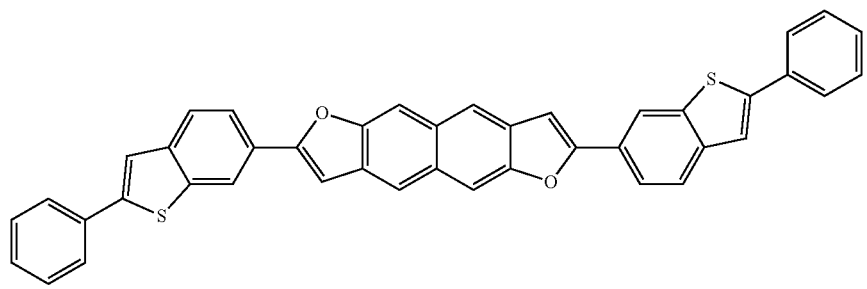
[Chem. 36]
Chemical Formula (36)
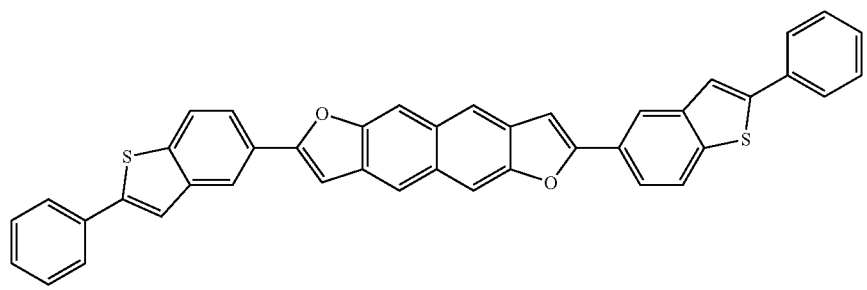
[Chem. 37]
Chemical Formula (37)
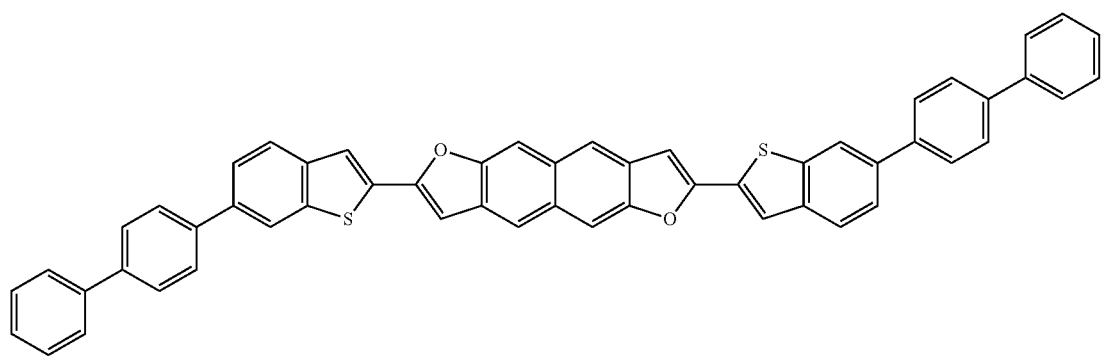
[Chem. 38]
Chemical Formula (38)
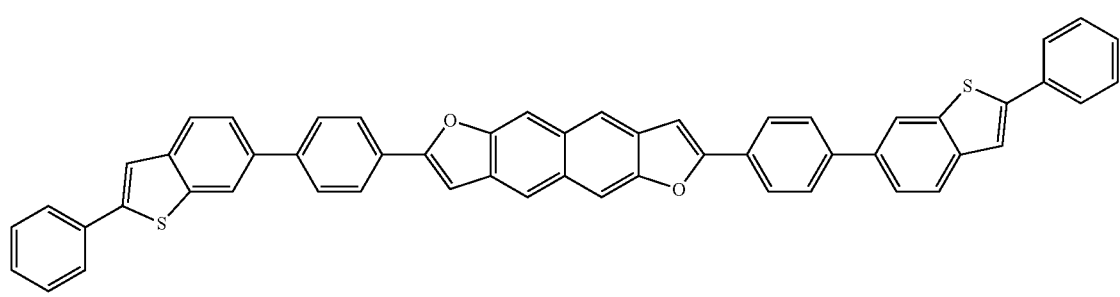

[Chem. 39]
Chemical Formula (39)
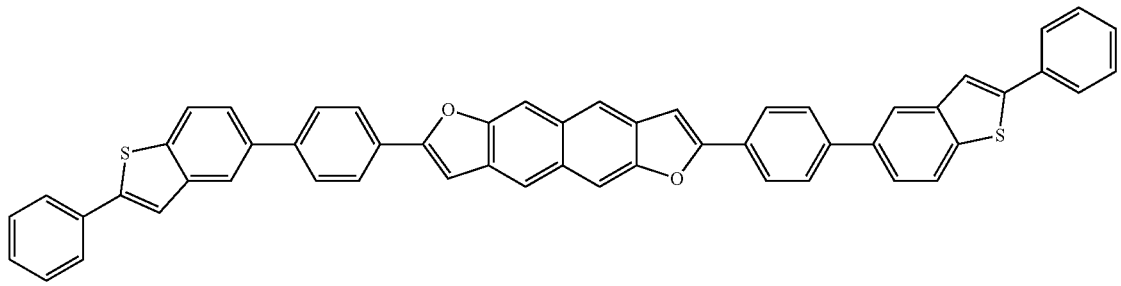
[Chem. 40]
Chemical Formula (40)
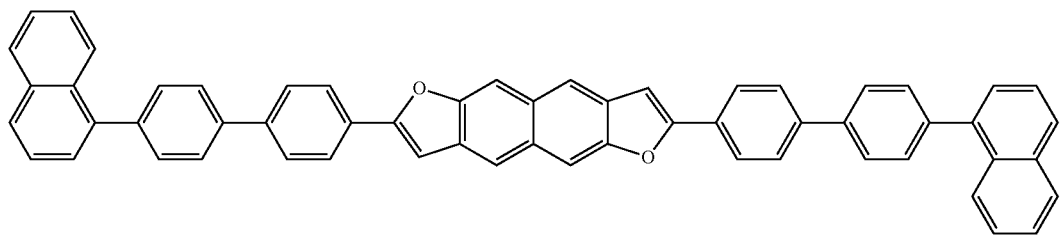
[Chem. 41]
Chemical Formula (41)
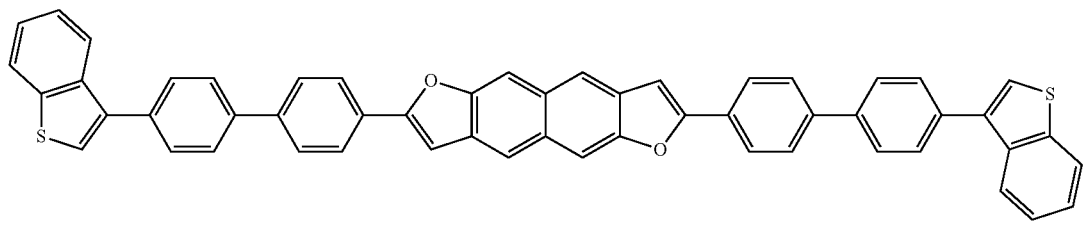
[Chem. 42]
Chemical Formula (42)
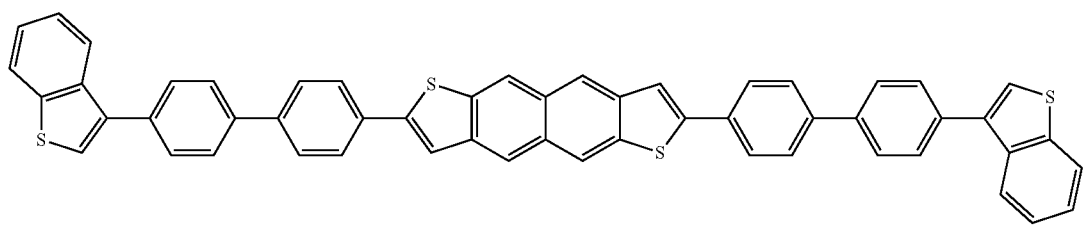
[Chem. 43]
Chemical Formula (43)
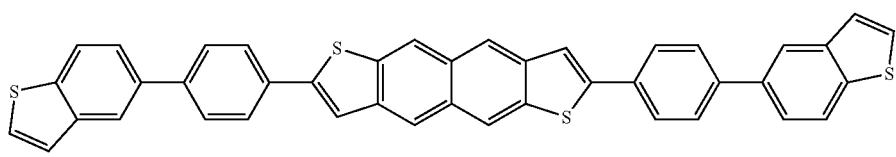

[Chem. 44]

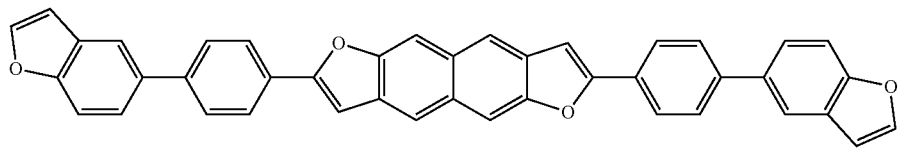

Chemical Formula (44)

The second organic semiconductor including the substance (26) represented by the chemical formula (26), such as any of the substances (27) to (44) that include a naphthodifuran derivative, a naphthonaphthodithiophene derivative, or a naphthodiselenophen derivative and are respectively represented by the chemical formulae (27) to (44), has a face-on orientation in which the major axis of a molecule is parallel to the substrate surface.

Furthermore, the second organic semiconductor including the substance (26) can be a herringbone type crystal advantageous for carrier transport, by strong intermolecular interaction due to the naphthodichalcogenophene skeleton.

Therefore, the second organic semiconductor including the substance (26) exhibits high carrier mobility in the direction perpendicular to the upper and lower electrodes, and has an excellent on/off response characteristic of photocurrent in response to the presence or absence of light irradiation.

For example, the substance (26) has a lower dark current value (jdk), higher external quantum efficiency (EQE), a shorter response time, and higher responsiveness than the substance (3) (DNTT) described above.

Furthermore, the second organic semiconductor including the substance (26) has a transition dipole moment parallel to the light incident direction (substrate surface), and therefore, can strongly absorb light having a wavelength in the range of approximately 400 nm to 550 nm.

Therefore, in a case where a solid-state imaging device includes the photoelectric conversion element, an on-chip color filter is unnecessary, and the photoelectric conversion element can be multilayered.

Furthermore, the third organic semiconductor may be other than the substance (4) (C60) as long as the third organic semiconductor is a fullerene derivative, and may be, for example, a substance (45) (C70) represented by the following chemical formula (45).

Chemical Formula (45)

[Chem. 45]

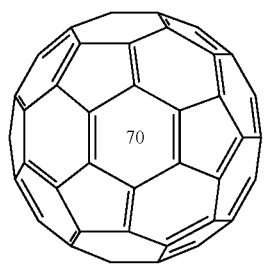

<Configuration of Solid-State Imaging Element>

Figure 9:
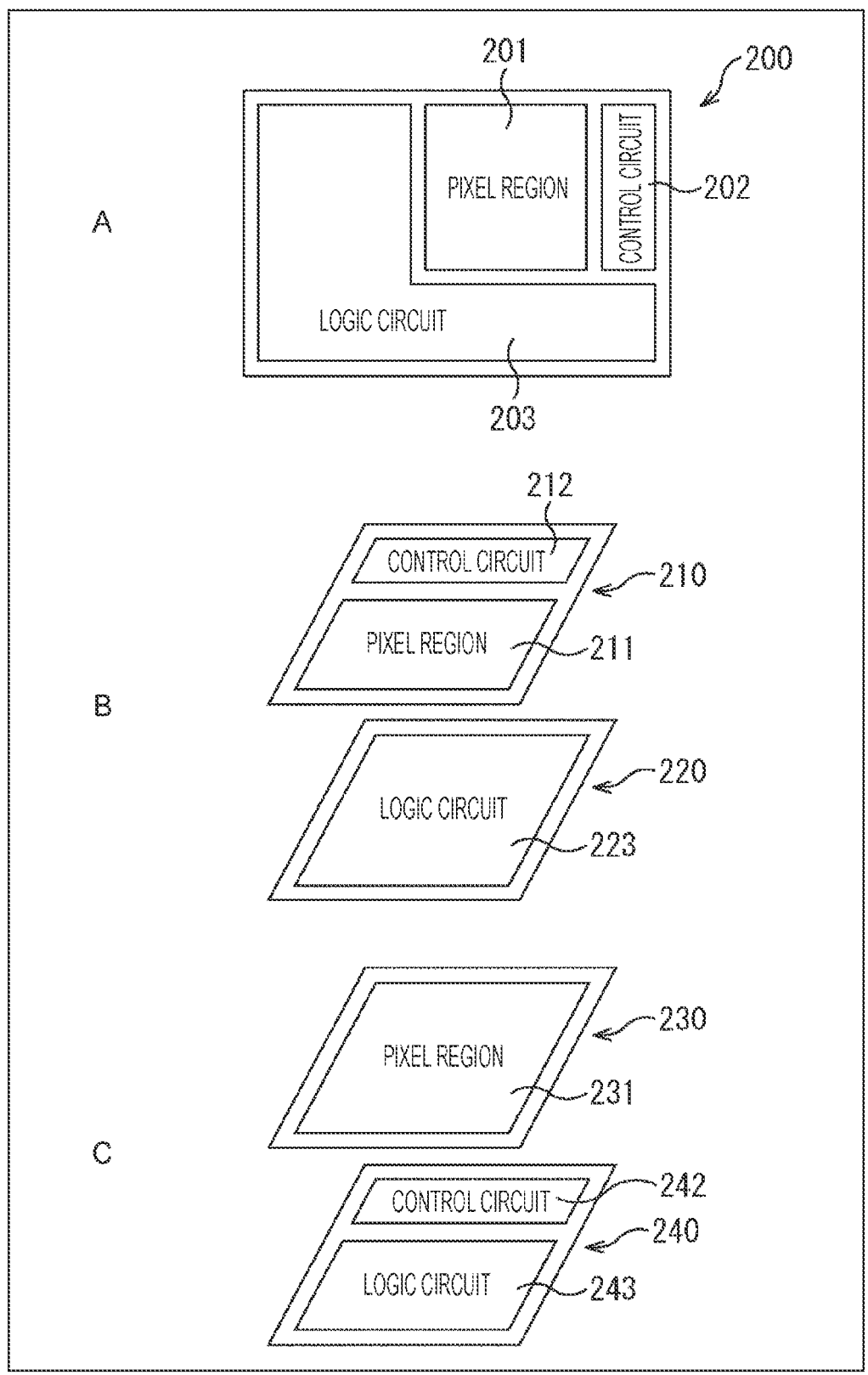
FIG. 9 is a schematic view illustrating the structure of a solid-state imaging element to which a photoelectric conversion element according to the present technology is applied.

Next, a configuration of a solid-state imaging element to which the photoelectric conversion element according to the present technology is applied will be described with reference to FIG. 9. FIG. 9 is a schematic view illustrating the structure of a solid-state imaging element to which the photoelectric conversion element according to the present technology is applied.

Here, in FIG. 9, pixel regions 201, 211, and 231 are a region in which a photoelectric conversion element including the photoelectric conversion film according to the present technology is arranged. Furthermore, control circuits 202, 212, and 242 are an arithmetic processing circuit that controls each configuration of the solid-state imaging element, and logic circuits 203, 223, and 243 are a signal processing circuit configured to process a signal photoelectrically converted by the photoelectric conversion element in the pixel region.

For example, as illustrated in the configuration A in FIG. 9, the solid-state imaging element to which the photoelectric conversion element according to the present technology is applied may include the pixel region 201, the control circuit 202, and the logic circuit 203 that are formed in one semiconductor chip 200.

Furthermore, as illustrated in the configuration B in FIG. 9, the solid-state imaging element to which the photoelectric conversion element according to the present technology is applied may be a laminated solid-state imaging element in which the pixel region 211 and the control circuit 212 are formed in a first semiconductor chip 210, and the logic circuit 223 is formed in a second semiconductor chip 220.

Moreover, as illustrated in the configuration C in FIG. 9, the solid-state imaging element to which the photoelectric conversion element according to the present technology is applied may be a laminated solid-state imaging element in which the pixel region 231 is formed in a first semiconductor chip 230, and the control circuit 242 and the logic circuit 243 are formed in a second semiconductor chip 240.

In the solid-state imaging element illustrated in the configurations B and C in FIG. 9, at least one of the control circuit or the logic circuit is formed in a semiconductor chip other than the semiconductor chip in which the pixel region is formed. Therefore, the pixel region can be larger in the solid-state imaging element illustrated in the configurations B and C in FIG. 9 than in the solid-state imaging element illustrated in the configuration A to increase the number of pixels installed in the pixel region and improve the lateral resolution. Therefore, the solid-state imaging element to which the photoelectric conversion element according to the present technology is applied is more preferably the laminated solid-state imaging element illustrated in the configurations B and C in FIG. 9.

<Configuration of Electronic Apparatus>

Figure 10:
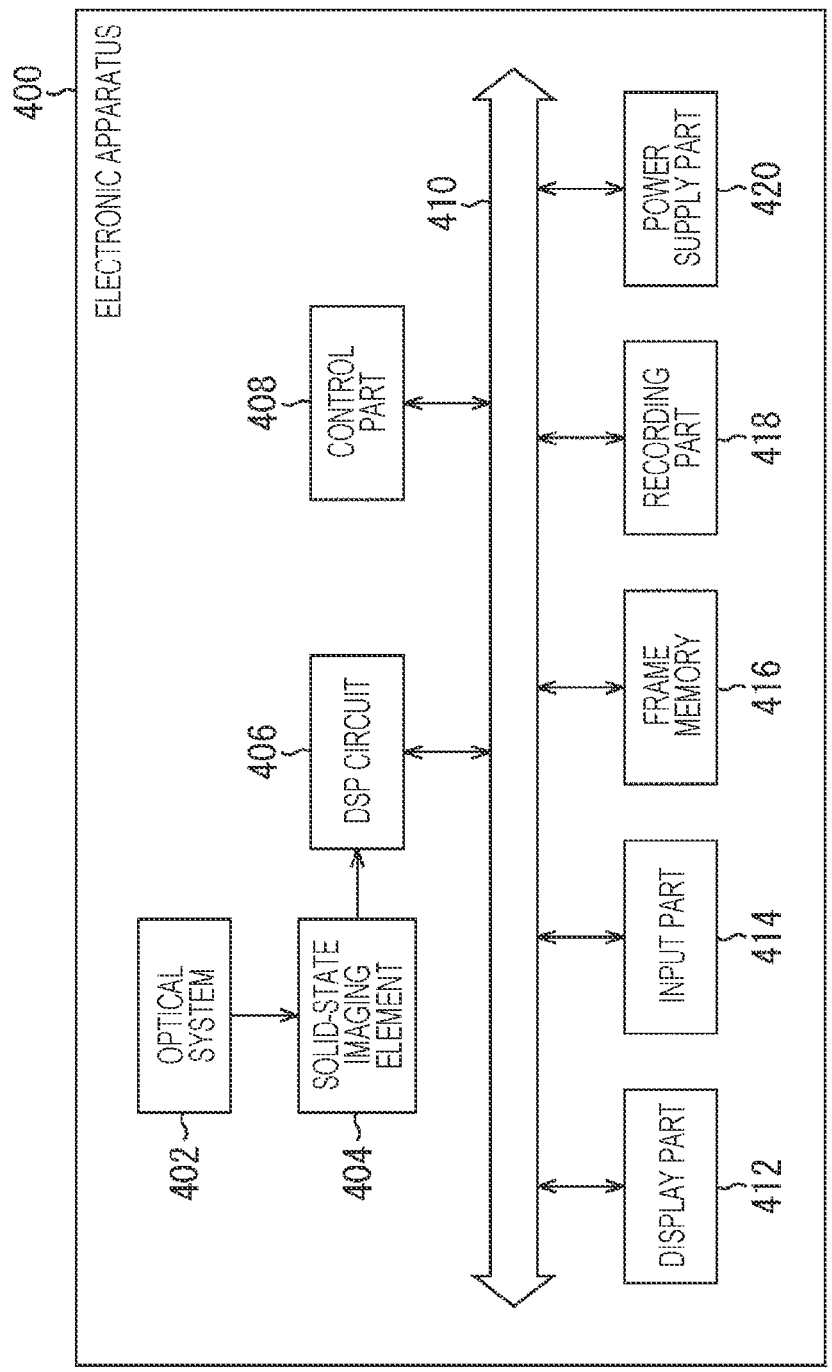
FIG. 10 is a block diagram illustrating the configuration of an electronic apparatus to which a photoelectric conversion element according to the present technology is applied.

Next, a configuration of an electronic apparatus to which the photoelectric conversion element according to the present technology is applied will be described with reference to FIG. 10. FIG. 10 is a block diagram illustrating the configuration of an electronic apparatus to which the photoelectric conversion element according to the present technology is applied.

As illustrated in FIG. 10, an electronic apparatus 400 includes an optical system 402, a solid-state imaging element 404, a digital signal processor (DSP) circuit 406, a control part 408, an output part 412, an input part 414, a frame memory 416, a recording part 418, and a power supply part 420.

Here, the DSP circuit 406, the control part 408, the output part 412, the input part 414, the frame memory 416, the recording part 418, and the power supply part 420 are connected to each other via a bus line 410.

Incident light from a subject enters the optical system 402, and the optical system 402 forms an image of the incident light on the imaging surface of the solid-state imaging element 404. Furthermore, the solid-state imaging element 404 includes the photoelectric conversion element according to the present technology. The solid-state imaging element 404 converts the amount of incident light formed as the image on the imaging surface by the optical system 402 into an electric signal in units of pixels and outputs the electric signal as a pixel signal.

The DSP circuit 406 processes the pixel signal transferred from the solid-state imaging element 404 and outputs the processed signal to the output part 412, the frame memory 416, the recording part 418, and the like. Furthermore, the control part 408 includes, for example, an arithmetic processing circuit and the like, and controls the operation of each configuration of the electronic apparatus 400.

The output part 412 is, for example, a panel display device such as a liquid crystal display or an organic electroluminescence display, and displays a moving image or a still image captured by the solid-state imaging element 404. Note that the output part 412 may include an audio output device such as a speaker or a headphone. Furthermore, the input part 414 is a device for a user to input an operation, such as a touch panel or a button, and issues an operation command for various functions of the electronic apparatus 400 according to the user's operation.

The frame memory 416 temporarily stores the moving image, the still image, or the like captured by the solid-state imaging element 404. Furthermore, the recording part 418 records the moving image, the still image, or the like captured by the solid-state imaging element 404 on a removable storage medium such as a magnetic disk, an optical disk, a magneto-optical disk, or a semiconductor memory.

The power supply part 420 appropriately supplies various power sources serving as operation power sources of the DSP circuit 406, the control part 408, the output part 412, the input part 414, the frame memory 416, and the recording part 418 to these supply targets.

The electronic apparatus 400 to which the photoelectric conversion element according to the present technology is applied has been described above. The electronic apparatus 400 to which the photoelectric conversion element according to the present technology is applied may be, for example, an imaging device.

Furthermore, although the solid-state imaging element and the electronic apparatus to which the photoelectric conversion element according to the present technology is applied have been described above, the photoelectric conversion element can also be applied to another technology, and for example, can also be applied as a sensor in which a solar cell or light is used.

An embodiment of the present technology has been described above in detail with reference to the accompanying drawings, but the technical scope of the present technology is not limited to the above-described examples. It is obvious that a person having ordinary knowledge in the technical field of the present technology can conceive various changes or modifications within the scope of the technical concept described in the claims, and it is naturally understood that these changes or modifications also belong to the technical scope of the present technology.

Furthermore, the effects described in the present description are merely illustrative or exemplary, and are not restrictive. That is, the present technology can exhibit another effect obvious to those skilled in the art from the description in the present description together with or instead of the above-described effects.

Application Example to Endoscopic Surgical System

The technology according to the present disclosure (present technology) can be applied to various products. For example, the technology according to the present disclosure may be applied to an endoscopic surgical system.

Figure 11:
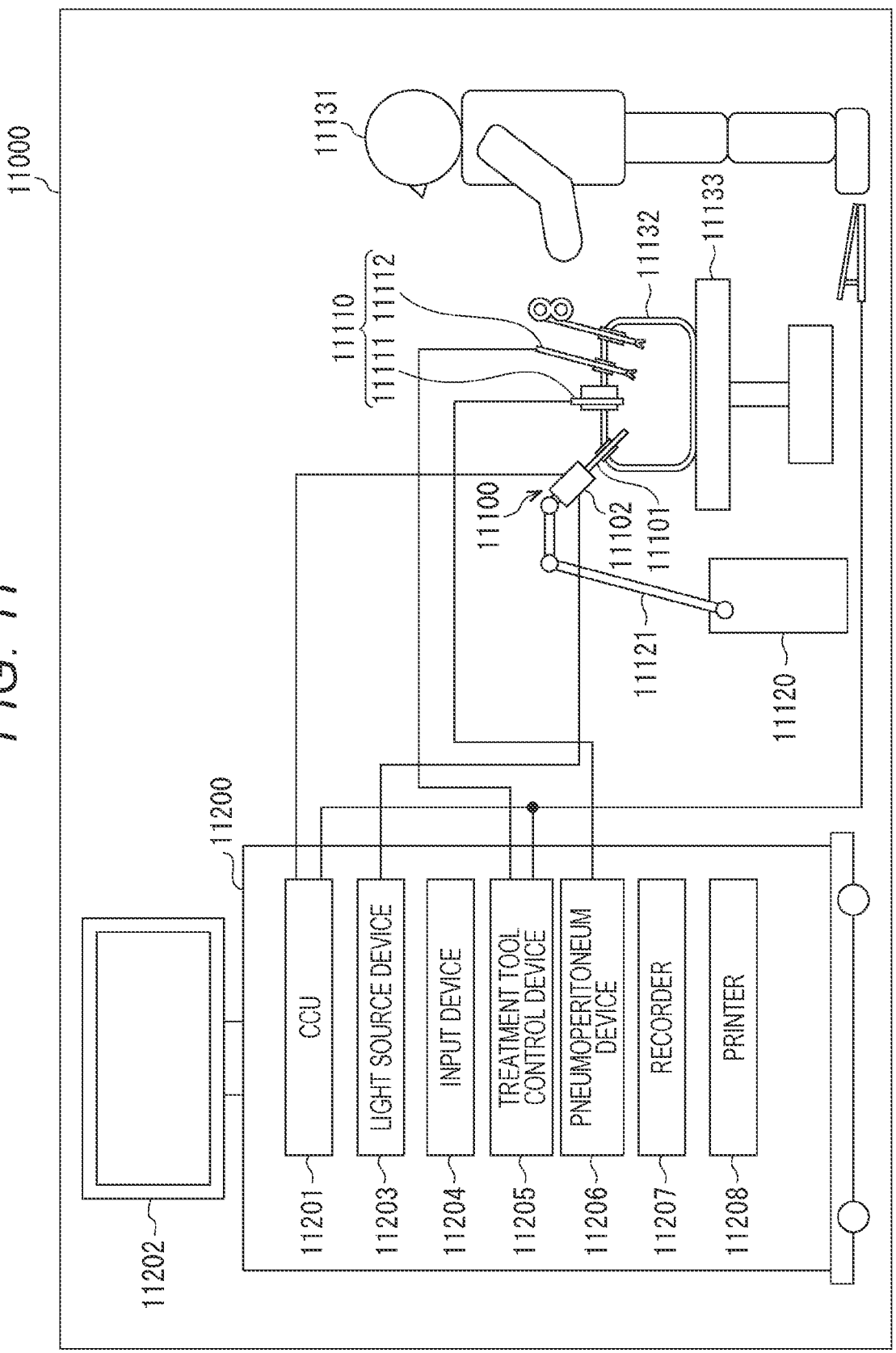
FIG. 11 is a view illustrating an example of the schematic configuration of an endoscopic surgical system.

FIG. 11 is a view illustrating an example of the schematic configuration of an endoscopic surgical system to which the technology according to the present disclosure (the present technology) can be applied.

FIG. 11 illustrates a state in which an operator (doctor) 11131 is performing surgery on a patient 11132 on a patient bed 11133 using an endoscopic surgical system 11000. As illustrated, the endoscopic surgical system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are installed.

The endoscope 11100 includes a lens barrel 11101 in which a region of a predetermined length from the distal end is inserted into the body cavity of the patient 11132, and includes a camera head 11102 connected to the proximal end of the lens barrel 11101. In the illustrated example, the endoscope 11100 is illustrated that is configured as a so-called rigid scope having the rigid lens barrel 11101, but the endoscope 11100 may be configured as a so-called flexible scope having a flexible lens barrel.

The distal end of the lens barrel 11101 is provided with an opening into which an objective lens is fitted. To the endoscope 11100, a light source device 11203 is connected, and light generated by the light source device 11203 is guided to the distal end of the lens barrel 11101 by a light guide extending inside the lens barrel 11101, and is emitted toward an observation target in the body cavity of the patient 11132 via the objective lens. Note that the endoscope 11100 may be a forward-viewing endoscope, an oblique-viewing endoscope, or a side-viewing endoscope.

The camera head 11102 is provided with an optical system and an imaging element inside, and reflected light (observation light) from the observation target is condensed on the imaging element by the optical system. The imaging element photoelectrically converts the observation light, and thus, an electric signal corresponding to the observation light, that is, an image signal corresponding to the observation image is generated. The image signal is transmitted to a camera control unit (CCU) 11201 in the form of RAW data.

The CCU 11201 includes a central processing unit (CPU), a graphics processing unit (GPU), and the like, and integrally controls the operation of the endoscope 11100 and a display device 11202. Moreover, the CCU 11201 receives the image signal from the camera head 11102, and performs various image processing to display of an image based on the image signal, such as development processing (demosaic processing), on the image signal.

In response to the control of the CCU 11201, the display device 11202 displays an image based on the image signal subjected to the image processing by the CCU 11201.

The light source device 11203 includes a light source such as a light emitting diode (LED), and supplies the endoscope 11100 with irradiation light at the time of imaging a surgical site or the like.

An input device 11204 is an input interface for the endoscopic surgical system 11000. The user can input various information and instructions to the endoscopic surgical system 11000 via the input device 11204. For example, the user inputs an instruction or the like to change an imaging condition (such as the type of irradiation light, the magnification, or the focal length) of the endoscope 11100.

A treatment tool control device 11205 controls driving of the energy treatment tool 11112 for cauterization and incision of tissue, sealing of a blood vessel, and the like. A pneumoperitoneum device 11206 feeds gas into the body cavity of the patient 11132 via the pneumoperitoneum tube 11111 in order to inflate the body cavity of the patient 11132 for the purpose of securing the visual field of the endoscope 11100 and securing the working space of the operator. A recorder 11207 is a device capable of recording various information regarding surgery. A printer 11208 is a device capable of printing various information regarding surgery in various formats such as text, image, and graph formats.

Note that the light source device 11203 that supplies the endoscope 11100 with irradiation light at the time of imaging the surgical site can include, for example, an LED, a laser light source, or a white light source including an LED and a laser light source in combination. In a case where the white light source includes RGB laser light sources in combination, the output intensity and the output timing of each color (at each wavelength) can be controlled with high accuracy, and therefore, the white balance of the captured image can be adjusted in the light source device 11203. Furthermore, in this case, it is also possible to capture an image corresponding to each of RGB in a time division manner by irradiating the observation target with laser light from each of the RGB laser light sources in a time division manner and controlling the driving of the imaging element of the camera head 11102 in synchronization with the irradiation timing. According to this method, a color image can be obtained without providing a color filter for the imaging element.

Furthermore, the driving of the light source device 11203 may be controlled so as to change the output light intensity every predetermined time. It is possible to generate an image of a high dynamic range, without so-called underexposure and overexposure, by controlling the driving of the imaging element of the camera head 11102 in synchronization with the timing of the change of the light intensity to acquire images in a time division manner and synthesizing the images.

Furthermore, the light source device 11203 may be configured to be capable of supplying light in a predetermined wavelength band for special light observation. In the special light observation, so-called narrow band imaging is performed in which, using, for example, the wavelength dependency of light absorption in a body tissue, a predetermined tissue such as a blood vessel in a mucosal surface layer is irradiated with light in a narrower band than irradiation light at the time of normal observation (that is, white light) to be imaged with high contrast. Alternatively, in the special light observation, fluorescence observation may be performed in which an image is obtained using fluorescence generated by irradiation with excitation light. In the fluorescence observation, it is possible, for example, to irradiate a body tissue with excitation light and observe the fluorescence from the body tissue (autofluorescence observation), or to locally inject a reagent such as indocyanine green (ICG) into a body tissue and irradiate the body tissue with excitation light corresponding to the fluorescence wavelength of the reagent to obtain a fluorescence image. The light source device 11203 can be configured to be capable of supplying narrow band light and/or excitation light for such special light observation.

Figure 12:
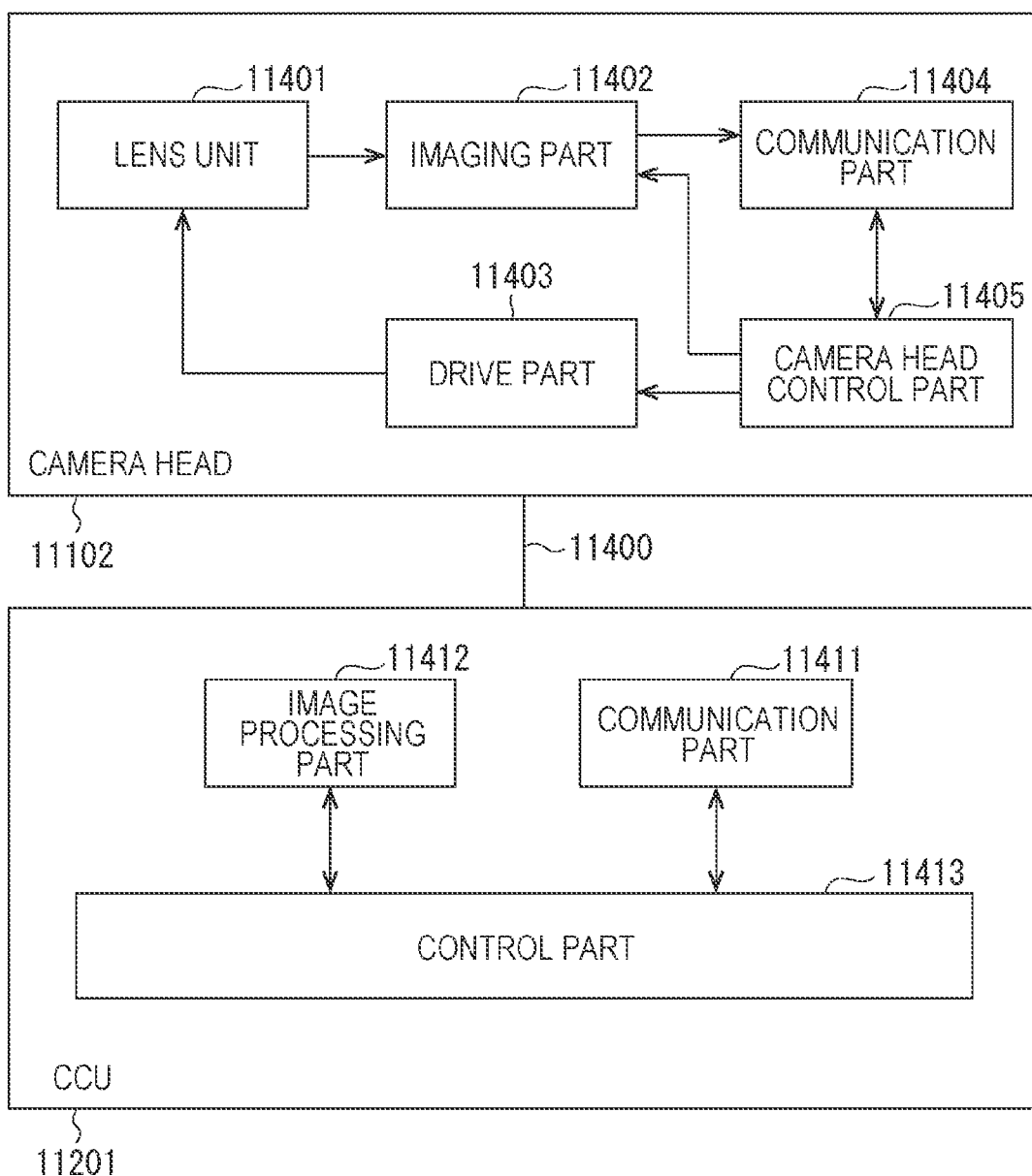
FIG. 12 is a block diagram illustrating an example of the functional configuration of a camera head and a camera control unit (CCU).

FIG. 12 is a block diagram illustrating an example of the functional configuration of the camera head 11102 and the CCU 11201 illustrated in FIG. 11.

The camera head 11102 includes a lens unit 11401, an imaging part 11402, a drive part 11403, a communication part 11404, and a camera head control part 11405. The CCU 11201 includes a communication part 11411, an image processing part 11412, and a control part 11413. The camera head 11102 and the CCU 11201 are communicably connected to each other via a transmission cable 11400.

The lens unit 11401 is an optical system provided at a connection portion with the lens barrel 11101. Observation light taken in from the distal end of the lens barrel 11101 is guided to the camera head 11102 and enters the lens unit 11401. The lens unit 11401 includes a plurality of lenses including a zoom lens and a focus lens in combination.

The imaging part 11402 includes an imaging element. The imaging part 11402 may include one imaging element (may be a so-called single-plate imaging part) or may include a plurality of imaging elements (may be a so-called multi-plate imaging part). In a case where the imaging part 11402 is a multi-plate imaging part, for example, the imaging elements may generate image signals corresponding to RGB respectively, and the image signals may be synthesized to obtain a color image. Alternatively, the imaging part 11402 may include a pair of imaging elements that are respectively configured to acquire right-eye and left-eye image signals for three-dimensional (3D) display. By performing 3D display, the operator 11131 can further accurately grasp the depth of the living tissue in the surgical site. Note that, in a case where the imaging part 11402 is a multi-plate imaging part, a plurality of lens units 11401 can be provided correspondingly to the imaging elements respectively.

Furthermore, the imaging part 11402 is not necessarily required to be provided for the camera head 11102. For example, the imaging part 11402 may be provided inside the lens barrel 11101 immediately after the objective lens.

The drive part 11403 includes an actuator, and moves the zoom lens and the focus lens of the lens unit 11401 by a predetermined distance along the optical axis in response to the control of the camera head control part 11405. Thus, the magnification and the focus of the image captured by the imaging part 11402 can be appropriately adjusted.

The communication part 11404 includes a communication device configured to transmit and receive various information to and from the CCU 11201. The communication part 11404 obtains the image signal from the imaging part 11402, and transmits the image signal to the CCU 11201 in the form of RAW data via the transmission cable 11400.

Furthermore, the communication part 11404 receives a control signal for control of driving of the camera head 11102 from the CCU 11201, and supplies the control signal to the camera head control part 11405. The control signal includes information regarding the imaging condition, such as information specifying the frame rate of a captured image, information specifying the exposure value at the time of imaging, and/or information specifying the magnification and the focus of a captured image.

Note that the above-described imaging conditions such as the frame rate, the exposure value, the magnification, and the focus may be appropriately specified by the user, or may be automatically set by the control part 11413 of the CCU 11201 on the basis of the acquired image signal. In the latter case, a so-called auto exposure (AE) function, an auto focus (AF) function, and an auto white balance (AWB) function are installed in the endoscope 11100.

The camera head control part 11405 receives the control signal from the CCU 11201 via the communication part 11404, and controls driving of the camera head 11102 on the basis of the control signal.

The communication part 11411 includes a communication device configured to transmit and receive various information to and from the camera head 11102. The communication part 11411 receives an image signal transmitted from the camera head 11102 via the transmission cable 11400.

Furthermore, the communication part 11411 transmits a control signal for control of driving of the camera head 11102 to the camera head 11102. The image signal and the control signal can be transmitted by electric communication, optical communication, or the like.

The image processing part 11412 performs various image processing on the image signal in the form of RAW data transmitted from the camera head 11102.

The control part 11413 performs various control related to imaging of a surgical site or the like by the endoscope 11100 and to display of a captured image obtained by imaging of the surgical site or the like. For example, the control part 11413 generates a control signal for control of driving of the camera head 11102.

Furthermore, the control part 11413 performs control so that the display device 11202 displays a captured image of a surgical site or the like on the basis of the image signal subjected to image processing by the image processing part 11412. At this time, the control part 11413 may recognize various objects in the captured image using various image recognition technologies. For example, the control part 11413 can recognize a surgical tool such as forceps, a specific site of the living body, bleeding, mist at the time of using the energy treatment tool 11112, and the like by detecting the shape of the edge, color, and the like of the object in the captured image. The control part 11413 may perform control using the recognition result so that when the display device 11202 displays the captured image, various surgery support information is superimposed on the image of the surgical site and displayed. The superimposed display of the surgery support information to the operator 11131 leads to reduction in the burden on the operator 11131 and reliable surgery operation by the operator 11131.

The transmission cable 11400 connecting the camera head 11102 and the CCU 11201 is an electric signal cable for electric signal communication, an optical fiber for optical communication, or a composite cable thereof.

Here, in the illustrated example, communication is performed by wire using the transmission cable 11400, but communication between the camera head 11102 and the CCU 11201 may be performed by wireless.

An example of the endoscopic surgical system to which the technology according to the present disclosure can be applied has been described above. The technology according to the present disclosure can be applied to the endoscope 11100 and the imaging part 11402 of the camera head 11102 among the above-described configurations. Specifically, the solid-state imaging element 11 in FIGS. 2 and 3 can be applied to an imaging part 10402. By applying the technology according to the present disclosure to the imaging part 10402, it is possible to realize photoelectric conversion of blue light with high efficiency.

Note that, here, the endoscopic surgical system has been described as an example, but the technology according to the present disclosure may be applied to another system such as a microscopic surgical system.

Application Example to Mobile Body

The technology according to the present disclosure (present technology) can be applied to various products. For example, the technology according to the present disclosure may be realized as a device installed in any kind of mobile body such as an automobile, an electric vehicle, a hybrid electric vehicle, a motorcycle, a bicycle, a personal mobility, an airplane, a drone, a ship, or a robot.

Figure 13:
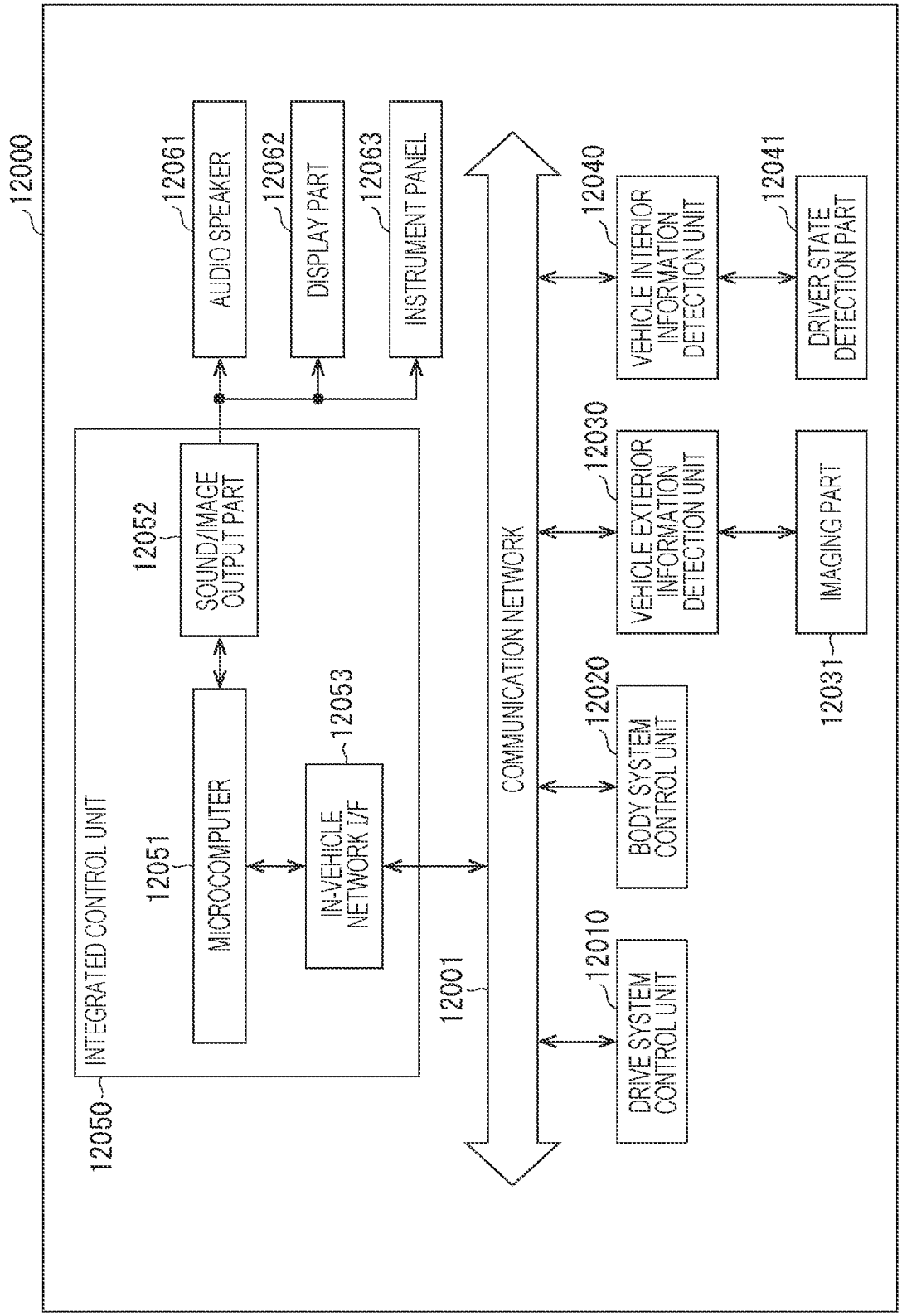
FIG. 13 is a block diagram illustrating an example of the schematic configuration of a vehicle control system.

FIG. 13 is a block diagram illustrating a schematic configuration example of a vehicle control system as an example of a mobile body control system to which the technology according to the present disclosure can be applied.

A vehicle control system 12000 includes a plurality of electronic control units connected via a communication network 12001. In the example illustrated in FIG. 13, the vehicle control system 12000 includes a drive system control unit 12010, a body system control unit 12020, a vehicle exterior information detection unit 12030, a vehicle interior information detection unit 12040, and an integrated control unit 12050. Furthermore, a microcomputer 12051, a sound/image output part 12052, and an in-vehicle network interface (I/F) 12053 are illustrated as the functional configuration of the integrated control unit 12050.

The drive system control unit 12010 controls the operation of devices related to the drive system of the vehicle according to various programs. For example, the drive system control unit 12010 functions as a control device of a driving force generation device configured to generate driving force of the vehicle, such as an internal combustion engine or a driving motor, a driving force transmission mechanism configured to transmit driving force to wheels, a steering mechanism configured to adjust the steering angle of the vehicle, a braking device configured to generate braking force of the vehicle, and the like.

The body system control unit 12020 controls the operation of various devices mounted on the vehicle body according to various programs. For example, the body system control unit 12020 functions as a control device of a keyless entry system, a smart key system, a power window device, or various lamps such as a headlamp, a back lamp, a brake lamp, a blinker, and a fog lamp. In this case, a radio wave transmitted from a portable device that substitutes for a key or signals of various switches can be input to the body system control unit 12020. The body system control unit 12020 receives the input of the radio wave or the signals, and controls the door lock device, the power window device, the lamp, and the like of the vehicle.

The vehicle exterior information detection unit 12030 detects information outside the vehicle in which the vehicle control system 12000 is installed. For example, an imaging part 12031 is connected to the vehicle exterior information detection unit 12030. The vehicle exterior information detection unit 12030 makes the imaging part 12031 capture an image outside the vehicle, and receives the captured image. The vehicle exterior information detection unit 12030 may perform object detection processing or distance detection processing for a target such as a person, a vehicle, an obstacle, a sign, or a character on a road surface on the basis of the received image.

The imaging part 12031 is an optical sensor that receives light and outputs an electric signal according to the amount of the received light. The imaging part 12031 can output the electric signal as an image or distance measurement information. Furthermore, the light received by the imaging part 12031 may be visible light or invisible light such as infrared rays.

The vehicle interior information detection unit 12040 detects information inside the vehicle. For example, a driver state detection part 12041 that detects the state of a driver is connected to the vehicle interior information detection unit 12040. The driver state detection part 12041 includes, for example, a camera that images a driver, and the vehicle interior information detection unit 12040 may calculate the degree of fatigue or the degree of concentration of the driver or may determine whether or not the driver is dozing off on the basis of the detected information input from the driver state detection part 12041.

The microcomputer 12051 can calculate the control target value of the driving force generation device, the steering mechanism, or the braking device on the basis of the information inside and outside the vehicle acquired by the vehicle exterior information detection unit 12030 or the vehicle interior information detection unit 12040, and can output a control command to the drive system control unit 12010. For example, the microcomputer 12051 can perform cooperative control for the purpose of realizing functions of an advanced driver assistance system (ADAS) that include collision avoidance or impact mitigation of the vehicle, following traveling based on the following distance, traveling while maintaining the vehicle speed, vehicle collision warning, vehicle lane departure warning, and the like.

Furthermore, the microcomputer 12051 controls the driving force generation device, the steering mechanism, the braking device, or the like on the basis of the information around the vehicle acquired by the vehicle exterior information detection unit 12030 or the vehicle interior information detection unit 12040, and thus can perform cooperative control for the purpose of automatic driving or the like in which the vehicle autonomously travels without operation by the driver.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam by controlling the headlamp according to the position of the preceding vehicle or the oncoming vehicle detected by the vehicle exterior information detection unit 12030.

The sound/image output part 12052 transmits an output signal of at least one of a sound or an image to an output device capable of visually or audibly notifying a vehicle occupant or a person outside the vehicle of information. In the example in FIG. 13, an audio speaker 12061, a display part 12062, and an instrument panel 12063 are illustrated as the output device. The display part 12062 may include, for example, at least one of an on-board display or a head-up display.

Figure 14:
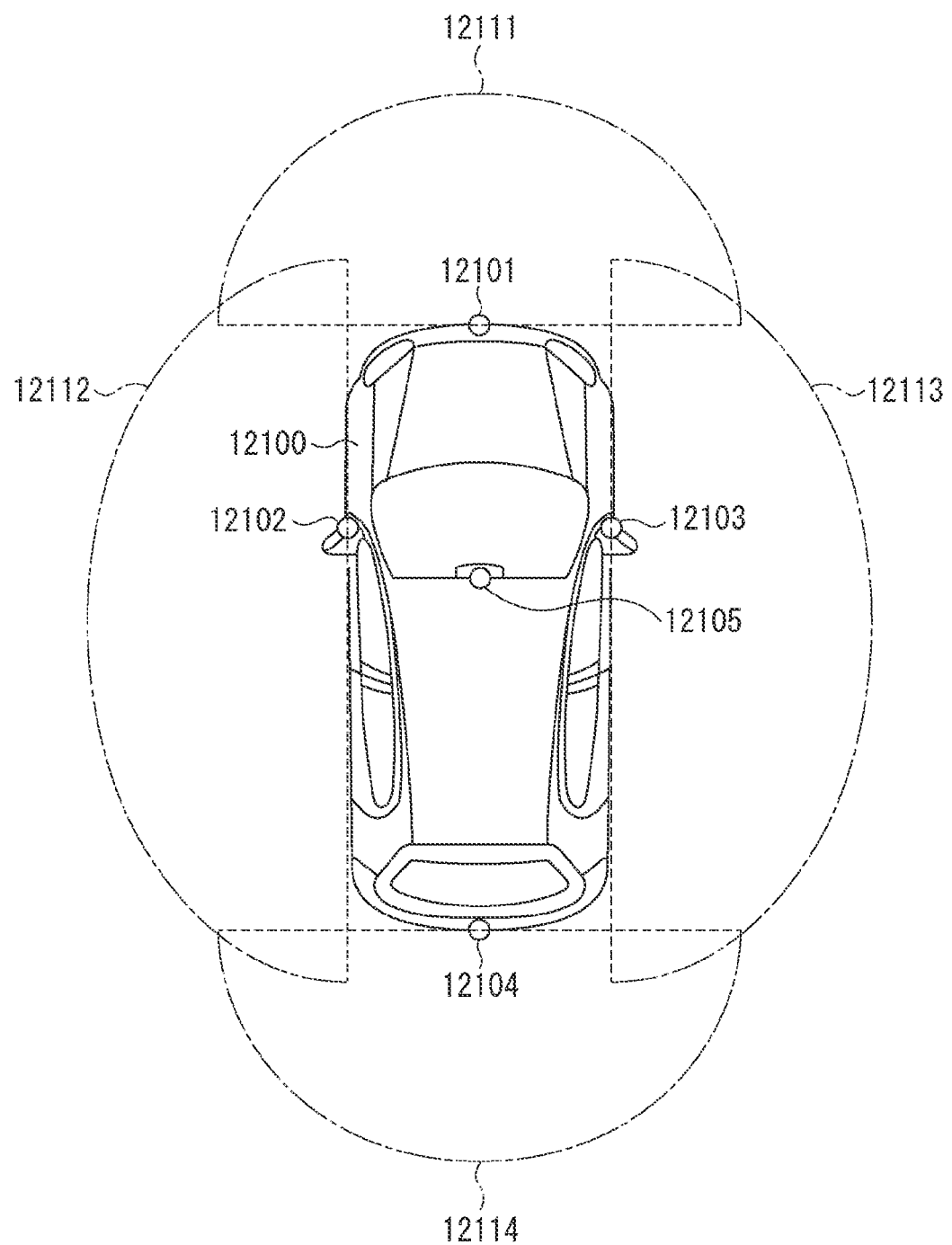
FIG. 14 is an explanatory view illustrating an example of the installation positions of a vehicle exterior information detection part and imaging parts.

FIG. 14 is a view illustrating an example of the installation position of the imaging part 12031.

In FIG. 14, a vehicle 12100 includes imaging parts 12101, 12102, 12103, 12104, and 12105 as the imaging part 12031.

The imaging parts 12101, 12102, 12103, 12104, and 12105 are provided, for example, at positions such as the front nose, the side mirrors, the rear bumper, the back door, and the upper part of the windshield in the interior of the vehicle 12100. The imaging part 12101 provided at the front nose and the imaging part 12105 provided at the upper part of the windshield in the interior of the vehicle mainly acquire images in front of the vehicle 12100. The imaging parts 12102 and 12103 provided at the side mirrors mainly acquire images sideward from the vehicle 12100. The imaging part 12104 provided at the rear bumper or the back door mainly acquires an image behind the vehicle 12100. The images in front of the vehicle that are acquired by the imaging parts 12101 and 12105 are mainly used for detecting a preceding vehicle, a pedestrian, an obstacle, a traffic light, a traffic sign, a lane, or the like.

Note that FIG. 14 illustrates an example of the imaging ranges of the imaging parts 12101 to 12104. An imaging range 12111 indicates the imaging range of the imaging part 12101 provided at the front nose, imaging ranges 12112 and 12113 respectively indicate the imaging ranges of the imaging parts 12102 and 12103 provided at the side mirrors, and an imaging range 12114 indicates the imaging range of the imaging part 12104 provided at the rear bumper or the back door. For example, it is possible to obtain an overhead view image of the vehicle 12100 viewed from above by superimposing image data captured by the imaging parts 12101 to 12104.

At least one of the imaging part 12101, 12102, 12103, or 12104 may have a function of acquiring distance information. For example, at least one of the imaging part 12101, 12102, 12103, or 12104 may be a stereo camera including a plurality of imaging elements, or may be an imaging element having a pixel for phase difference detection.

For example, the microcomputer 12051 obtains the distance to each three-dimensional object in the imaging ranges 12111 to 12114 and the temporal change of the distance (relative speed with respect to the vehicle 12100) on the basis of the distance information obtained from the imaging parts 12101 to 12104, and thus can extract, as a preceding vehicle, a three-dimensional object that is, in particular, the closest to the vehicle 12100 on the traveling path of the vehicle 12100 and is traveling at a predetermined speed (of, for example, 0 km/h or more) in substantially the same direction as the vehicle 12100. Moreover, the microcomputer 12051 can set, in advance, a following distance to be secured behind the preceding vehicle, and can perform automatic brake control (including following stop control), automatic acceleration control (including following start control), and the like. As described above, it is possible to perform cooperative control for the purpose of automatic driving or the like in which the vehicle autonomously travels without operation by the driver.

For example, the microcomputer 12051 can extract three-dimensional object data regarding three-dimensional objects in a state of being classified into a two-wheeled vehicle, an ordinary vehicle, a large vehicle, a pedestrian, and another three-dimensional object such as an utility pole on the basis of the distance information obtained from the imaging parts 12101 to 12104, and can use the three-dimensional object data for automatic obstacle avoidance. For example, the microcomputer 12051 identifies an obstacle around the vehicle 12100 as an obstacle that can be visually recognized by the driver of the vehicle 12100 or as an obstacle that is difficult to visually recognize. Then, the microcomputer 12051 determines the collision risk indicating a risk of collision with each obstacle, and when the collision risk is a set value or more and there is a possibility of collision, the microcomputer 12051 can perform driving assistance for collision avoidance by outputting an alarm to the driver via the audio speaker 12061 or the display part 12062 or performing forced deceleration or avoidance steering via the drive system control unit 12010.

At least one of the imaging part 12101, 12102, 12103, or 12104 may be an infrared camera that detects infrared rays. For example, the microcomputer 12051 can recognize a pedestrian by determining whether or not a pedestrian is present in the images captured by the imaging parts 12101 to 12104. Such recognition of a pedestrian is performed by, for example, a procedure of extracting feature points in the images captured by the imaging parts 12101 to 12104 as infrared cameras, and a procedure of performing pattern matching processing on a series of feature points indicating the outline of an object to determine whether or not the object is a pedestrian. When the microcomputer 12051 determines that a pedestrian is present in the images captured by the imaging parts 12101 to 12104 and recognizes the pedestrian, the sound/image output part 12052 controls the display part 12062 so that a rectangular outline is superimposed on the image of the recognized pedestrian and displayed for emphasis. Furthermore, the sound/image output part 12052 may control the display part 12062 so that an icon or the like indicating the pedestrian is displayed at a desired position.

An example of the vehicle control system to which the technology according to the present disclosure can be applied has been described above. The technology according to the present disclosure can be applied to the imaging part 12031 among the above-described configurations. Specifically, the solid-state imaging element 11 in FIGS. 2 and 3 can be applied to the imaging part 12031. By applying the technology according to the present disclosure to the imaging part 12031, it is possible to realize photoelectric conversion of blue light with high efficiency.

Note that the present technology can also have the following configurations.

<1> A solid-state imaging element including
an organic photoelectric conversion element including at least two electrodes, in which
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative.

<2> The solid-state imaging element according to the item <1>, in which
the organic photoelectric conversion layer strongly absorbs blue light that is light in a wavelength band in the vicinity of 400 to 500 nm, and weakly absorbs green light that is light in a wavelength band in the vicinity of 500 to 600 nm and red light that is light in a wavelength band in the vicinity of 600 to 700 nm.

<3> The solid-state imaging element according to the item <2>, in which
the organic photoelectric conversion layer has an absorption coefficient of the blue light of more than 40,000 $cm^{-1}$, an absorption rate of the blue light of more than 80%, an absorption coefficient of the green light and the red light of less than 10,000 $cm^{-1}$, and an absorption rate of the green light and the red light of less than 20%.

<4> The solid-state imaging element according to any one of the items <1> to <3>, in which
the first organic semiconductor strongly absorbs blue light that is light in a wavelength band in the vicinity of 400 to 500 nm, and weakly absorbs green light that is light in a wavelength band in the vicinity of 500 to 600 nm and red light that is light in a wavelength band in the vicinity of 600 to 700 nm.

<5> The solid-state imaging element according to the item <4>, in which
the first organic semiconductor has an absorption coefficient of the blue light of more than 40,000 $cm^{-1}$ and an absorption coefficient of the green light and the red light of less than 10,000 $cm^{-1}$.

<6> The solid-state imaging element according to the item <5>, in which
the first organic semiconductor includes dipyrromethane, azadipyrromethane, dipyridyl, azadipyridyl, coumarin, perylene, pyrene, naphthalenediimide, xanthene, xanthenoxanthene, phenoxazine, indigo, azo oxazine, benzodithiophene, naphthodithiophene, anthradithiophene, anthracene, tetracene, anthraquinone, tetraquinone, dinaphthothienothiophene, oligothiophene, cyanine, squalium, porphyrin, phthalocyanine, a substance represented by a chemical formula (2) described below, or a substance represented by a chemical formula (7) described below, or a derivative of dipyrromethane, azadipyrromethane, dipyridyl, azadipyridyl, coumarin, perylene, pyrene, naphthalenediimide, xanthene, xanthenoxanthene, phenoxazine, indigo, azo oxazine, benzodithiophene, naphthodithiophene, anthradithiophene, anthracene, tetracene, anthraquinone, tetraquinone, dinaphthothienothiophene, oligothiophene, cyanine, squalium, porphyrin, phthalocyanine, the substance represented by the chemical formula (2), or the substance represented by the chemical formula (7):

Chemical Formula (2)

[Chem. 46]

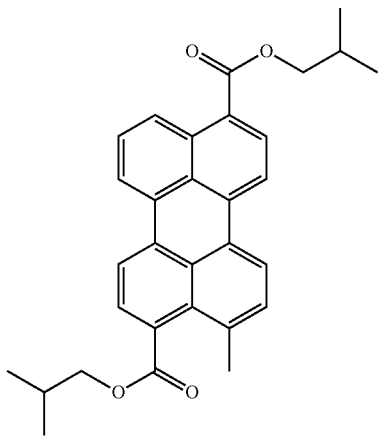

Chemical Formula (7)

[Chem. 47]

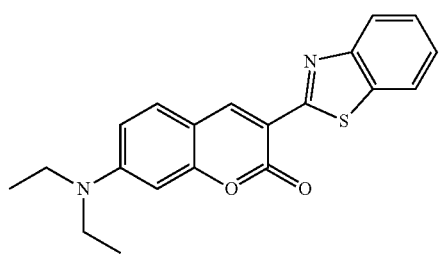

<7> The solid-state imaging element according to any one of the items <1> to <6>, in which
the second organic semiconductor strongly absorbs blue light that is light in a wavelength band in the vicinity of 400 to 500 nm, and weakly absorbs green light that is light in a wavelength band in the vicinity of 500 to 600 nm and red light that is light in a wavelength band in the vicinity of 600 to 700 nm, the second organic semiconductor is a hole-transporting material, and the second organic semiconductor shows a peak of crystallinity by out-of-plane X-ray measurement.

<8> The solid-state imaging element according to the item <7>, in which
the second organic semiconductor has an absorption coefficient of the blue light of more than 40,000 $cm^{-1}$ and an absorption coefficient of the green light and the red light of less than 10,000 $cm^{-1}$, the second organic semiconductor has a hole mobility of 1E-6 $cm^{-2}/Vs$ or more, the second organic semiconductor is a hole-transporting material having an HOMO energy level of 5.3 to 6.2 eV, and the organic photoelectric conversion layer has a peak of crystallinity by out-of-plane X-ray measurement at a position equivalent to a position of a peak of crystallinity by out-of-plane X-ray measurement of a single film of the second organic semiconductor.

<9> The solid-state imaging element according to the item <8>, in which
the second organic semiconductor includes a substance represented by any one of a chemical formula (3), a chemical formula (6), and chemical formulae (8) to (26) described below,
X in the chemical formula (26) is oxygen, sulfur, or selenium, and at least one of R1, R2, R3, or R4 is a substituent other than hydrogen:

[Chem. 48]

Chemical Formula (3)

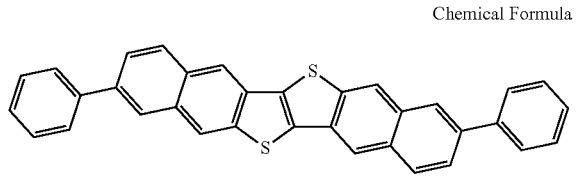

[Chem. 49]

Chemical Formula (6)

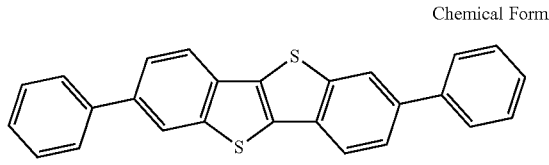

[Chem. 50]

Chemical Formula (8)

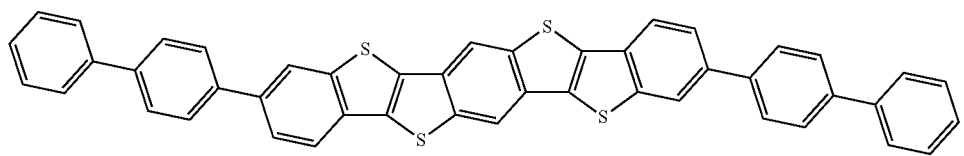

[Chem. 51]

Chemical Formula (9)

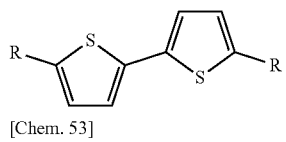

[Chem. 52]

Chemical Formula (10)

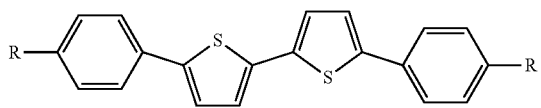

[Chem. 53]

Chemical Formula (11)

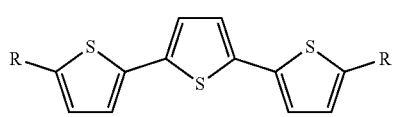

-continued
[Chem. 54]
Chemical Formula (12)
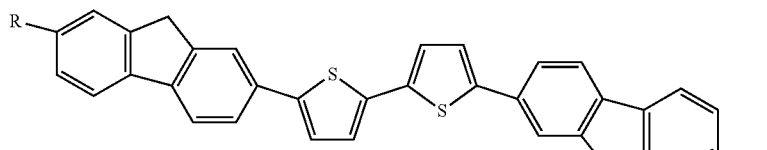
[Chem. 55]
Chemical Formula (13)
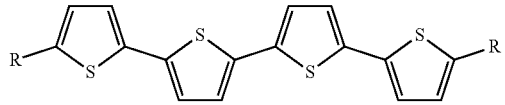
[Chem. 56]
Chemical Formula (14)
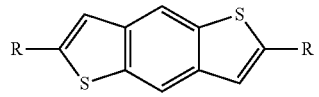
[Chem. 57]
Chemical Formula (15)
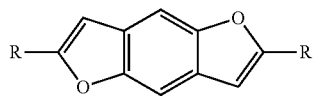
[Chem. 58]
Chemical Formula (16)
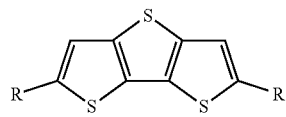
[Chem. 59]
Chemical Formula (17)
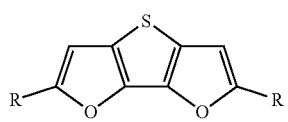
[Chem. 60]
Chemical Formula (18)
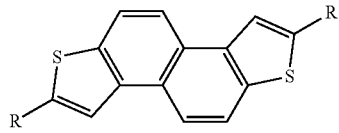
[Chem. 61]
Chemical Formula (19)
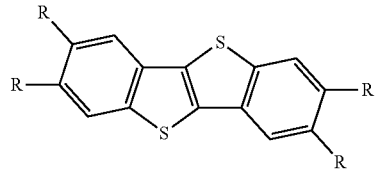
[Chem. 62]
Chemical Formula (20)
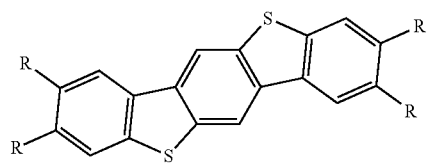
[Chem. 63]
Chemical Formula (21)
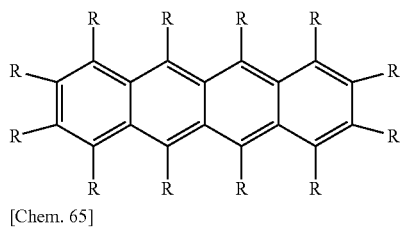
[Chem. 64]
Chemical Formula (22)
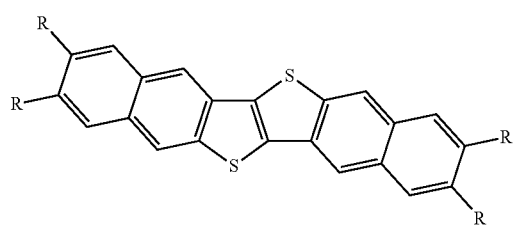
[Chem. 65]
Chemical Formula (23)
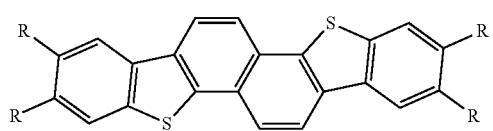
[Chem. 66]
Chemical Formula (24)

[Chem. 67]

Chemical Formula (25)

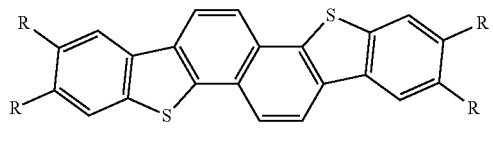

[Chem. 68]

Chemical Formula (26)

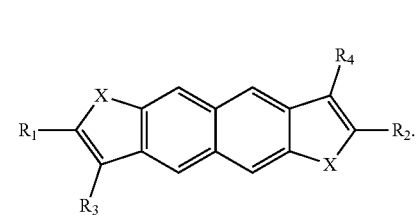

<10> The solid-state imaging element according to the item <9>, in which the substance represented by the chemical formula (26) includes a substance represented by any one of chemical formulae (27) to (44) described below:

[Chem. 69]

Chemical Formula (27)

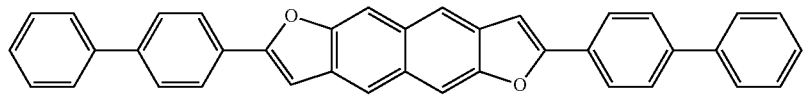

[Chem. 70]

Chemical Formula (28)

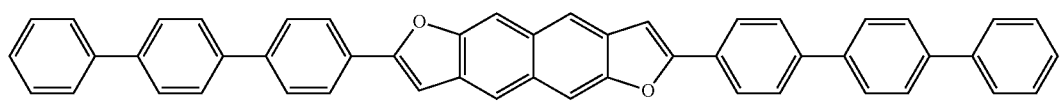

[Chem. 71]

Chemical Formula (29)

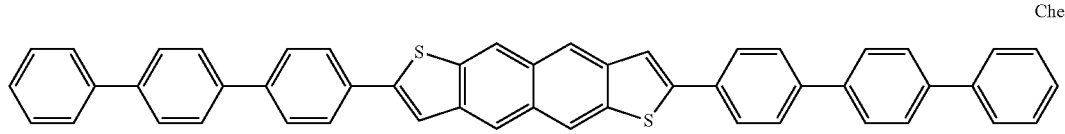

[Chem. 72]

Chemical Formula (30)

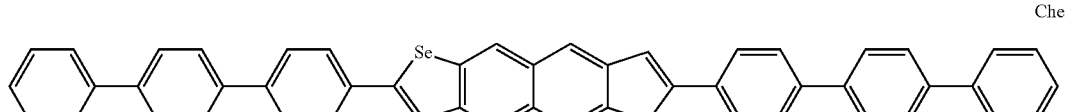

[Chem. 73]

Chemical Formula (31)

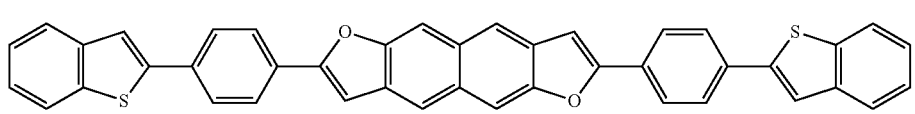

[Chem. 74]

Chemical Formula (32)

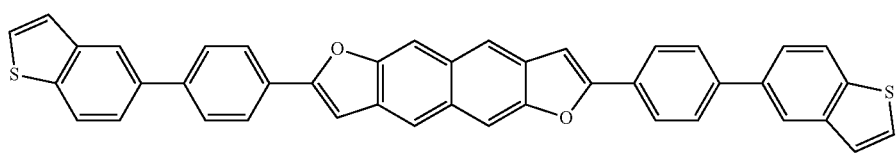

[Chem. 75]
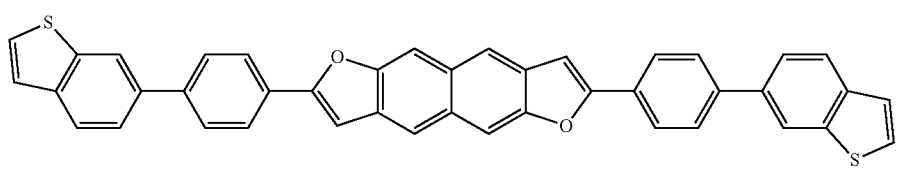
Chemical Formula (33)
[Chem. 76]
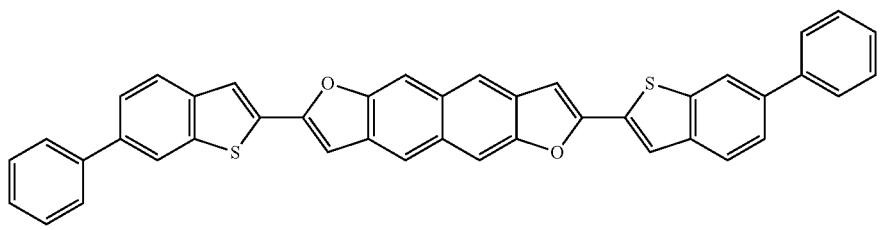
Chemical Formula (34)
[Chem. 77]
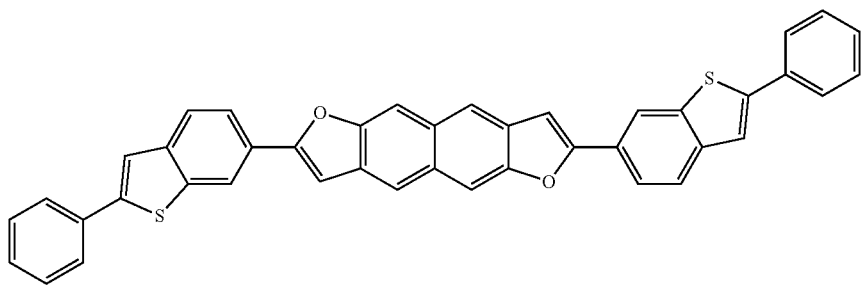
Chemical Formula (35)
[Chem. 78]
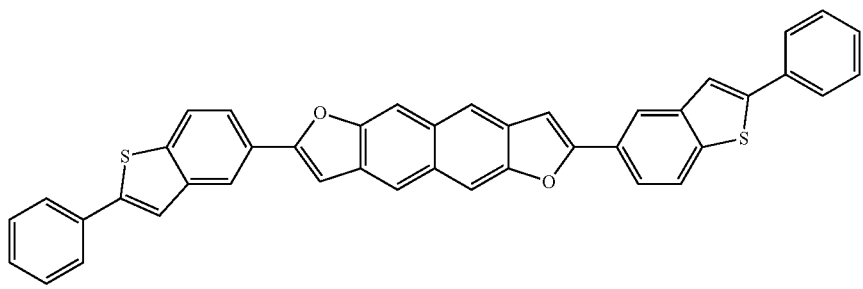
Chemical Formula (36)
[Chem. 79]
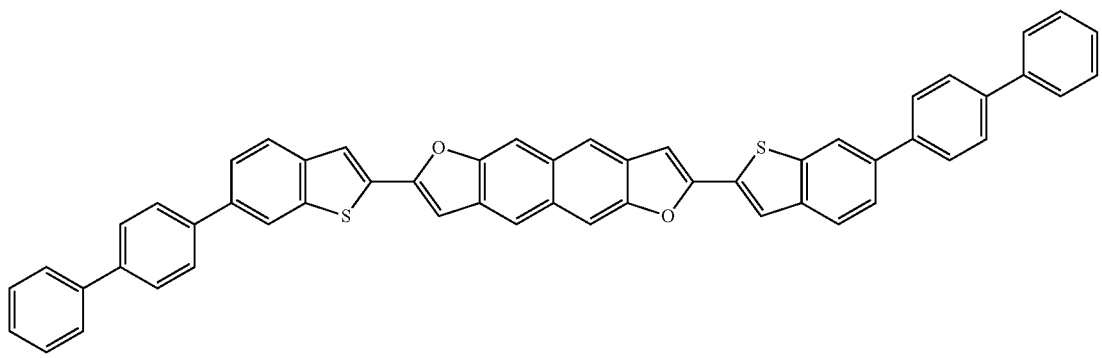
Chemical Formula (37)

[Chem. 80]
Chemical Formula (38)
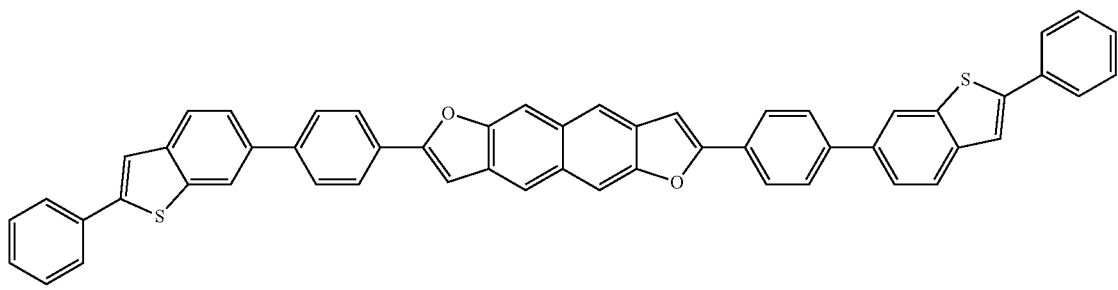
[Chem. 81]
Chemical Formula (39)
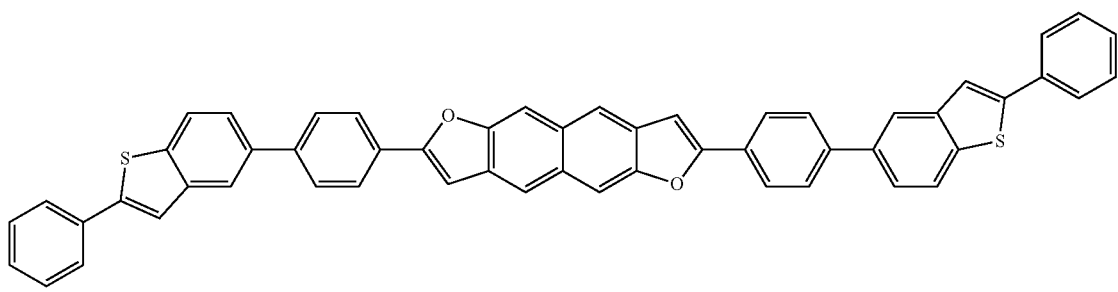
[Chem. 82]
Chemical Formula (40)
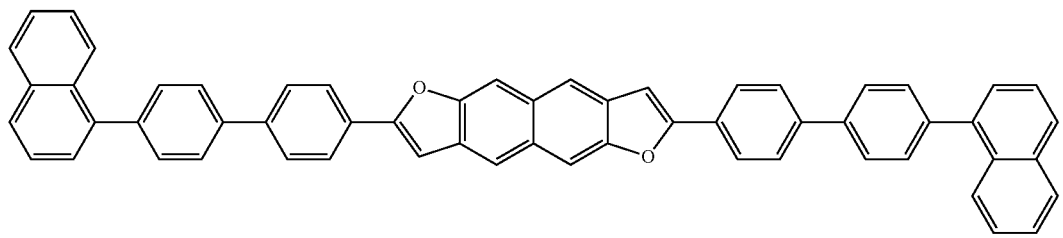
[Chem. 83]
Chemical Formula (41)
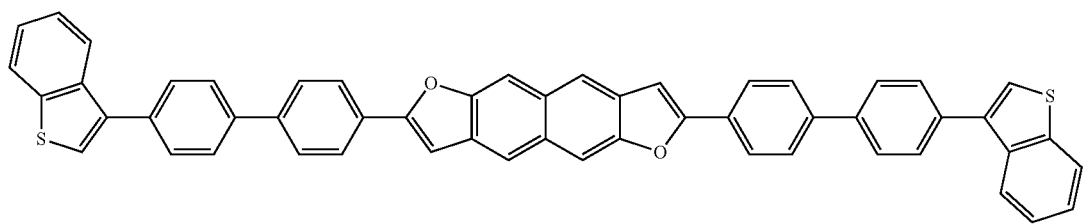
[Chem. 84]
Chemical Formula (42)
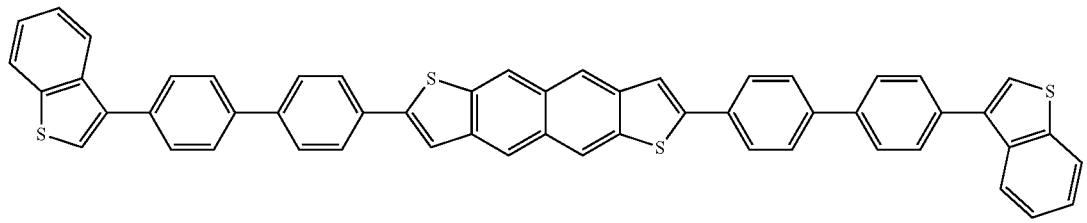

[Chem. 85]

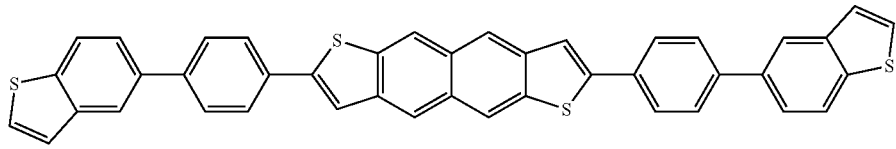

Chemical Formula (43)

[Chem. 86]

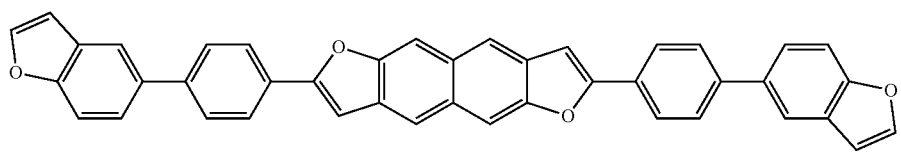

Chemical Formula (44)

<11> The solid-state imaging element according to any one of the items <1> to <9>, in which
the third organic semiconductor includes a substance represented by a chemical formula (4) or a chemical formula (45) described below:

[Chem. 87]

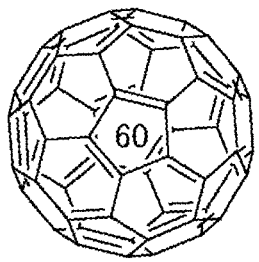

Chemical Formula (4)

[Chem. 88]

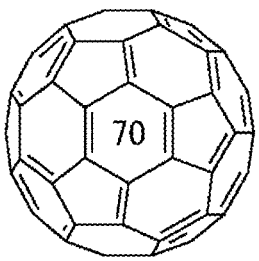

Chemical Formula (45)

<12> The solid-state imaging element according to any one of the items <1> to <11>, in which
the first organic semiconductor, the second organic semiconductor, and the third organic semiconductor are mixed at a predetermined ratio to form each of the first organic semiconductor, the second organic semiconductor, and the third organic semiconductor at a predetermined film formation rate so that the organic photoelectric conversion layer is formed.
<13> The solid-state imaging element according to the item <12>, in which
the third organic semiconductor is included at a ratio of approximately 20% of the organic photoelectric conversion layer, the first organic semiconductor and the second organic semiconductor are mixed at a ratio of approximately 70% to approximately 80% of the organic photoelectric conversion layer, and the first organic semiconductor and the second organic semiconductor are mixed at approximately 3:5 to approximately 5:3.
<14> A method for manufacturing a solid-state imaging element, the method including:
a first step of forming a first electrode;
a second step of forming an organic photoelectric conversion layer over the first electrode; and
a third step of forming a second electrode over the organic photoelectric conversion layer, in which
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative.
<15> A photoelectric conversion element including
an organic photoelectric conversion element including at least two electrodes, in which
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative.
<16> An imaging device including
an organic photoelectric conversion element including at least two electrodes, in which
an organic photoelectric conversion layer is arranged between the two electrodes, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative.

<17> An electronic apparatus including an organic photoelectric conversion element including at least two electrodes, in which an organic photoelectric conversion layer is arranged between the two electrodes, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative.

REFERENCE SIGNS LIST

11 Solid-state imaging element
21 to 23 Photoelectric conversion element (photoelectric conversion film)
31 Photoelectric conversion element (photodiode)
41 First electrode
42 Charge storage electrode
43 Insulating layer
44 Semiconductor layer
45 Hole blocking layer
46 Photoelectric conversion layer
47 Work function adjustment layer
48 Second electrode
50 Evaluation element
51 First electrode
52 Hole blocking layer
53 Photoelectric conversion material layer
54 Second electrode
55 Substrate

The invention claimed is:

1. A solid-state imaging element comprising
an organic photoelectric conversion element including at least two electrodes, wherein
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative,
wherein the second organic semiconductor strongly absorbs blue light that is light in a wavelength band in a vicinity of 400 to 500 nm, and weakly absorbs green light that is light in a wavelength band in a vicinity of 500 to 600 nm and red light that is light in a wavelength band in a vicinity of 600 to 700 nm, the second organic semiconductor is a hole-transporting material, and the second organic semiconductor shows a peak of crystallinity by out-of-plane X-ray measurement, and
wherein the second organic semiconductor has an absorption coefficient of the blue light of more than 40,000 $cm^{-1}$ and an absorption coefficient of the green light and the red light of less than 10,000 $cm^{-1}$, the second organic semiconductor has a hole mobility of 1E-6 $cm^{-2}/Vs$ or more, the second organic semiconductor is a hole-transporting material having an HOMO energy level of 5.3 to 6.2 eV, and the organic photoelectric conversion layer has a peak of crystallinity by out-of-plane X-ray measurement at a position equivalent to a position of a peak of crystallinity by out-of-plane X-ray measurement of a single film of the second organic semiconductor.

2. The solid-state imaging element according to claim 1, wherein
the organic photoelectric conversion layer strongly absorbs blue light that is light in a wavelength band in a vicinity of 400 to 500 nm, and weakly absorbs green light that is light in a wavelength band in a vicinity of 500 to 600 nm and red light that is light in a wavelength band in a vicinity of 600 to 700 nm.

3. The solid-state imaging element according to claim 2, wherein
the organic photoelectric conversion layer has an absorption coefficient of the blue light of more than 40,000 $cm^{-1}$, an absorption rate of the blue light of more than 80%, an absorption coefficient of the green light and the red light of less than 10,000 $cm^{-1}$, and an absorption rate of the green light and the red light of less than 20%.

4. The solid-state imaging element according to claim 1, wherein
the first organic semiconductor strongly absorbs blue light that is light in a wavelength band in a vicinity of 400 to 500 nm, and weakly absorbs green light that is light in a wavelength band in a vicinity of 500 to 600 nm and red light that is light in a wavelength band in a vicinity of 600 to 700 nm.

5. The solid-state imaging element according to claim 4, wherein
the first organic semiconductor has an absorption coefficient of the blue light of more than 40,000 $cm^{-1}$ and an absorption coefficient of the green light and the red light of less than 10,000 $cm^{-1}$.

6. The solid-state imaging element according to claim 5, wherein
the first organic semiconductor includes dipyrromethane, azadipyrromethane, dipyridyl, azadipyridyl, coumarin, perylene, pyrene, naphthalenediimide, xanthene, xanthenoxanthene, phenoxazine, indigo, azo oxazine, benzodithiophene, naphthodithiophene, anthradithiophene, anthracene, tetracene, anthraquinone, tetraquinone, dinaphthothienothiophene, oligothiophene, cyanine, squalium, porphyrin, phthalocyanine, a substance represented by a chemical formula (2) described below, or a substance represented by a chemical formula (7) described below, or a derivative of dipyrromethane, azadipyrromethane, dipyridyl, azadipyridyl, coumarin, perylene, pyrene, naphthalenediimide, xanthene, xanthenoxanthene, phenoxazine, indigo, azo oxazine, benzodithiophene, naphthodithiophene, anthradithiophene, anthracene, tetracene, anthraquinone, tetraquinone, dinaphthothienothiophene, oligothiophene, cyanine, squalium, porphyrin, phthalocyanine, the substance represented by the chemical formula (2), or the substance represented by the chemical formula (7):

Chemical Formula (2)

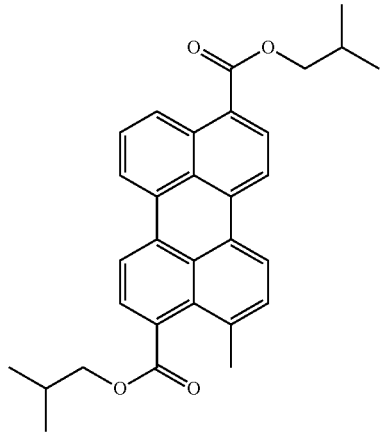

Chemical Formula (7)

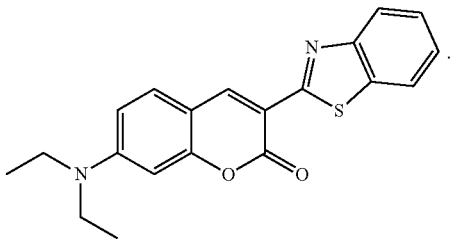

7. The solid-state imaging element according to claim 1, wherein the second organic semiconductor includes a substance represented by any one of a chemical formula (3), a chemical formula (6), and chemical formulae (8) to (26) described below, X in the chemical formula (26) is oxygen, sulfur, or selenium, and at least one of R1, R2, R3, or R4 is a substituent other than hydrogen:

Chemical Formula (3)

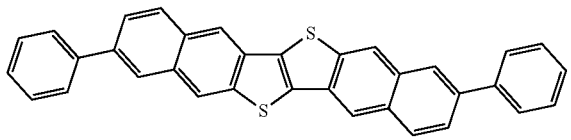

Chemical Formula (6)

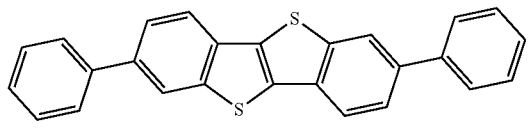

Chemical Formula (8)

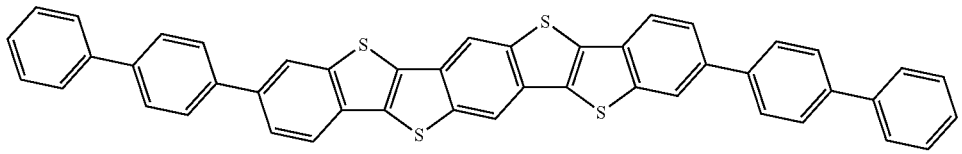

Chemical Formula (9)

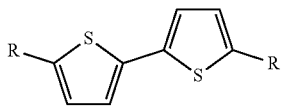

Chemical Formula (10)

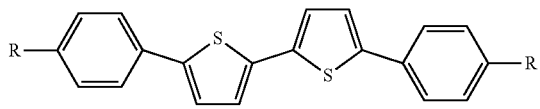

Chemical Formula (11)

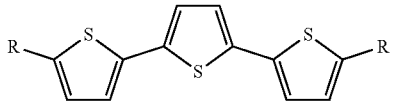

Chemical Formula (12)

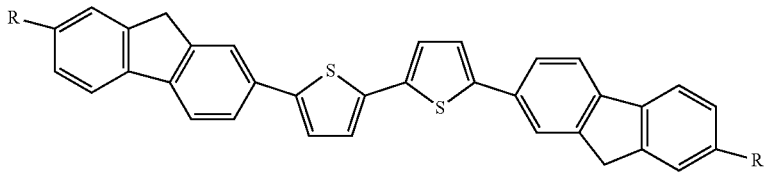

Chemical Formula (13)

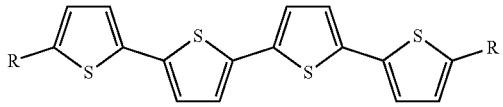

Chemical Formula (14)

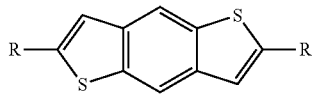

Chemical Formula (15)

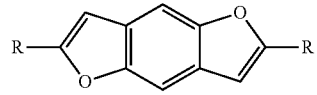

Chemical Formula (16)

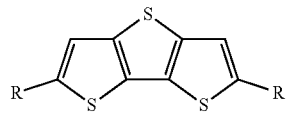

Chemical Formula (17)

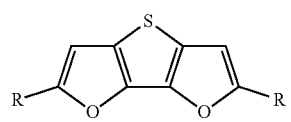

Chemical Formula (18)

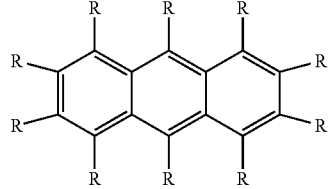

Chemical Formula (19)

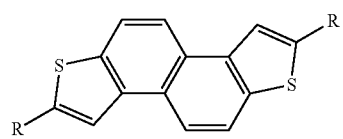

Chemical Formula (20)

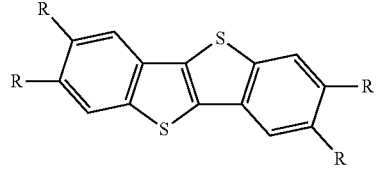

Chemical Formula (21)

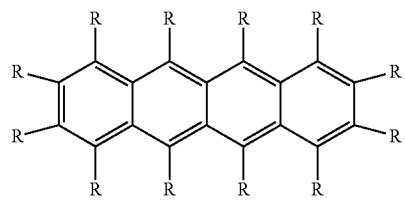

Chemical Formula (22)

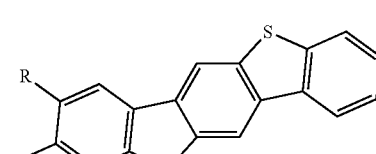

Chemical Formula (23)

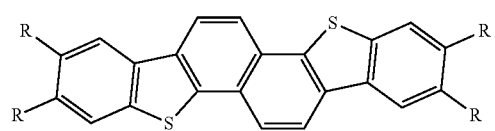

Chemical Formula (24)

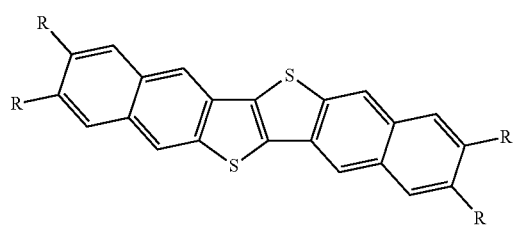

Chemical Formula (25)

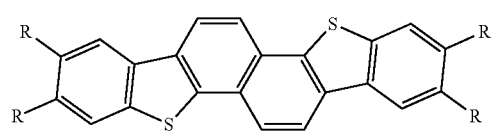

Chemical Formula (26)

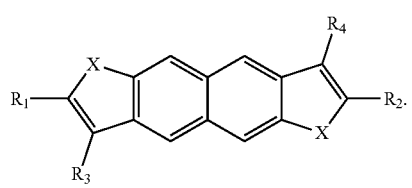

8. The solid-state imaging element according to claim 7, wherein
the substance represented by the chemical formula (26) includes a substance represented by any one of chemical formulae (27) to (44) described below:

Chemical Formula (27)

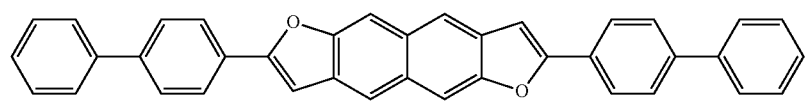

-continued
Chemical Formula (28)
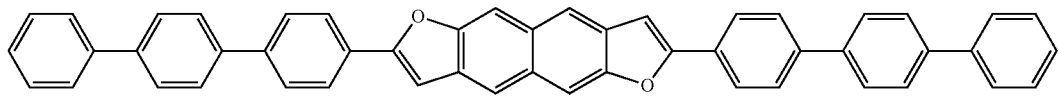
Chemical Formula (29)
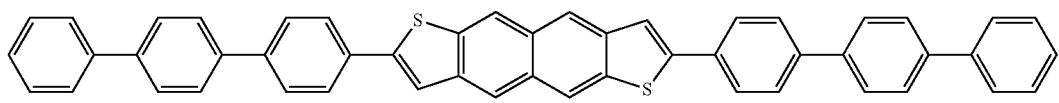
Chemical Formula (30)
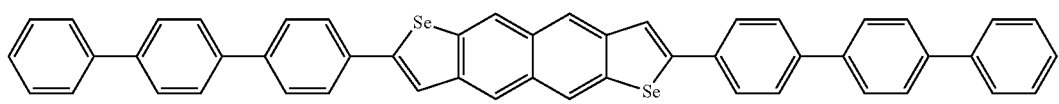
Chemical Formula (31)
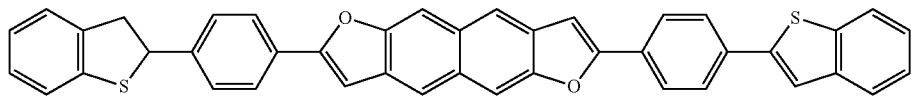
Chemical Formula (32)
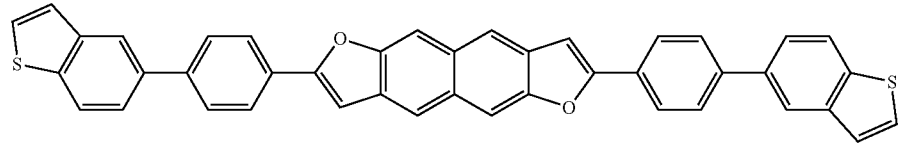
Chemical Formula (33)
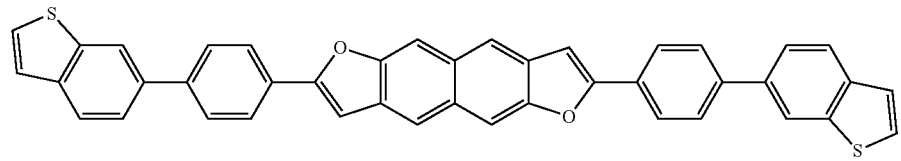
Chemical Formula (34)
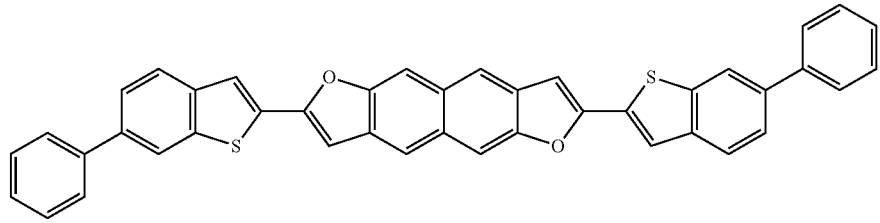
Chemical Formula (35)
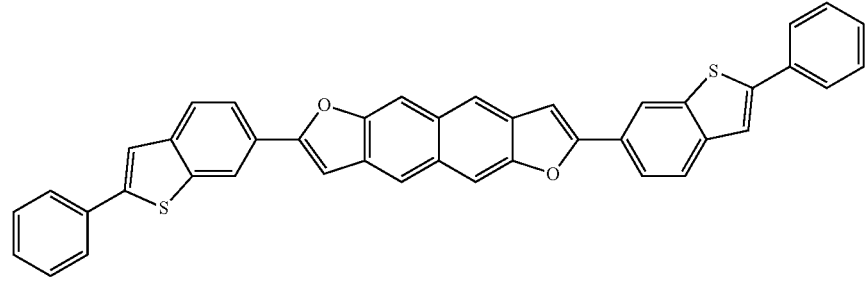

-continued
Chemical Formula (36)
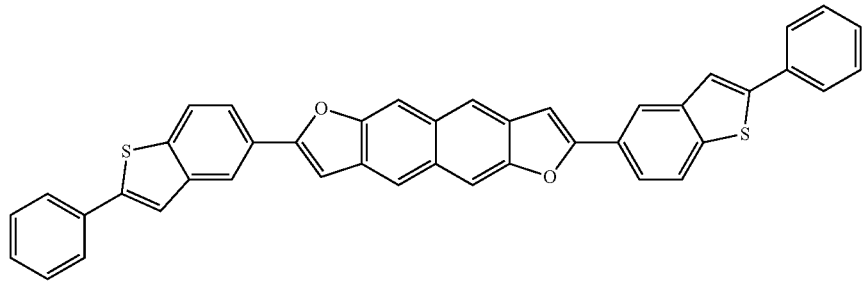
Chemical Formula (37)
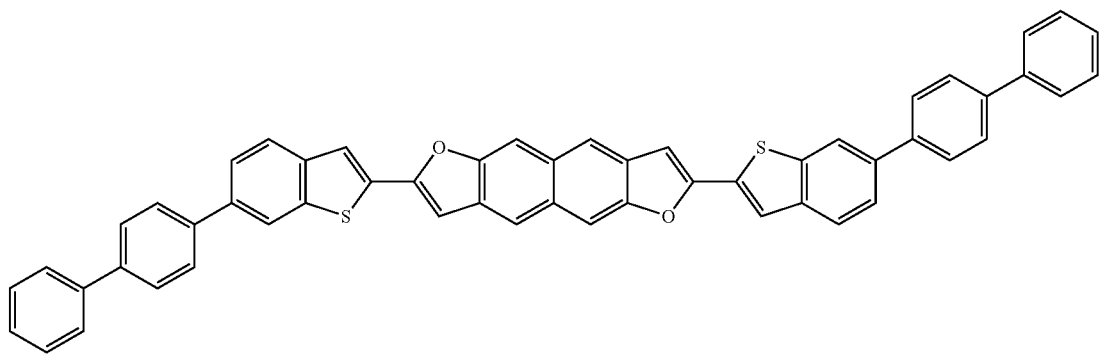
Chemical Formula (38)
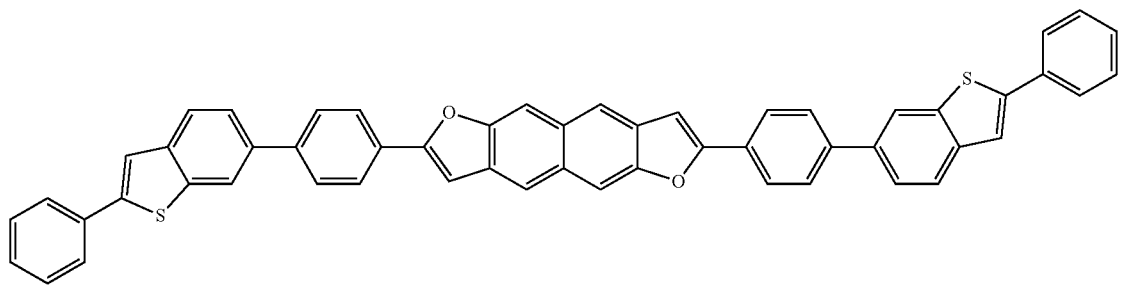
Chemical Formula (39)
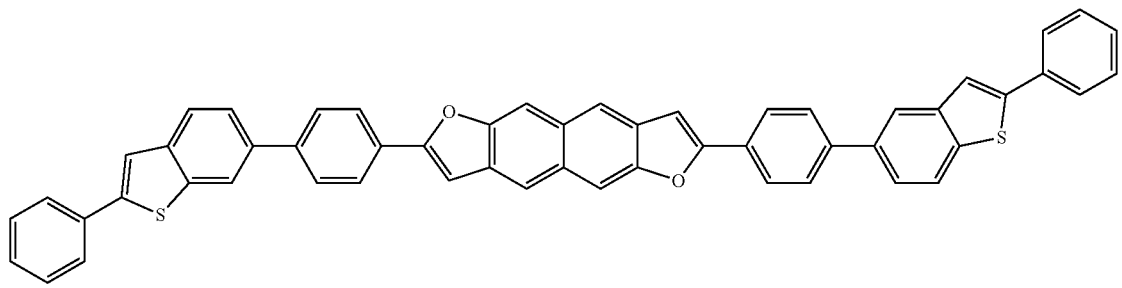
Chemical Formula (40)
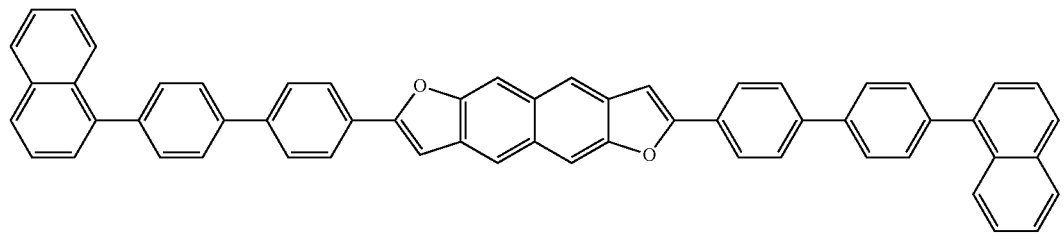

Chemical Formula (41)

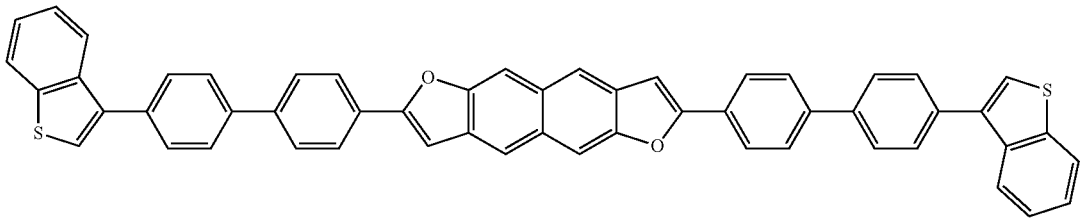

Chemical Formula (42)

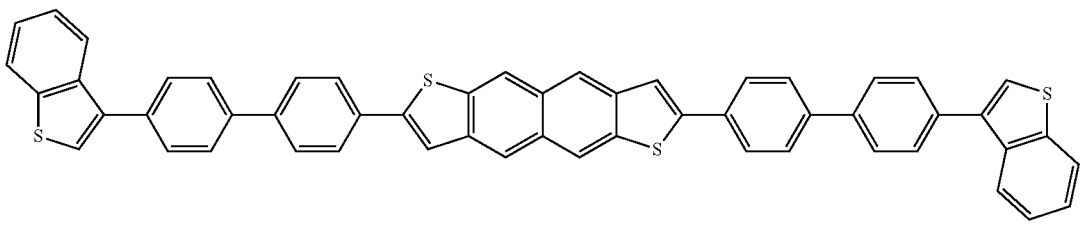

Chemical Formula (43)

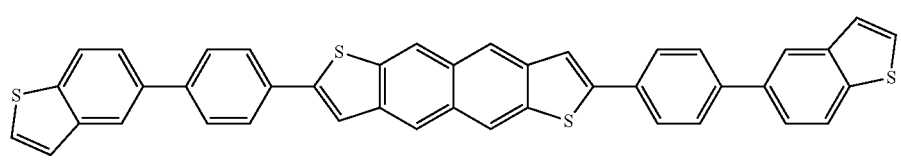

Chemical Formula (44)

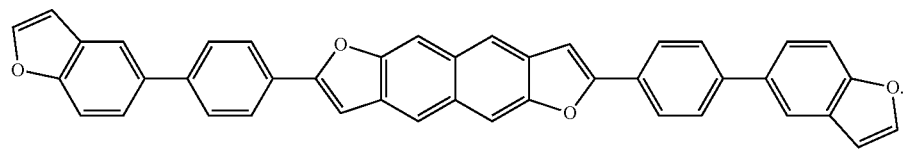

9. The solid-state imaging element according to claim 1, wherein
the third organic semiconductor includes a substance represented by a chemical formula (4) or a chemical formula (45) described below:

[Chem. 42]

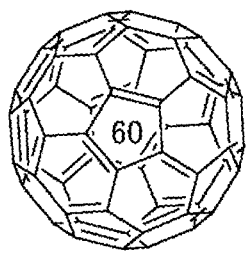

[Chem. 43]

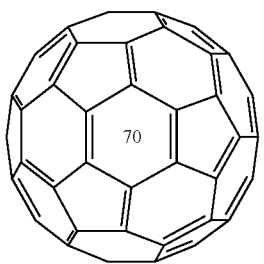

10. A solid-state imaging element comprising:
an organic photoelectric conversion element including at least two electrodes, wherein
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative,
wherein the first organic semiconductor, the second organic semiconductor, and the third organic semiconductor are mixed at a predetermined ratio to form each of the first organic semiconductor, the second organic semiconductor, and the third organic semiconductor at a predetermined film formation rate so that the organic photoelectric conversion layer is formed, and
wherein the third organic semiconductor is included at a ratio of approximately 20% of the organic photoelectric conversion layer, the first organic semiconductor and the second organic semiconductor are mixed at a ratio of approximately 70% to approximately 80% of the organic photoelectric conversion layer, and the first organic semiconductor and the second organic semiconductor are mixed at approximately 3:5 to approximately 5:3.

11. A photoelectric conversion element comprising:
an organic photoelectric conversion element including at least two electrodes, wherein
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative,
wherein the second organic semiconductor strongly absorbs blue light that is light in a wavelength band in a vicinity of 400 to 500 nm, and weakly absorbs green light that is light in a wavelength band in a vicinity of 500 to 600 nm and red light that is light in a wavelength band in a vicinity of 600 to 700 nm, the second organic semiconductor is a hole-transporting material, and the second organic semiconductor shows a peak of crystallinity by out-of-plane X-ray measurement, and
wherein the second organic semiconductor has an absorption coefficient of the blue light of more than 40,000 $cm^{-1}$ and an absorption coefficient of the green light and the red light of less than 10,000 $cm^{-1}$, the second organic semiconductor has a hole mobility of 1E-6 $cm^{-2}/Vs$ or more, the second organic semiconductor is a hole-transporting material having an HOMO energy level of 5.3 to 6.2 eV, and the organic photoelectric conversion layer has a peak of crystallinity by out-of-plane X-ray measurement at a position equivalent to a position of a peak of crystallinity by out-of-plane X-ray measurement of a single film of the second organic semiconductor.

12. An imaging device comprising:
an organic photoelectric conversion element including at least two electrodes, wherein
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative,
wherein the second organic semiconductor strongly absorbs blue light that is light in a wavelength band in a vicinity of 400 to 500 nm, and weakly absorbs green light that is light in a wavelength band in a vicinity of 500 to 600 nm and red light that is light in a wavelength band in a vicinity of 600 to 700 nm, the second organic semiconductor is a hole-transporting material, and the second organic semiconductor shows a peak of crystallinity by out-of-plane X-ray measurement, and
wherein the second organic semiconductor has an absorption coefficient of the blue light of more than 40,000 $cm^{-1}$ and an absorption coefficient of the green light and the red light of less than 10,000 $cm^{-1}$, the second organic semiconductor has a hole mobility of 1E-6 $cm^{-2}/Vs$ or more, the second organic semiconductor is a hole-transporting material having an HOMO energy level of 5.3 to 6.2 eV, and the organic photoelectric conversion layer has a peak of crystallinity by out-of-plane X-ray measurement at a position equivalent to a position of a peak of crystallinity by out-of-plane X-ray measurement of a single film of the second organic semiconductor.

13. An electronic apparatus comprising:
an organic photoelectric conversion element including at least two electrodes, wherein
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative,
wherein the second organic semiconductor strongly absorbs blue light that is light in a wavelength band in a vicinity of 400 to 500 nm, and weakly absorbs green light that is light in a wavelength band in a vicinity of 500 to 600 nm and red light that is light in a wavelength band in a vicinity of 600 to 700 nm, the second organic semiconductor is a hole-transporting material, and the second organic semiconductor shows a peak of crystallinity by out-of-plane X-ray measurement, and
wherein the second organic semiconductor has an absorption coefficient of the blue light of more than 40,000 $cm^{-1}$ and an absorption coefficient of the green light and the red light of less than 10,000 $cm^{-1}$, the second organic semiconductor has a hole mobility of 1E-6 $cm^{-2}/Vs$ or more, the second organic semiconductor is a hole-transporting material having an HOMO energy level of 5.3 to 6.2 eV, and the organic photoelectric conversion layer has a peak of crystallinity by out-of-plane X-ray measurement at a position equivalent to a position of a peak of crystallinity by out-of-plane X-ray measurement of a single film of the second organic semiconductor.

14. A photoelectric conversion element comprising:
an organic photoelectric conversion element including at least two electrodes, wherein
an organic photoelectric conversion layer is arranged between the two electrodes,
the organic photoelectric conversion layer includes at least a first organic semiconductor, a second organic semiconductor, and a third organic semiconductor,
the first organic semiconductor includes a semiconductor having a characteristic of absorbing blue light,
the second organic semiconductor includes a semiconductor having a characteristic of absorbing blue light and a characteristic as a hole-transporting material having crystallinity, and
the third organic semiconductor includes a fullerene derivative,
wherein the first organic semiconductor, the second organic semiconductor, and the third organic semiconductor are mixed at a predetermined ratio to form each of the first organic semiconductor, the second organic semiconductor, and the third organic semiconductor at a predetermined film formation rate so that the organic photoelectric conversion layer is formed, and wherein the third organic semiconductor is included at a ratio of approximately 20% of the organic photoelectric conversion layer, the first organic semiconductor and the second organic semiconductor are mixed at a ratio of approximately 70% to approximately 80% of the organic photoelectric conversion layer, and the first organic semiconductor and the second organic semiconductor are mixed at approximately 3:5 to approximately 5:3.

15. An imaging device comprising:

an organic photoelectric conversion element including at least two electrodes, wherein an organic photoelectric conversion layer is arranged between the two electrodes, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative, wherein the first organic semiconductor, the second organic semiconductor, and the third organic semiconductor are mixed at a predetermined ratio to form each of the first organic semiconductor, the second organic semiconductor, and the third organic semiconductor at a predetermined film formation rate so that the organic photoelectric conversion layer is formed, and wherein the third organic semiconductor is included at a ratio of approximately 20% of the organic photoelectric conversion layer, the first organic semiconductor and the second organic semiconductor are mixed at a ratio of approximately 70% to approximately 80% of the organic photoelectric conversion layer, and the first organic semiconductor and the second organic semiconductor are mixed at approximately 3:5 to approximately 5:3.

16. An electronic apparatus comprising:

an organic photoelectric conversion element including at least two electrodes, wherein an organic photoelectric conversion layer is arranged between the two electrodes, the organic photoelectric conversion layer includes at least a first organic semiconductor, a second organic semiconductor, and a third organic semiconductor, the first organic semiconductor includes a semiconductor having a characteristic of absorbing blue light, the second organic semiconductor includes a semiconductor having a characteristic of absorbing blue light and a characteristic as a hole-transporting material having crystallinity, and the third organic semiconductor includes a fullerene derivative, wherein the first organic semiconductor, the second organic semiconductor, and the third organic semiconductor are mixed at a predetermined ratio to form each of the first organic semiconductor, the second organic semiconductor, and the third organic semiconductor at a predetermined film formation rate so that the organic photoelectric conversion layer is formed, and wherein the third organic semiconductor is included at a ratio of approximately 20% of the organic photoelectric conversion layer, the first organic semiconductor and the second organic semiconductor are mixed at a ratio of approximately 70% to approximately 80% of the organic photoelectric conversion layer, and the first organic semiconductor and the second organic semiconductor are mixed at approximately 3:5 to approximately 5:3.

* * * * *